(12) United States Patent
Kanaya et al.

(10) Patent No.: US 9,276,195 B2
(45) Date of Patent: Mar. 1, 2016

(54) MAGNETIC RANDOM ACCESS MEMORY

(71) Applicants: Hiroyuki Kanaya, Seoul (KR); Kuniaki Sugiura, Seoul (KR)

(72) Inventors: Hiroyuki Kanaya, Seoul (KR); Kuniaki Sugiura, Seoul (KR)

( * ) Notice: Subject to any disclaimer, the term of this patent is extended or adjusted under 35 U.S.C. 154(b) by 0 days.

(21) Appl. No.: 13/965,149

(22) Filed: Aug. 12, 2013

(65) Prior Publication Data

US 2014/0284734 A1      Sep. 25, 2014

Related U.S. Application Data

(60) Provisional application No. 61/804,586, filed on Mar. 22, 2013.

(51) Int. Cl.
| | |
|---|---|
| H01L 29/82 | (2006.01) |
| H01L 43/00 | (2006.01) |
| H01L 43/02 | (2006.01) |
| H01L 43/08 | (2006.01) |
| H01L 27/22 | (2006.01) |

(52) U.S. Cl.
CPC ............... *H01L 43/02* (2013.01); *H01L 43/08* (2013.01); *H01L 27/228* (2013.01)

(58) Field of Classification Search
CPC .... H01L 27/222; H01L 43/02; G11C 11/161; G11C 11/5607; G11C 19/02; G11C 14/0036; G11C 14/0081

USPC ................. 257/421, 295, 427; 438/3
See application file for complete search history.

(56) References Cited

U.S. PATENT DOCUMENTS

| | | |
|---|---|---|
| 2005/0270828 A1 | 12/2005 | Motoyoshi |
| 2007/0241410 A1 | 10/2007 | Umehara et al. |
| 2008/0185670 A1 | 8/2008 | Kajiyama |
| 2008/0205126 A1 | 8/2008 | Kajiyama et al. |
| 2009/0039451 A1 | 2/2009 | Ueno et al. |
| 2010/0193850 A1* | 8/2010 | Asao et al. ..................... 257/295 |
| 2010/0200900 A1 | 8/2010 | Iwayama |
| 2011/0037108 A1 | 2/2011 | Sugiura et al. |
| 2011/0188157 A1 | 8/2011 | Zhao et al. |
| 2011/0266600 A1 | 11/2011 | Kanaya et al. |
| 2012/0056253 A1 | 3/2012 | Iwayama et al. |

FOREIGN PATENT DOCUMENTS

| | | |
|---|---|---|
| JP | 2011-249590 A | 12/2011 |
| JP | 2012-142398 A | 7/2012 |

* cited by examiner

*Primary Examiner* — Thien F Tran
(74) *Attorney, Agent, or Firm* — Holtz, Holtz & Volek PC

(57) ABSTRACT

According to one embodiment, a magnetic random access memory includes a magnetoresistive element, a contact arranged under the magnetoresistive element and connected to the magnetoresistive element, and an insulating film continuously formed from a periphery of the contact to a side surface of the magnetoresistive element and including a protective portion covering the side surface of the magnetoresistive element.

7 Claims, 51 Drawing Sheets

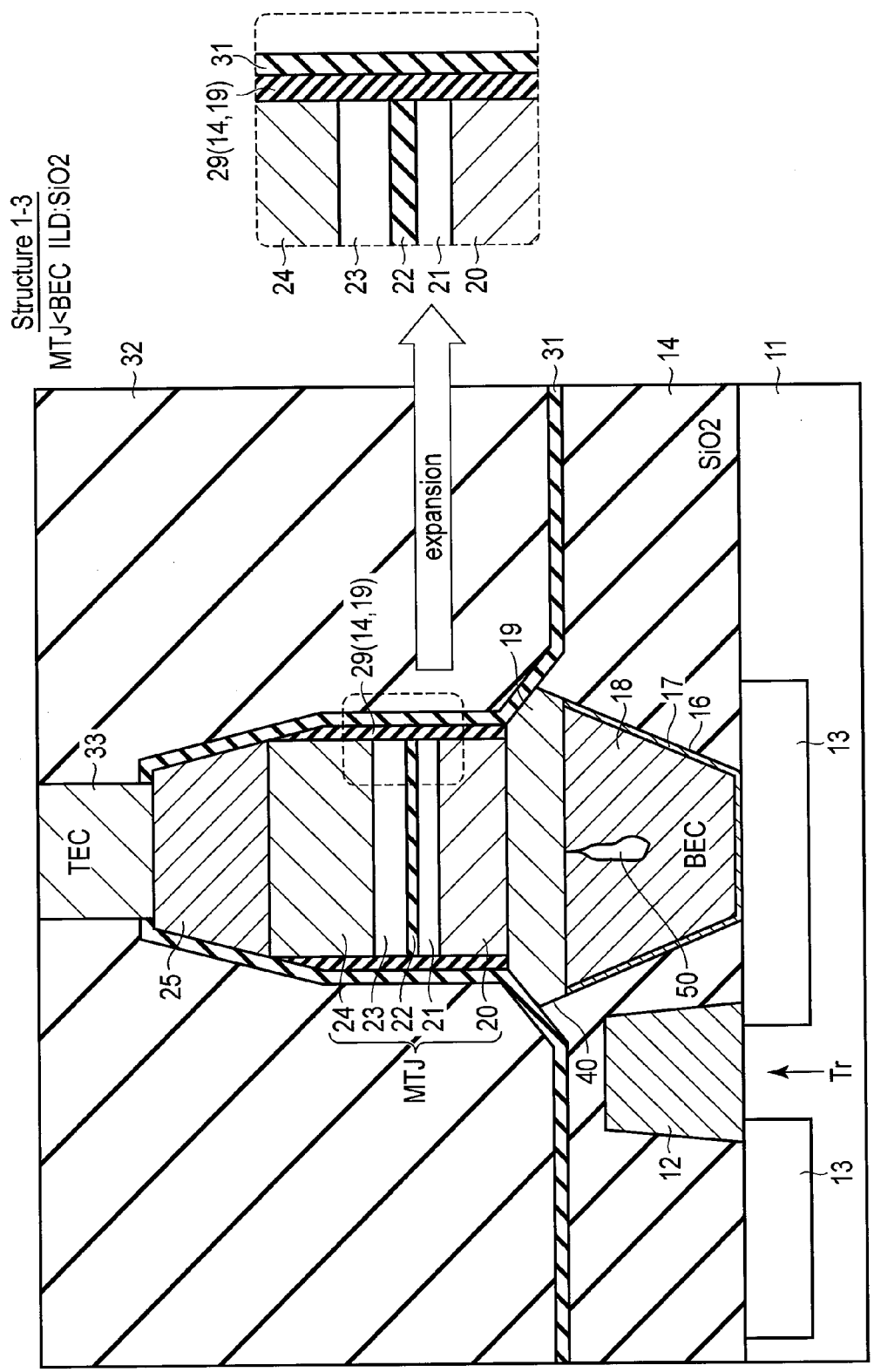
F I G. 3

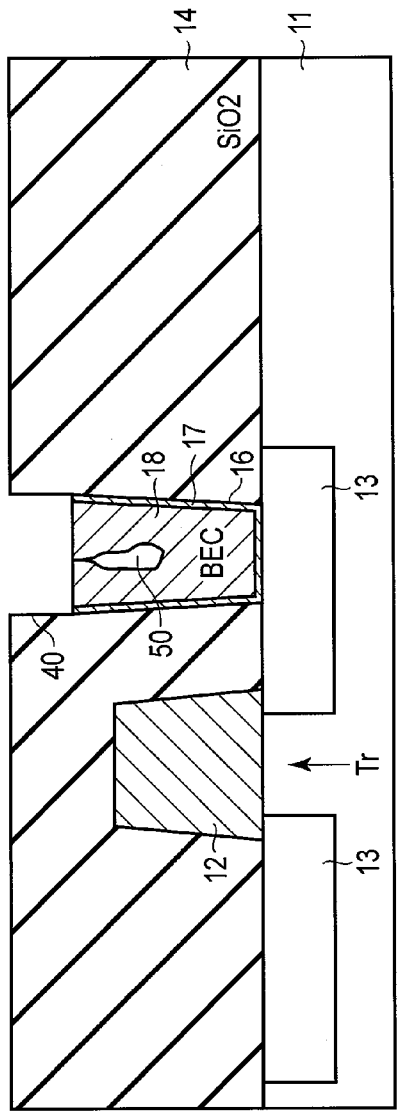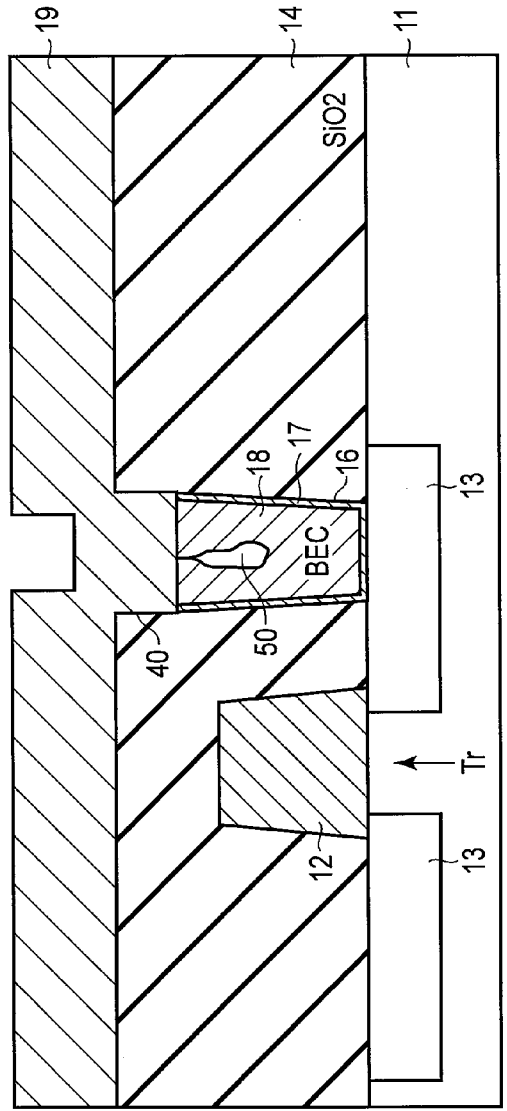

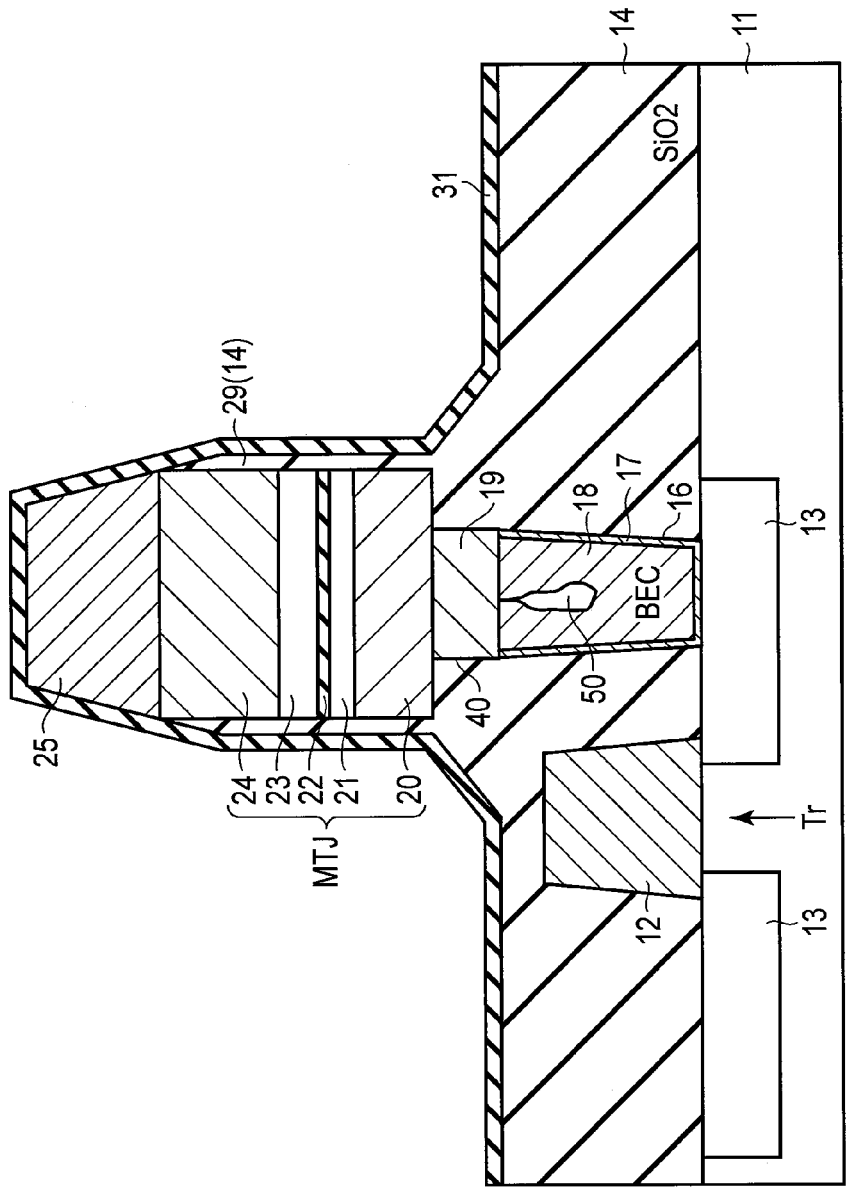
F I G. 11

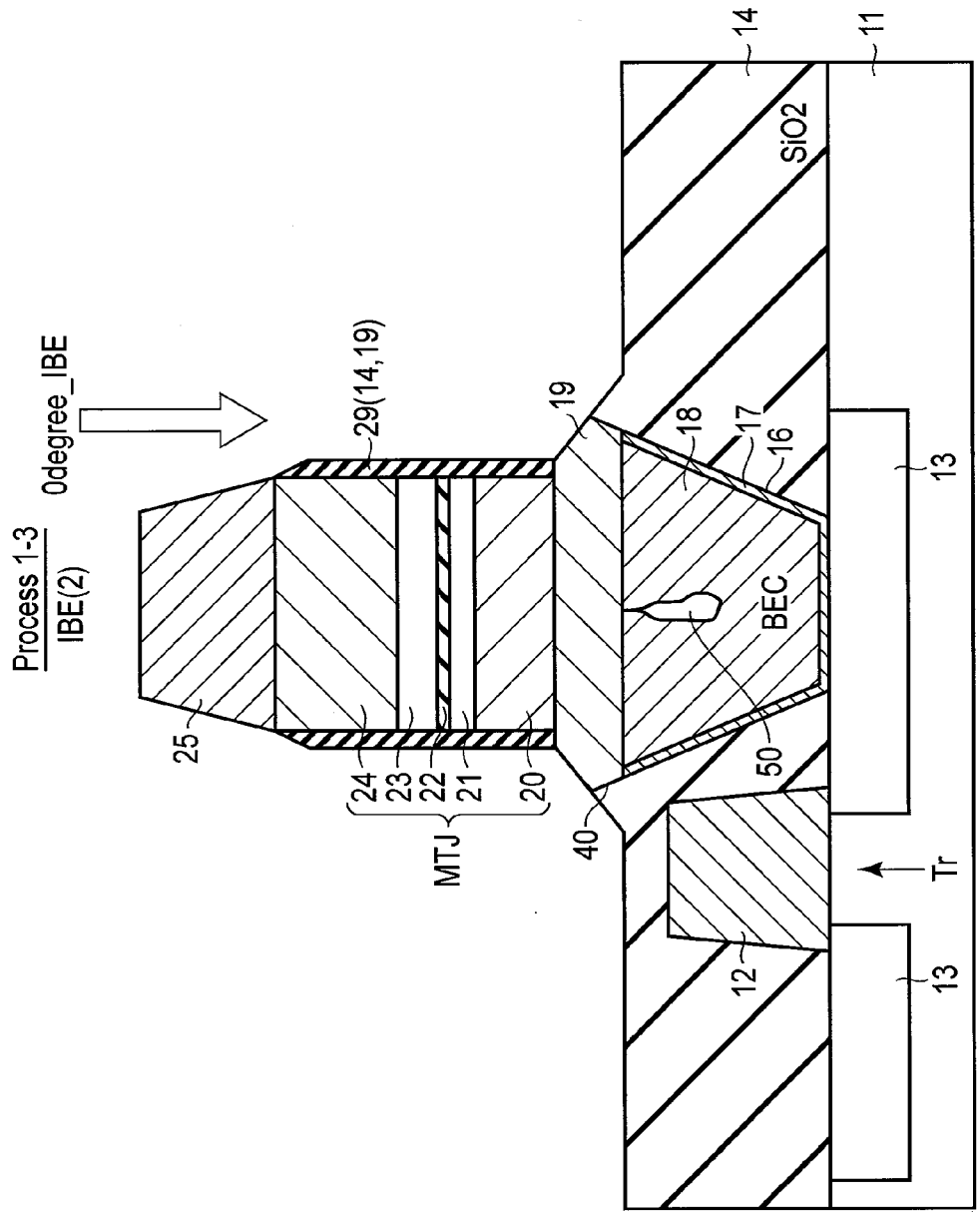
F I G. 15

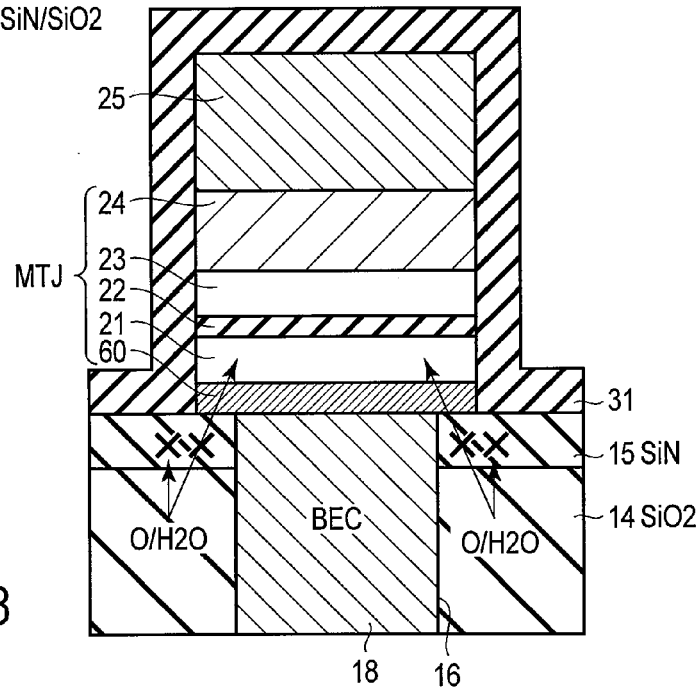
F I G. 18
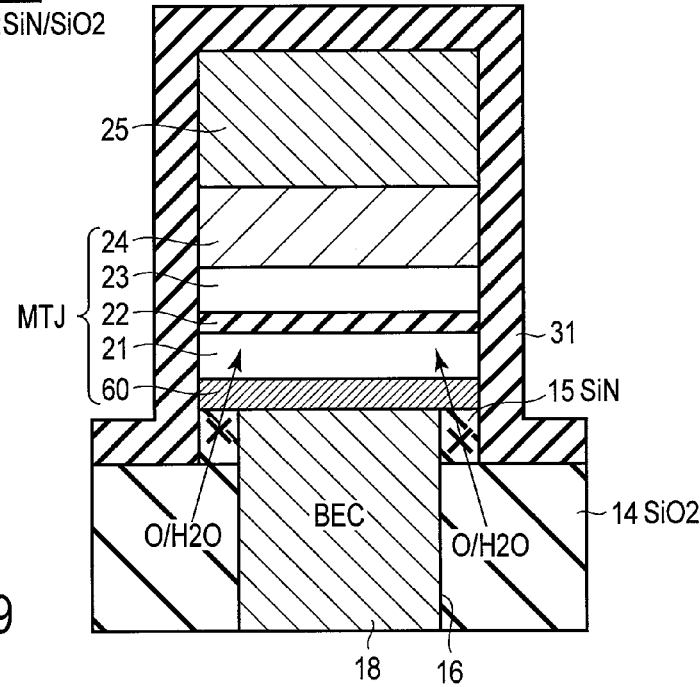
F I G. 19

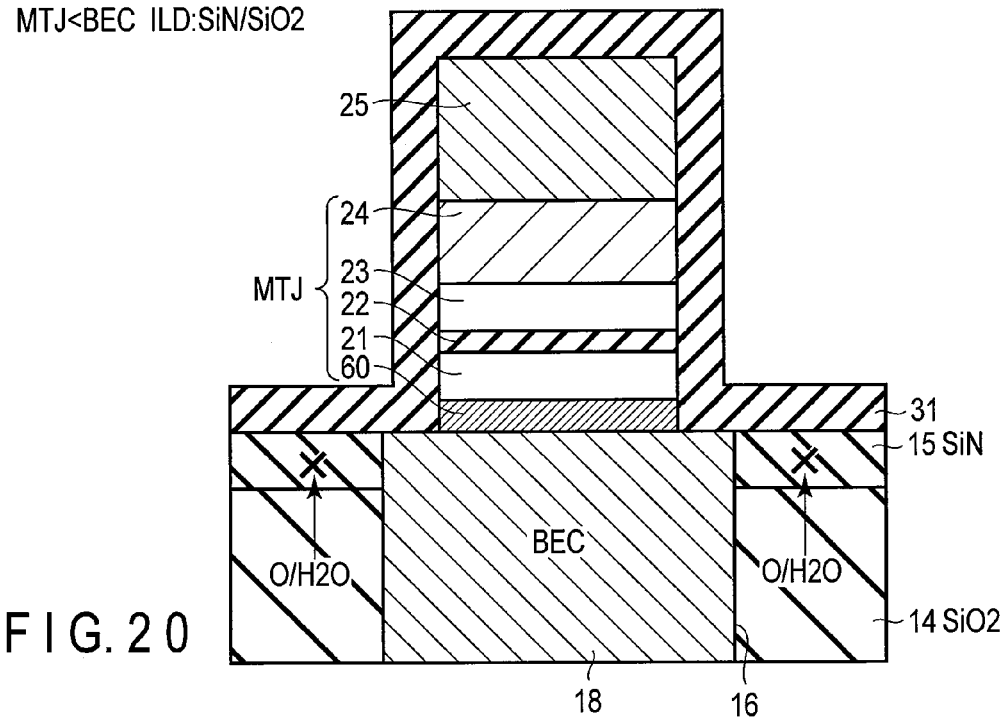
FIG. 20 Structure 2-3 MTJ<BEC ILD:SiN/SiO2
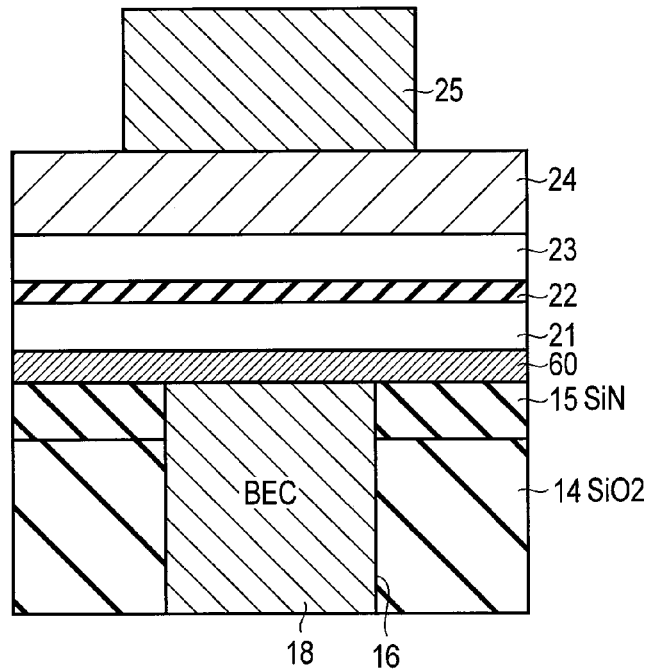
FIG. 21 Process 2-1

Process 2-1

Process 2-2

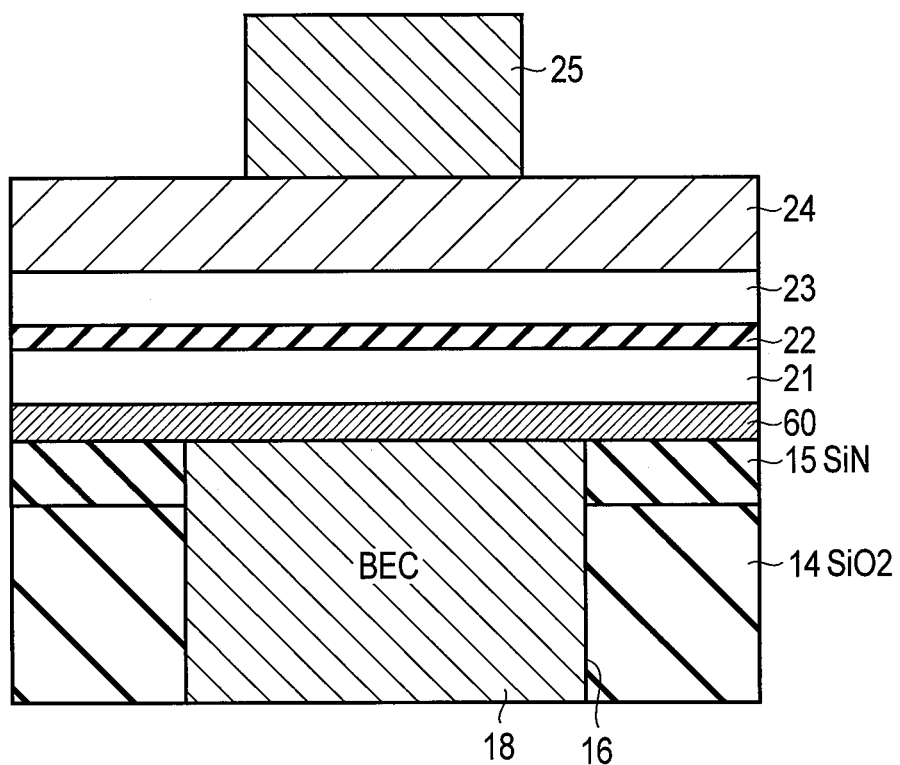
F I G. 24

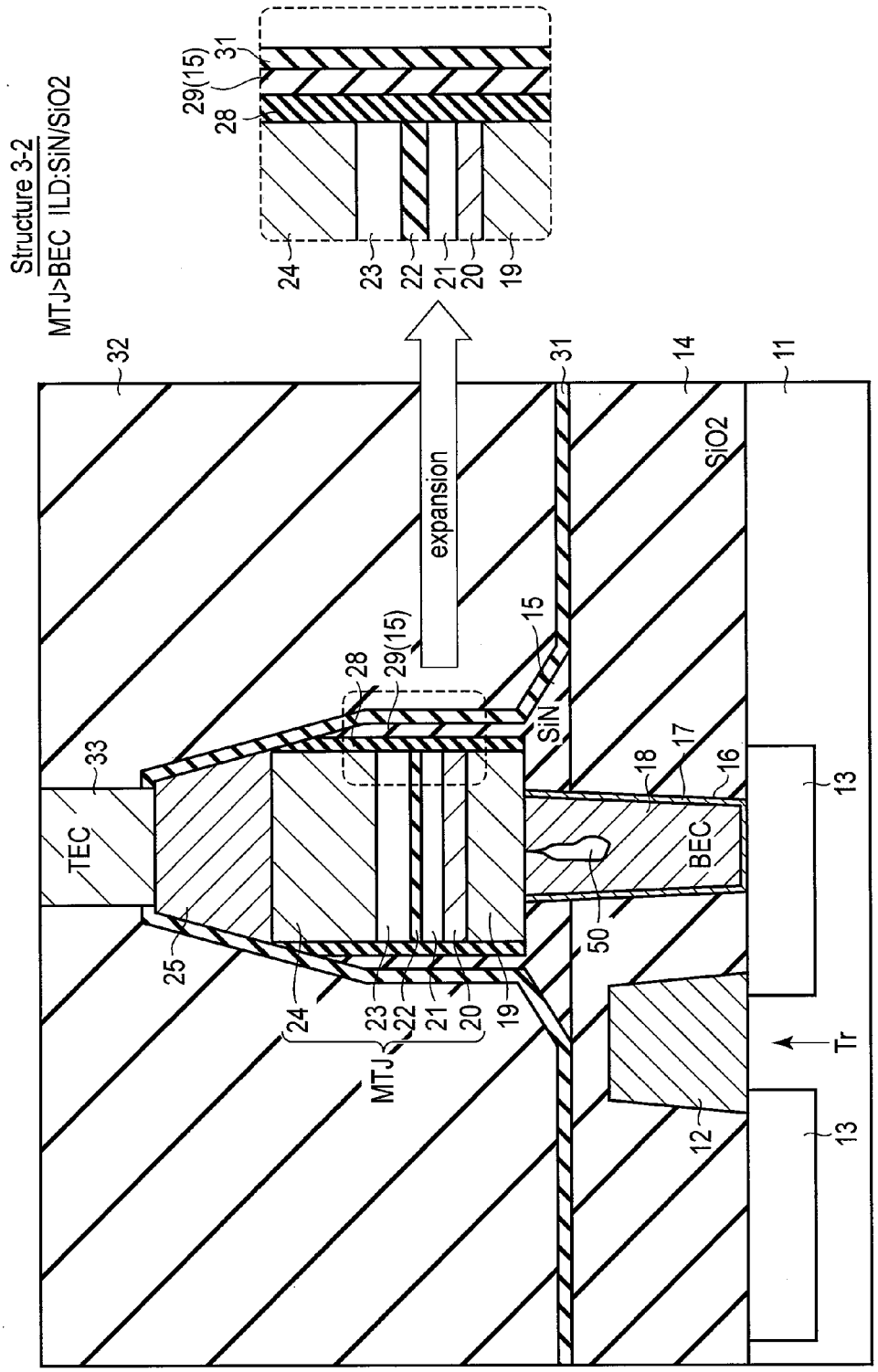
F I G. 26

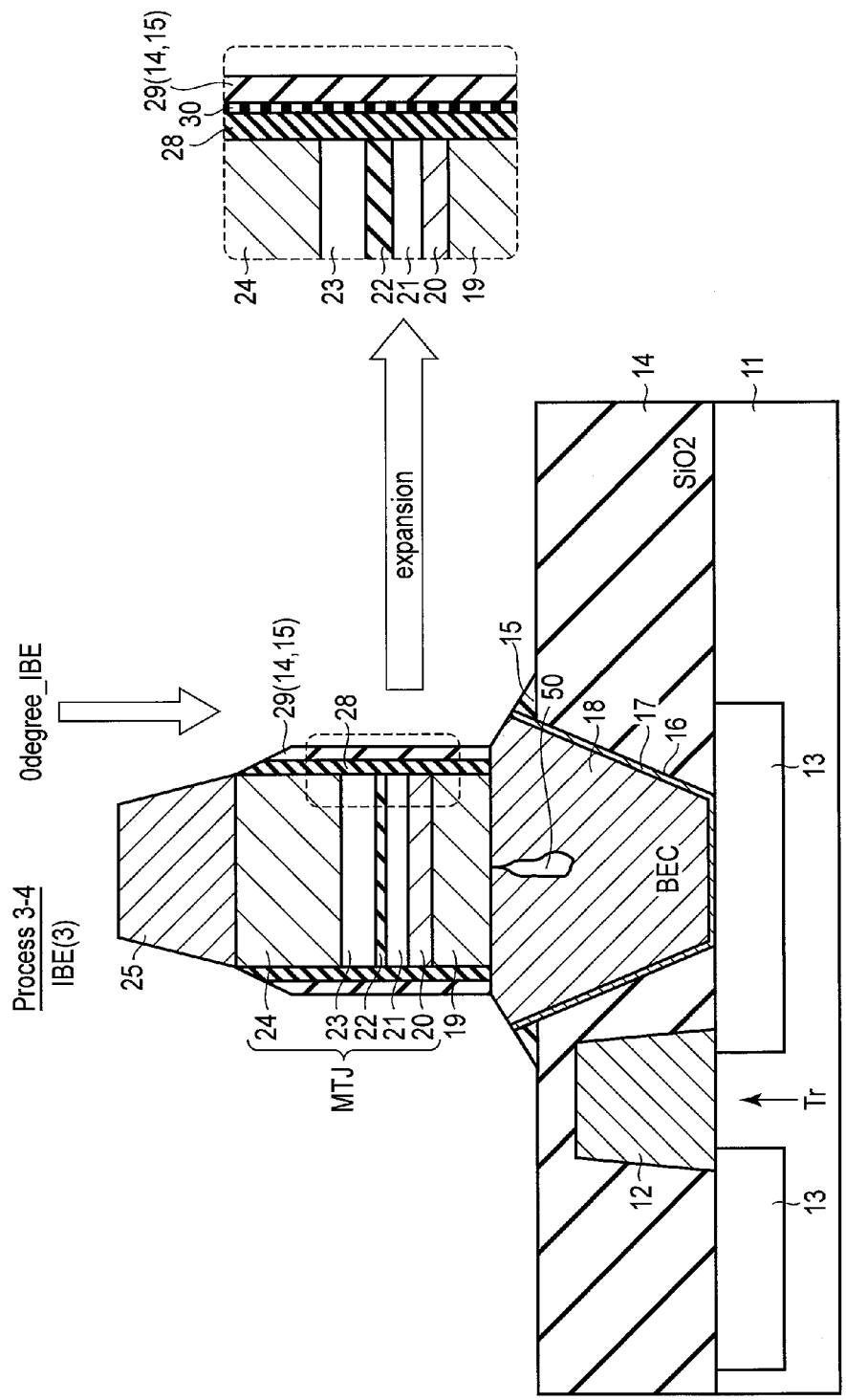
F I G. 40

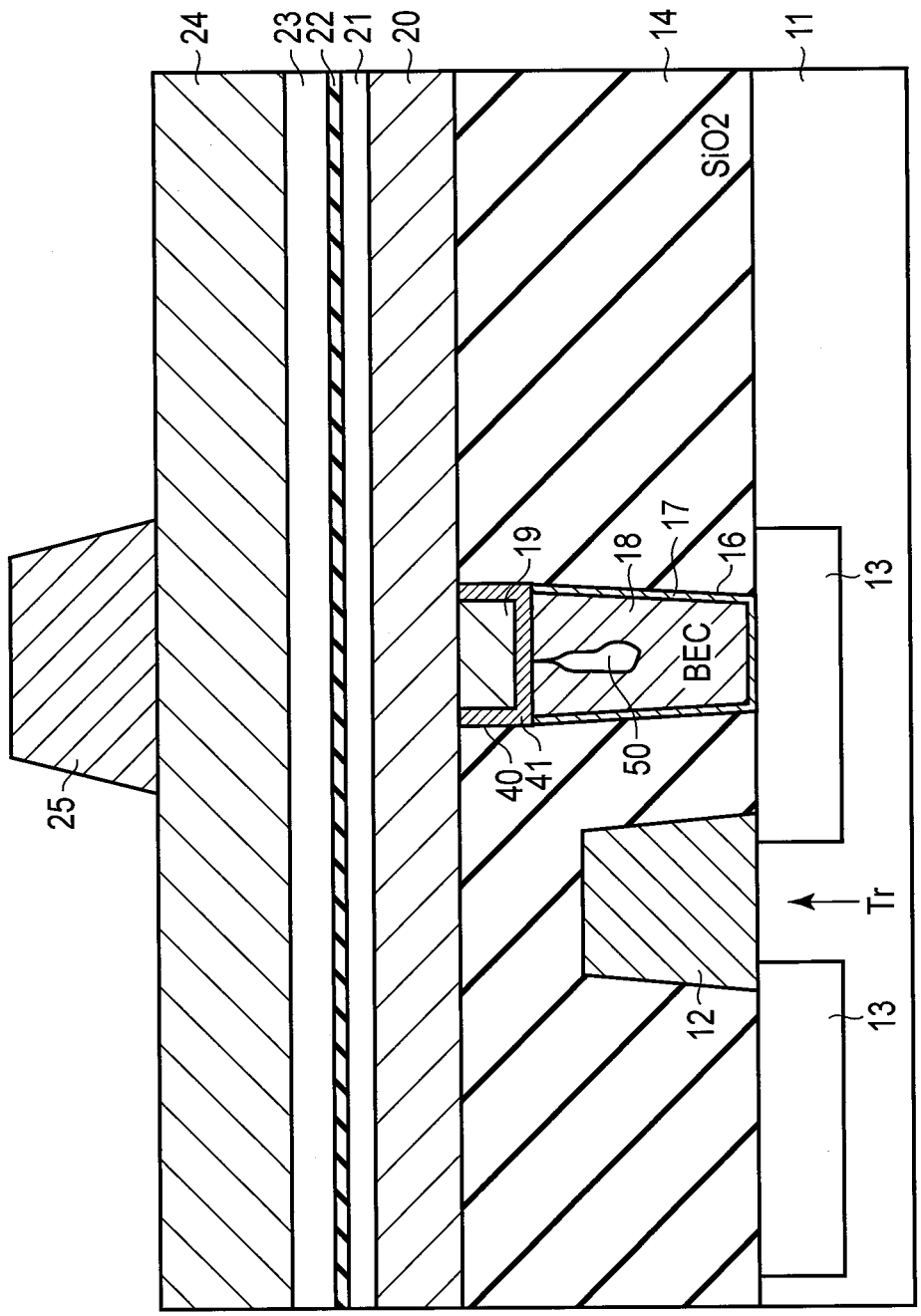
F I G. 48

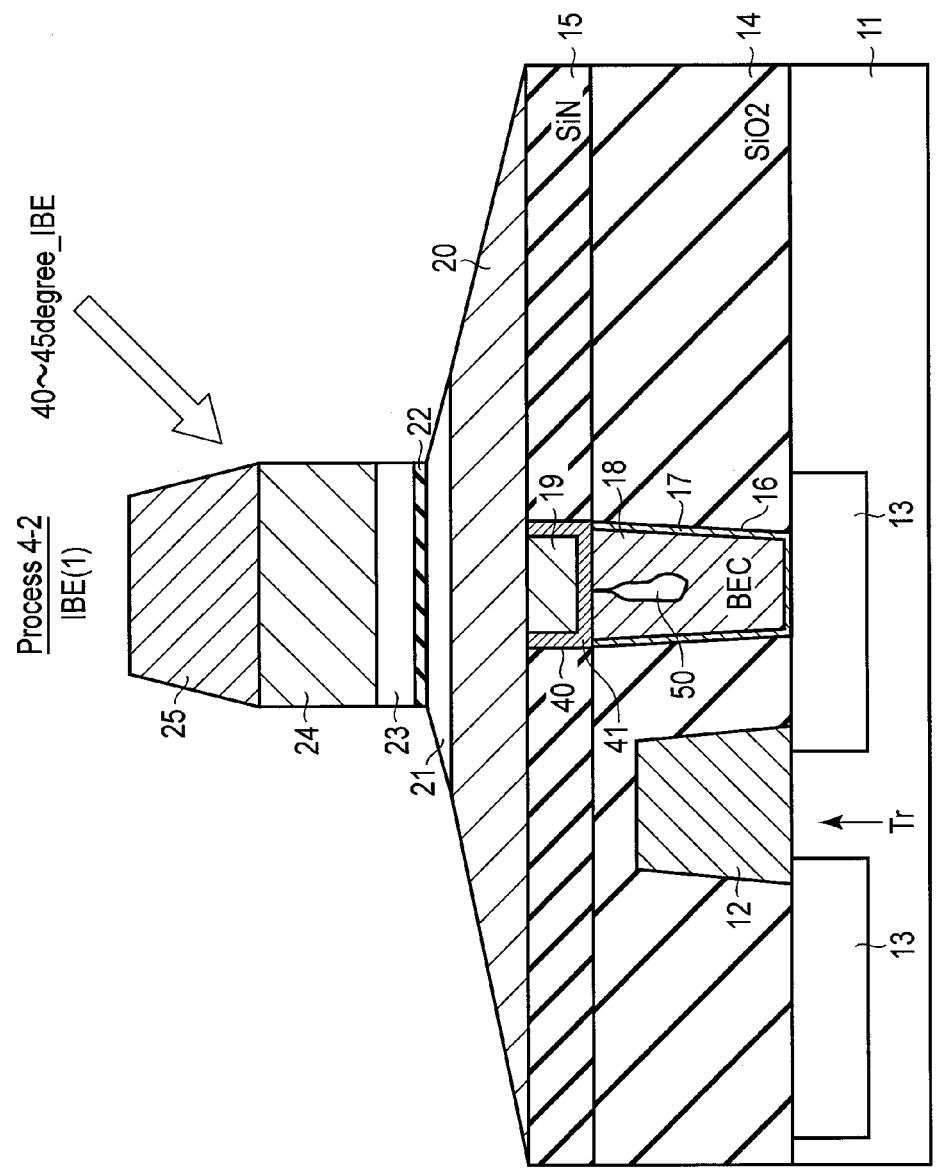
F I G. 51

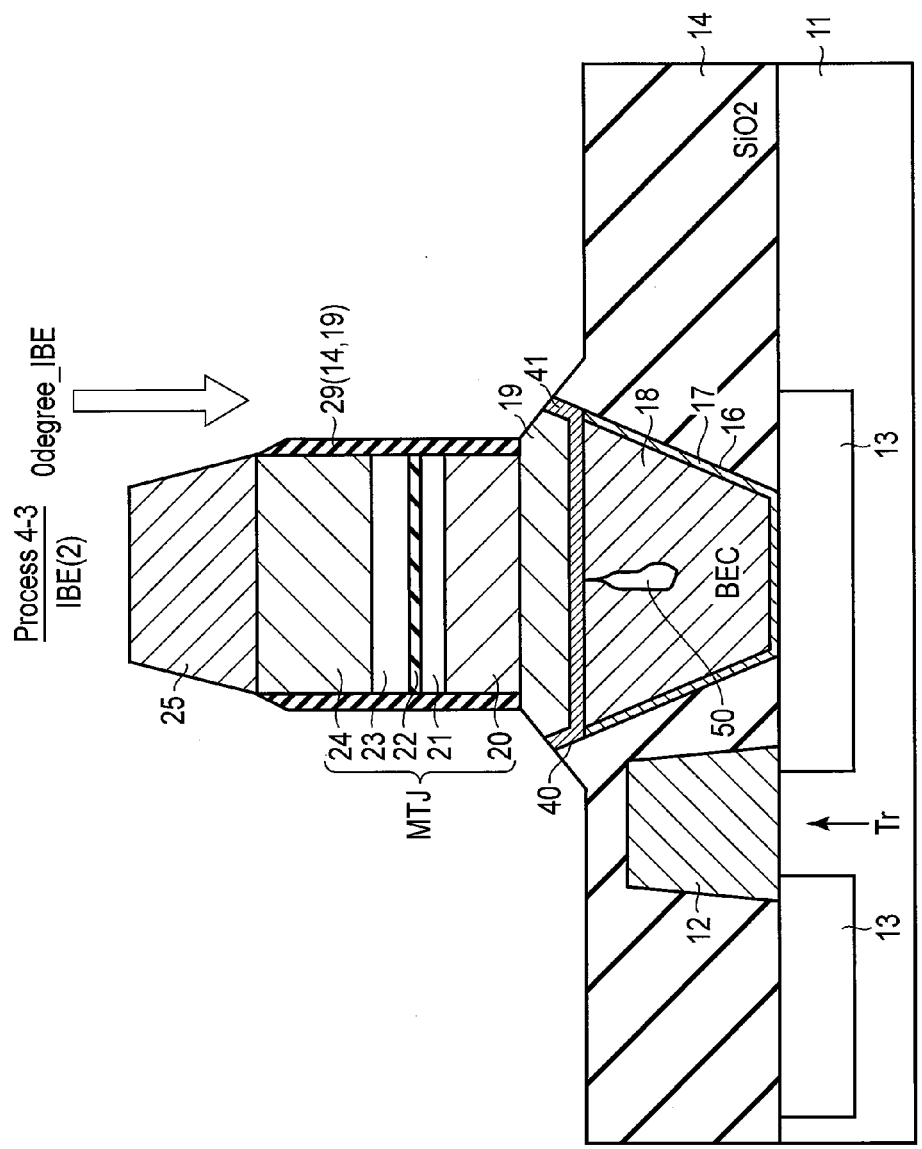
F I G. 54

MAGNETIC RANDOM ACCESS MEMORY

CROSS-REFERENCE TO RELATED APPLICATIONS

This application claims the benefit of U.S. Provisional Application No. 61/804,586, filed Mar. 22, 2013, the entire contents of which are incorporated herein by reference.

FIELD

Embodiments described herein relate generally to a magnetic random access memory.

BACKGROUND

For an STT-MRAM (Spin Transfer Torque—Magnetic Random Access Memory), a BEC (Bottom Electrode Contact) structure in which an MTJ (Magnetic Tunnel Junction) element is formed on a contact has been proposed.

BRIEF DESCRIPTION OF THE DRAWINGS

FIG. 3 is a sectional view showing a structure 1-3 of the magnetic random access memory according to the first embodiment;

FIGS. 5, 6, 7, 8, 9, 10, and 11 are sectional views showing a manufacturing method 1-1 of the structure 1-1 of the magnetic random access memory according to the first embodiment;

FIGS. 14 and 15 are sectional views showing a manufacturing method 1-3 of the structure 1-3 of the magnetic random access memory according to the first embodiment;

FIG. 18 is a sectional view showing a structure 2-1 of a magnetic random access memory according to the second embodiment;

FIG. 19 is a sectional view showing a structure 2-2 of the magnetic random access memory according to the second embodiment;

FIG. 20 is a sectional view showing a structure 2-3 of the magnetic random access memory according to the second embodiment;

FIGS. 21 and 22 are sectional views showing a manufacturing method 2-1 of the structure 2-1 of the magnetic random access memory according to the second embodiment;

FIG. 24 is a sectional view showing a manufacturing method 2-3 of the structure 2-3 of the magnetic random access memory according to the second embodiment;

FIG. 26 is a sectional view showing a structure 3-2 of the magnetic random access memory according to the third embodiment;

FIGS. 39 and 40 are sectional views showing a manufacturing method 3-4 of the structure 3-4 of the magnetic random access memory according to the third embodiment;

FIGS. 46, 47, 48, 49, and 50 are sectional views showing a manufacturing method 4-1 of the structure 4-1 of the magnetic random access memory according to the fourth embodiment;

FIGS. 51 and 52 are sectional views showing a manufacturing method 4-2 of the structure 4-2 of the magnetic random access memory according to the fourth embodiment;

FIGS. 53 and 54 are sectional views showing a manufacturing method 4-3 of the structure 4-3 of the magnetic random access memory according to the fourth embodiment.

DETAILED DESCRIPTION

Figure 1:
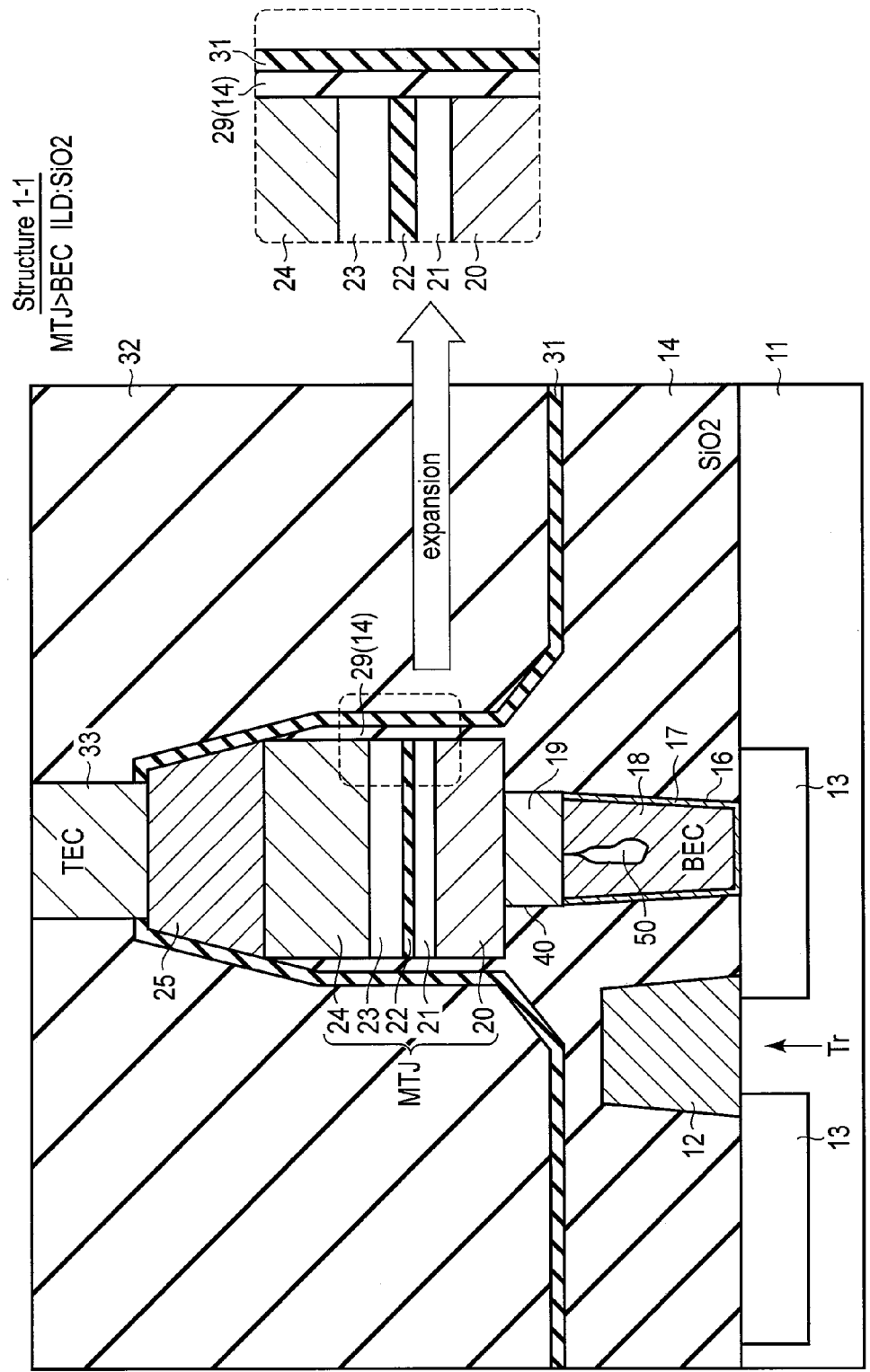
FIG. 1 is a sectional view showing a structure 1-1 of a magnetic random access memory according to the first embodiment.

In general, according to one embodiment, a magnetic random access memory comprising: a magnetoresistive element; a contact arranged under the magnetoresistive element and connected to the magnetoresistive element; and an insulating film continuously formed from a periphery of the contact to a side surface of the magnetoresistive element and including a protective portion covering the side surface of the magnetoresistive element.

The embodiments will now be described with reference to the accompanying drawings. In the following description, the same reference numerals denote the same parts throughout the drawings.

[1] First Embodiment

In the BEC structure of an MTJ element (magnetoresistive element) of an STT-MRAM according to the first embodiment, the ILD (Inter Layer Dielectric) under the MTJ element is processed by IBE (Ion Beam Etching), and a protective film made of the material of the ILD is formed on the side wall of the MTJ element.

[1-1] Structure 1-1

A structure 1-1 of a magnetic random access memory according to the first embodiment will be described with reference to FIG. 1. In the structure 1-1, an MTJ element MTJ is larger than a contact (BEC) 18, and an ILD 14 under the MTJ element MTJ is made of $SiO_2$.

As shown in FIG. 1, a gate electrode 12 is formed on a semiconductor substrate 11. Source/drain diffusion layers 13 are formed in the semiconductor substrate 11 on both sides of the gate electrode 12, thereby forming a transistor Tr. The ILD 14 made of an $SiO_2$ film is formed to cover the transistor Tr.

A contact hole 16 that exposes the surface of the source/drain diffusion layer 13 is formed in the ILD 14. The contact 18 is formed in the contact hole 16 while making a barrier metal film 17 intervene between them. A recess portion 40 is formed on the contact 18 in the contact hole 16. A lower electrode 19 is formed in the recess portion 40.

The MTJ element MTJ is formed on the lower electrode 19. The MTJ element MTJ includes a metal layer 20, a storage layer 21, a tunnel barrier layer 22, a reference layer 23, and a shift cancel layer 24. An upper electrode (hard mask) 25 is formed on the shift cancel layer 24.

The ILD 14 is formed continuously from the periphery of the contact 18 and the lower electrode 19 to the side surface of the MTJ element MTJ, and includes a protective portion 29 covering the side surface of the MTJ element MTJ. The protective portion 29 is made of the same material as that of the ILD 14. The ILD 14 around the lower electrode 19 has its tail spreading out from the upper surface toward the bottom surface of the lower electrode 19. Note that the protective portion 29 of the ILD 14 is not necessarily formed only on the side surfaces of the metal layer 20, the storage layer 21, the tunnel barrier layer 22, the reference layer 23, and the shift cancel layer 24. The protective portion 29 may further be formed on the side surface of the upper electrode 25. The protective portion 29 preferably covers at least the side surfaces of the metal layer 20, the storage layer 21, the tunnel barrier layer 22, and the reference layer 23, and particularly preferably covers the side surfaces of the tunnel barrier layer 22 and the reference layer 23.

A passivation film 31 made of, for example, SiN is formed on the ILD 14 and the upper electrode 25. An ILD 32 is formed on the passivation film 31. A contact (TEC: Top Electrode Contact) 33 connected to the upper electrode 25 is formed in the ILD 32. In the structure 1-1, the side surface of the MTJ element MTJ is covered with two insulating films (the protective portion 29 of the ILD 14 and the passivation film 31).

As the material of the lower electrode 19, a material for improving the MTJ characteristic is used. The lower electrode 19 is made of a material selected from, for example, Ta, Zr, Hf, Al, and B.

For the MTJ element MTJ, for example, the following materials are used.

The storage layer 21 and the reference layer 23 preferably use, for example, Fe, Co, Ni, or an alloy thereof, an oxide such as magnetite having a large spin polarization ratio, $CrO_2$, or $RXMnO_{3-y}$ (R: rare earth, X: Ca, Ba, Sr), or a Heusler alloy such as NiMnSb or PtMnSb. These magnetic materials may contain a non-magnetic element such as Ag, Cu, Au, Al, Mg, Si, Bi, Ta, B, C, O, N, Pd, Pt, Zr, Ir, W, Mo, or Nb to some extent unless the ferromagnetism is lost.

The tunnel barrier layer 22 can use various dielectrics such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may exist in these dielectrics.

Note that the MTJ element MTJ need not always have the illustrated stacked structure, and various changes can be made. The layers that constitute the MTJ element MTJ are not limited to those described above and can include the lower electrode 19 or the upper electrode 25. The transistor Tr may be buried in the semiconductor substrate 11. A seam (void) 50 is formed in the contact 18. The seam 50 need not always be formed.

[1-2] Structure 1-2

A structure 1-2 of the magnetic random access memory according to the first embodiment will be described with reference to FIG. 2. In the structure 1-2, the MTJ element MTJ is larger than the contact 18, and ILDs 14 and 15 under the MTJ element MTJ are formed so as to have a stacked structure of $SiN/SiO_2$.

Figure 2:
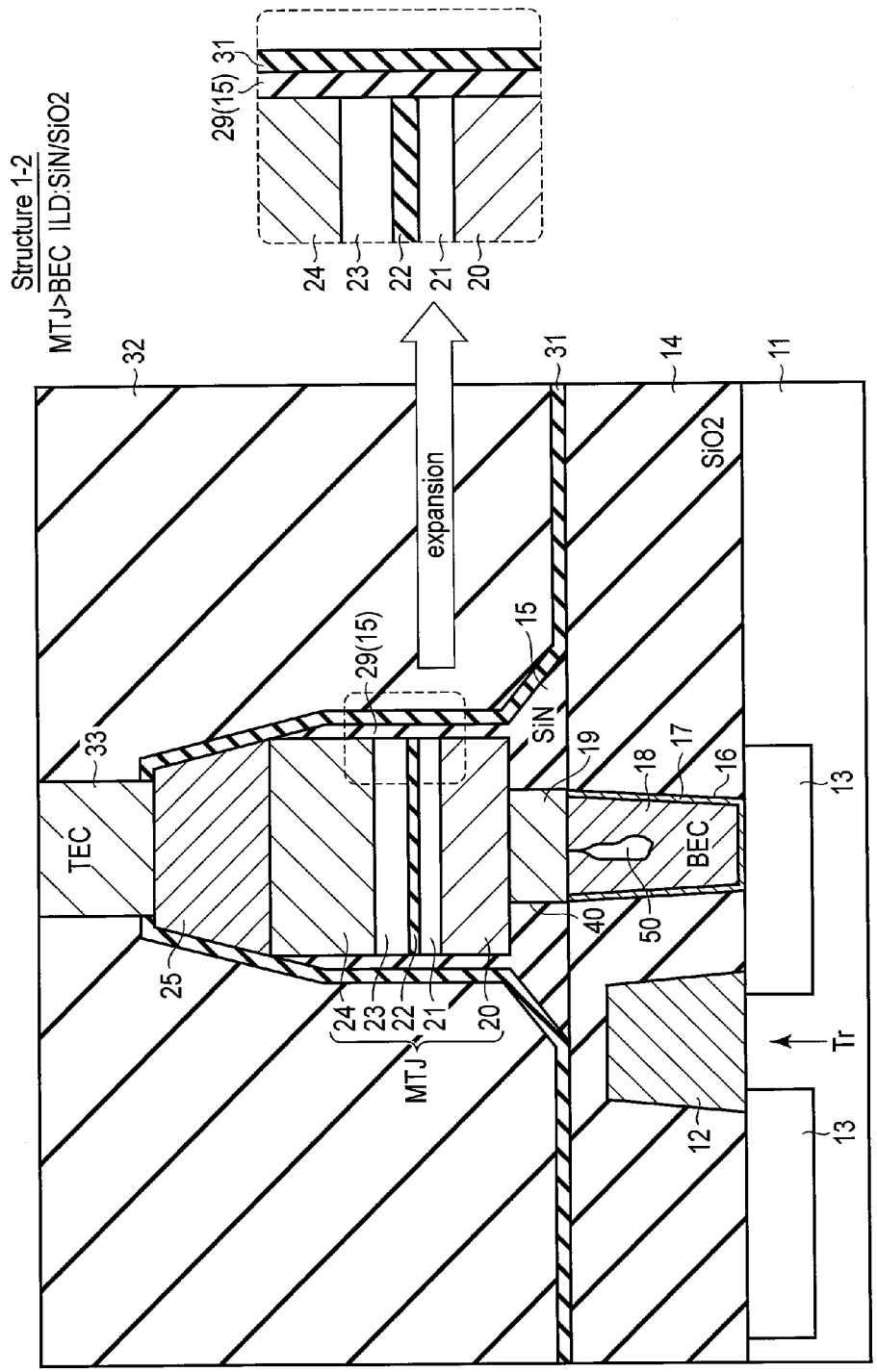
FIG. 2 is a sectional view showing a structure 1-2 of the magnetic random access memory according to the first embodiment.

As shown in FIG. 2, the structure 1-2 is different from the structure 1-1 in that the two ILDs 14 and 15 made of different materials are formed around the contact 18, and the protective portion 29 covering the side surface of the MTJ element MTJ is made of the same material as that of the ILD (for example, SiN film) 15.

In the structure 2-1, the ILD 14 around the contact 18 is made of $SiO_2$, and the ILD 15 around the lower electrode 19 is made of SiN. However, the ILD 15 may use SiON, AlN, or BN in place of SiN. The ILD 15 around the lower electrode 19 has its tail spreading out from the upper surface toward the bottom surface of the lower electrode 19.

Note that the film thickness of the ILD 15 is not necessarily almost equal to the thickness of the lower electrode 19, as illustrated. The ILD 15 need only have a thickness that allows to form a deposit on the side surface of the MTJ element MTJ when processing the ILD 15.

[1-3] Structure 1-3

A structure 1-3 of the magnetic random access memory according to the first embodiment will be described with reference to FIG. 3. In the structure 1-3, the MTJ element MTJ is smaller than the contact 18, and the ILD 14 under the MTJ element MTJ is made of $SiO_2$.

As shown in FIG. 3, the structure 1-3 is different from the structure 1-1 in that the MTJ element MTJ is smaller than the contact 18.

More specifically, the upper side surface of the contact 18 and the side surface of the lower electrode 19 project outward from the side surface of the MTJ element MTJ. The side surface of the lower electrode 19 is in contact with the passivation film 31. For this reason, the ILD 14 around the contact 18 and the protective portion 29 of the ILD 14 are separated. The protective portion 29 may contain not only the material of the ILD 14 but also the material of the lower electrode 19.

[1-4] Structure 1-4

A structure 1-4 of the magnetic random access memory according to the first embodiment will be described with reference to FIG. 4. In the structure 1-4, the MTJ element MTJ is smaller than the contact 18, and the ILDs 14 and 15 under the MTJ element MTJ are formed so as to have a stacked structure of $SiN/SiO_2$.

Figure 4:
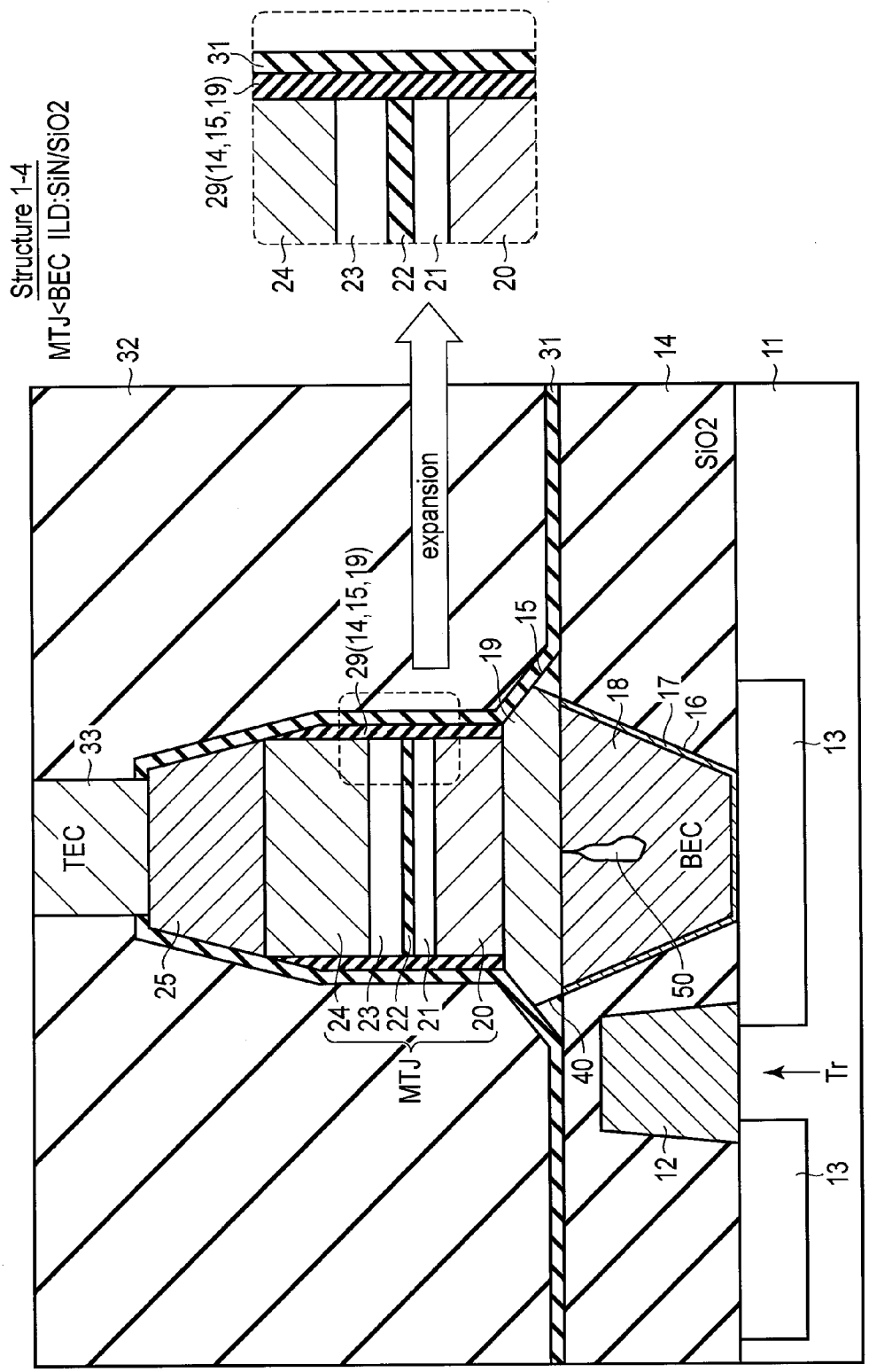
FIG. 4 is a sectional view showing a structure 1-4 of the magnetic random access memory according to the first embodiment.

As shown in FIG. 4, the structure 1-4 is different from the structure 1-3 in that the protective portion 29 is made of the materials (for example, Si, O, and N) of the ILDs 14 and 15. The protective portion 29 may contain not only the materials of the ILDs 14 and 15 but also the material of the lower electrode 19 or only the materials (for example, Si and N) of the ILD 15.

Note that in FIG. 4, the ILD 15 made of an SiN film remains on the ILD 14. However, the ILD 15 may be removed by IBE in the process. The ILD 15 may use SiON, AlN, or BN in place of SiN.

[1-5] Manufacturing Method 1-1

A manufacturing method 1-1 of the structure 1-1 of the magnetic random access memory according to the first embodiment will be described with reference to FIGS. 1, 5, 6, 7, 8, 9, 10, and 11.

First, as shown in FIG. 5, a gate electrode 12 is formed on a semiconductor substrate 11. Source/drain diffusion layers 13 are formed in the semiconductor substrate 11 on both sides of the gate electrode 12. A transistor Tr is thus formed. An ILD 14 made of an $SiO_2$ film is formed to cover the transistor Tr.

Next, a contact hole 16 that exposes the surface of the source/drain diffusion layer 13 is formed in the ILD 14. A barrier metal film 17 is formed on the inner wall of the contact hole 16 and the upper surface of the ILD 14. A metal layer made of, for example, W is formed on the barrier metal film 17. The metal layer fills in the contact hole 16. After that, the metal layer and the barrier metal film 17 are removed by CMP (Chemical Mechanical Polish) or the like to expose the surface of the ILD 14. A contact 18 connected to the source/drain diffusion layer 13 is thus formed.

The metal layer and the barrier metal film 17 at the upper portion of the contact hole 16 are removed by, for example, etch back, thereby forming a recess portion 40. This makes the upper surface level of the contact 18 lower than that of the ILD 14.

Next, as shown in FIG. 6, a lower electrode 19 made of, for example, Ta is formed in the recess portion 40 and on the ILD 14.

Figure 7:
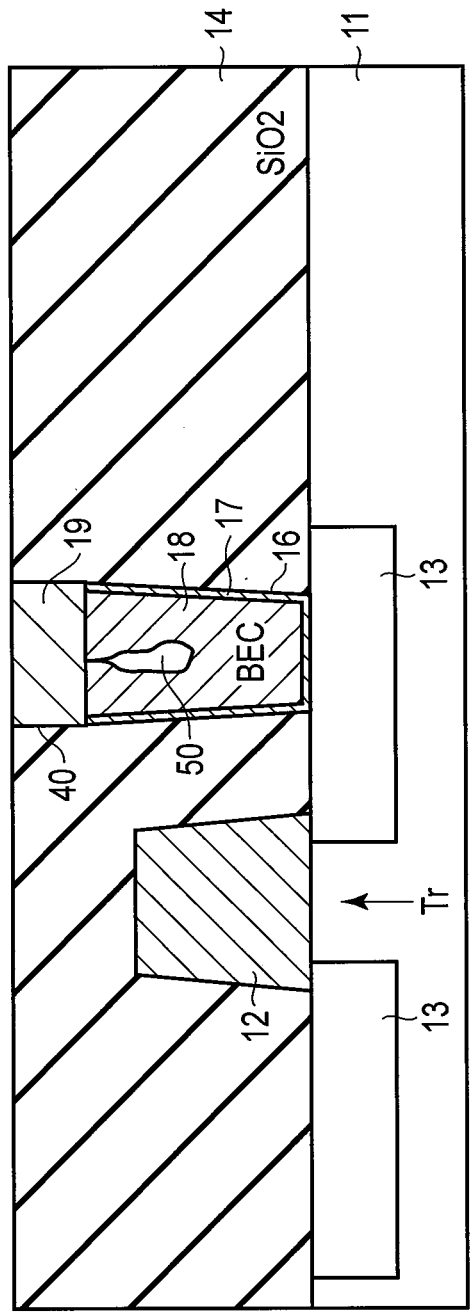

As shown in FIG. 7, the lower electrode 19 on the ILD 14 is removed by CMP or the like to expose the surface of the ILD 14.

Figure 8:
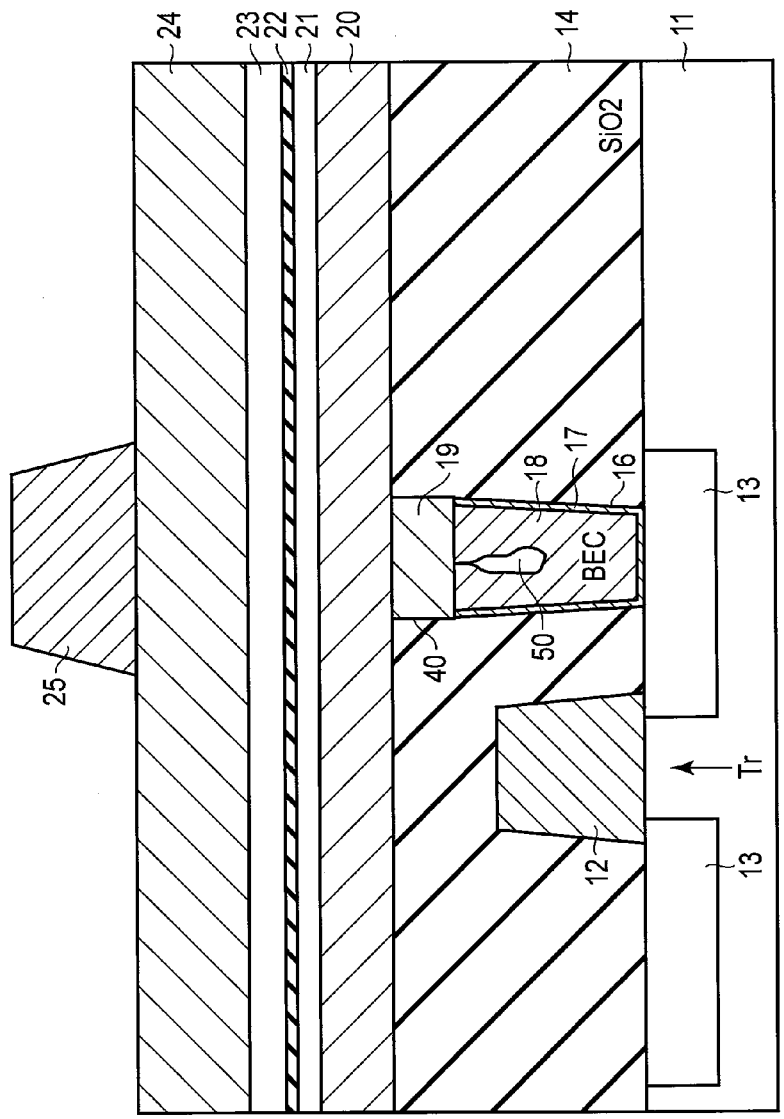

As shown in FIG. 8, a metal layer 20, a storage layer 21, a tunnel barrier layer 22, a reference layer 23, a shift cancel layer 24, and an upper electrode (hard mask) 25 are sequentially stacked on the lower electrode 19 and the ILD 14. After that, the upper electrode 25 is patterned. At this time, the upper electrode 25 is processed so as to be larger than the contact 18.

Figure 9:
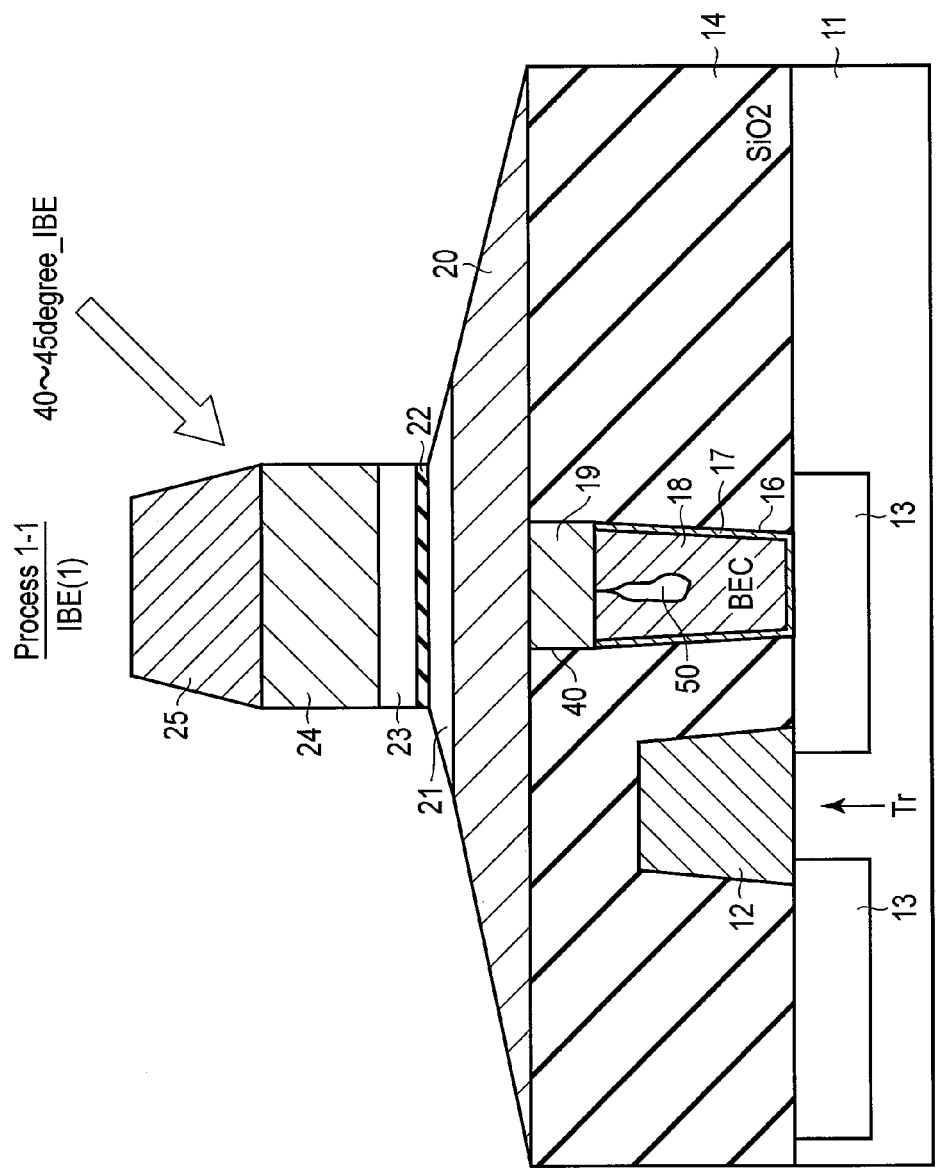

As shown in FIG. 9, first IBE is performed using the patterned upper electrode 25 as a hard mask. In the first IBE, ions enter obliquely. The oblique angle is about 40° to 45° with respect to a direction perpendicular to the MTJ film surface. The metal layer 20, the storage layer 21, the tunnel barrier layer 22, the reference layer 23, and the shift cancel layer 24 are processed by the first IBE. In the first IBE, the etching is preferably stopped before the surface of the ILD 14 is exposed.

Figure 10:
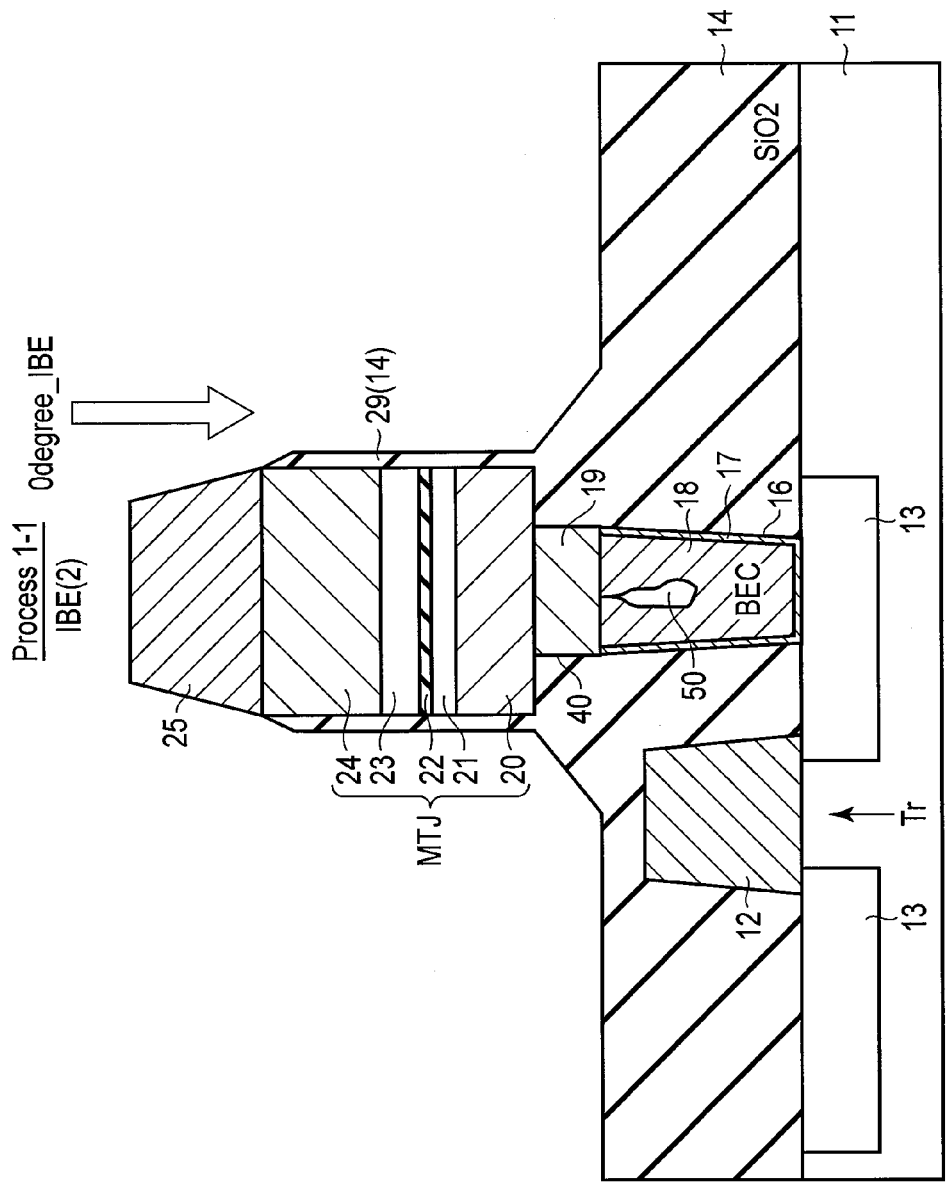

As shown in FIG. 10, second IBE is performed. In the second IBE, ions enter in the direction (0°) perpendicular to the MTJ film surface. The ILD 14, the metal layer 20, and the storage layer 21 are processed by the second IBE. As a result, a protective portion 29 made of the deposit of the ILD 14 is formed on the side surfaces of the metal layer 20, the storage layer 21, the tunnel barrier layer 22, the reference layer 23, and the shift cancel layer 24. Note that the oblique angle of ion incidence of the second IBE may be about 0° to 20° with respect to the direction perpendicular to the MTJ film surface.

As shown in FIG. 11, a passivation film 31 made of, for example, SiN is formed on the ILD 14 and the upper electrode 25.

As shown in FIG. 1, an ILD 32 is formed on the passivation film 31. A contact 33 connected to the upper electrode 25 is formed in the ILD 32.

[1-6] Manufacturing Method 1-2

A manufacturing method 1-2 of the structure 1-2 of the magnetic random access memory according to the first embodiment will be described with reference to FIGS. 2, 12, and 13.

Figure 12:
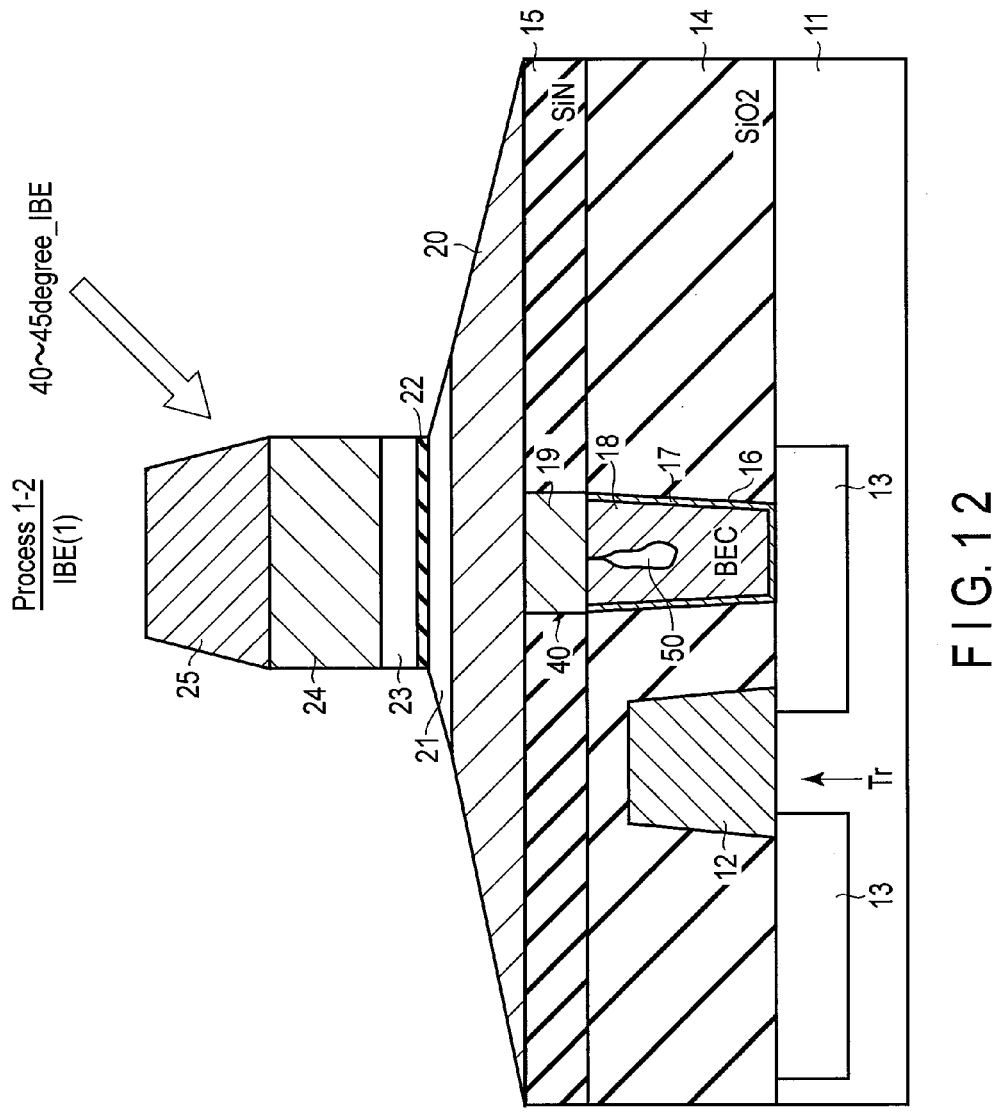
FIGS. 12 and 13 are sectional views showing a manufacturing method 1-2 of the structure 1-2 of the magnetic random access memory according to the first embodiment.

First, as shown in FIG. 12, in the manufacturing method 1-2, two ILDs 14 and 15 are deposited on a semiconductor substrate 11 and a transistor Tr. The ILD 14 is, for example, an $SiO_2$ film, and the ILD 15 is an SiN film. After that, as in the manufacturing method 1-1, a contact 18 is formed in a contact hole 16 while making a barrier metal film 17 intervene between them, and a lower electrode 19 is formed in a recess portion 40. The stacked film of an MTJ element MTJ is formed on the lower electrode 19 and the ILD 15. Note that the bottom surface of the ILD 15 need not always be flush with that of the lower electrode 19, as shown in FIG. 12.

Next, first IBE is performed using a patterned upper electrode 25 as a hard mask. In the first IBE, ions enter obliquely. The oblique angle is about 40° to 45° with respect to a direction perpendicular to the MTJ film surface. A metal layer 20, a storage layer 21, a tunnel barrier layer 22, a reference layer 23, and a shift cancel layer 24 are processed by the first IBE. In the first IBE, the etching is preferably stopped before the surface of the ILD 15 is exposed.

Figure 13:
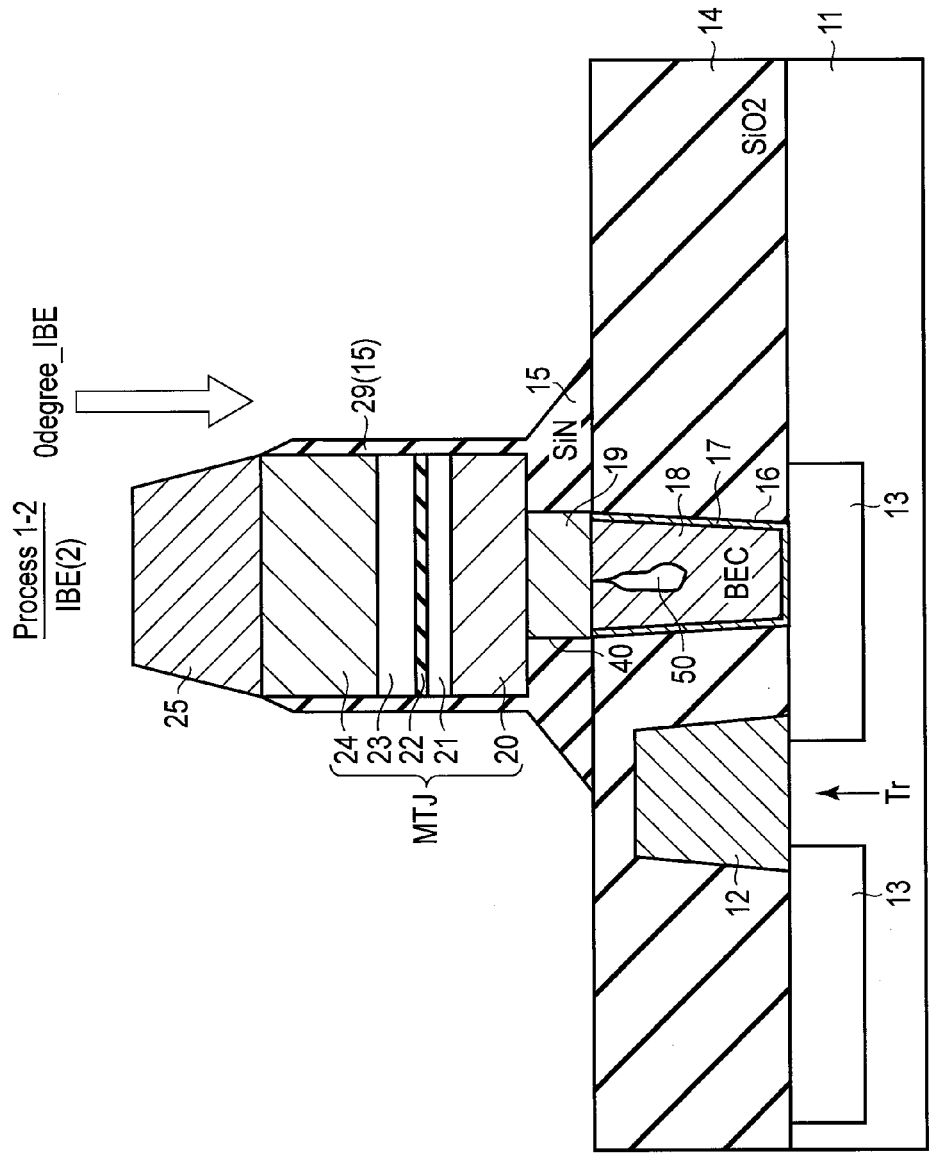

As shown in FIG. 13, second IBE is performed. In the second IBE, ions enter in the direction (0°) perpendicular to the MTJ film surface. The ILD 15 and the metal layer 20 are processed by the second IBE. As a result, a protective portion 29 made of the deposit of the ILD 15 is formed on the side surfaces of the metal layer 20, the storage layer 21, the tunnel barrier layer 22, the reference layer 23, and the shift cancel layer 24.

After that, as shown in FIG. 2, a passivation film 31 made of, for example, SiN is formed, and a contact 33 connected to the upper electrode 25 is formed in an ILD 32, as in the manufacturing method 1-1.

[1-7] Manufacturing Method 1-3

A manufacturing method 1-3 of the structure 1-3 of the magnetic random access memory according to the first embodiment will be described with reference to FIGS. 3, 14, and 15.

Figure 14:
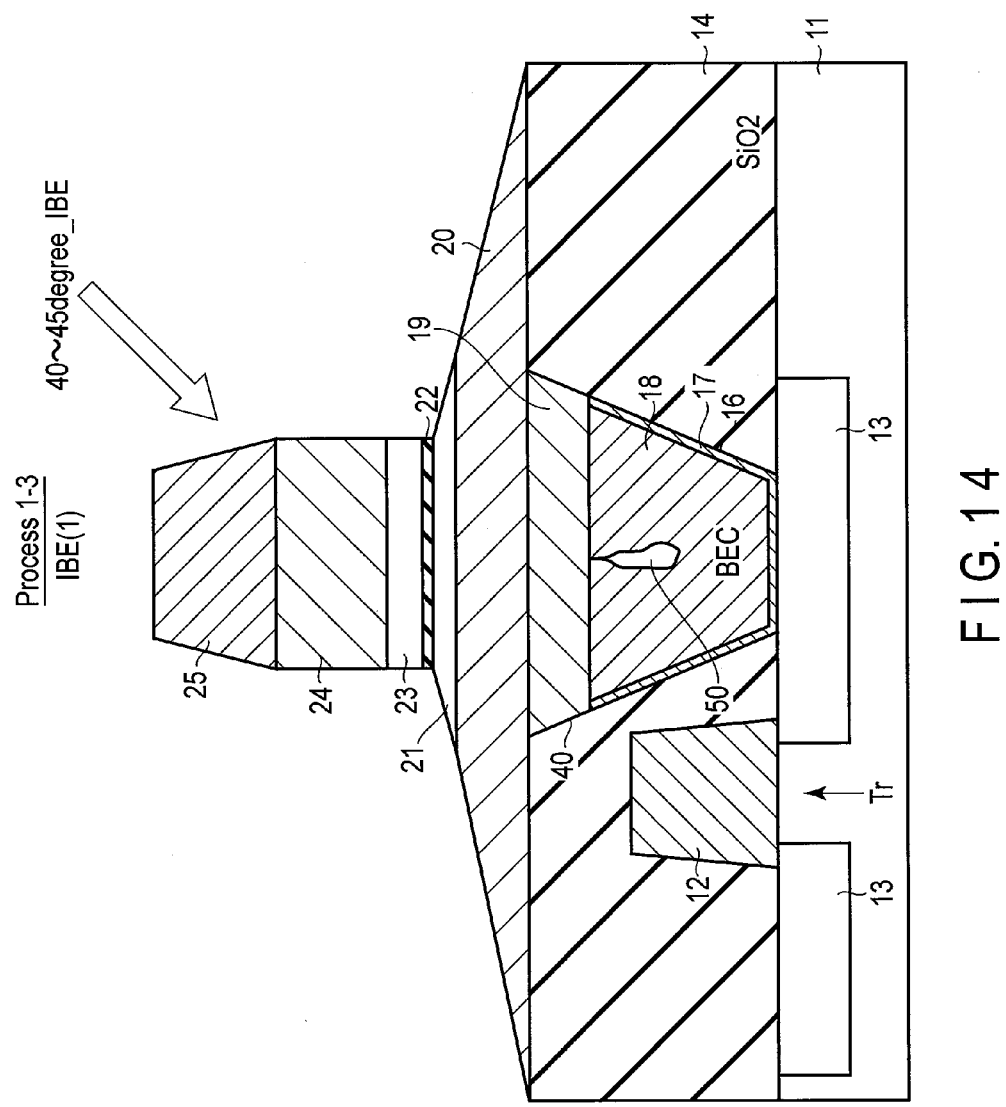

First, as shown in FIG. 14, in the manufacturing method 1-3, an MTJ element MTJ is processed by first IBE so as to be smaller than a contact 18. The first IBE is the same as in the above-described manufacturing method 1-1.

Next, as shown in FIG. 15, second IBE is performed. In the second IBE, ions enter in the direction (0°) perpendicular to the MTJ film surface. An ILD 14, a lower electrode 19, and a metal layer 20 are processed by the second IBE. As a result, a protective portion 29 made of the deposit of the ILD 14 and the lower electrode 19 is formed on the side surfaces of the metal layer 20, a storage layer 21, a tunnel barrier layer 22, a reference layer 23, and a shift cancel layer 24. At this time, the lower electrode 19 is exposed, and the protective portion 29 is separated from the ILD 14 around the contact 18.

After that, as shown in FIG. 3, a passivation film 31 made of, for example, SiN is formed, and a contact 33 connected to an upper electrode 25 is formed in an ILD 32, as in the manufacturing method 1-1.

[1-8] Manufacturing Method 1-4

A manufacturing method 1-4 of the structure 1-4 of the magnetic random access memory according to the first embodiment will be described with reference to FIGS. 4, 16, and 17.

Figure 16:
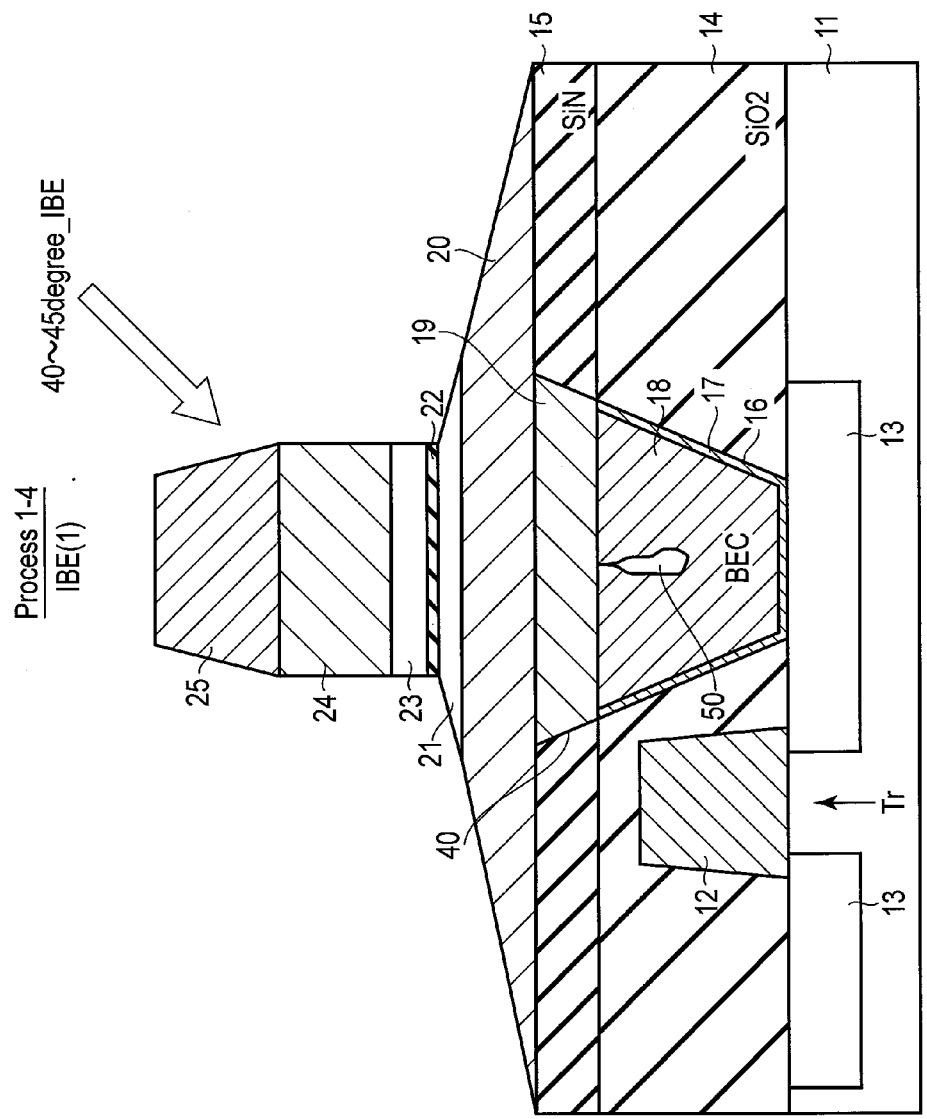
FIGS. 16 and 17 are sectional views showing a manufacturing method 1-4 of the structure 1-4 of the magnetic random access memory according to the first embodiment.

First, as shown in FIG. 16, in the manufacturing method 1-4, two ILDs 14 and 15 are deposited on a semiconductor substrate 11 and a transistor Tr. The ILD 14 is, for example, an $SiO_2$ film, and the ILD 15 is an SiN film. After that, as in the manufacturing method 1-1, a contact 18 is formed in a contact hole 16 while making a barrier metal film 17 intervene between them, and a lower electrode 19 is formed in a recess portion 40. The stacked film of an MTJ element MTJ is formed on the lower electrode 19 and the ILD 15. First IBE is performed using a patterned upper electrode 25 as a hard mask. The first IBE is the same as in the above-described manufacturing method 1-1.

Figure 17:
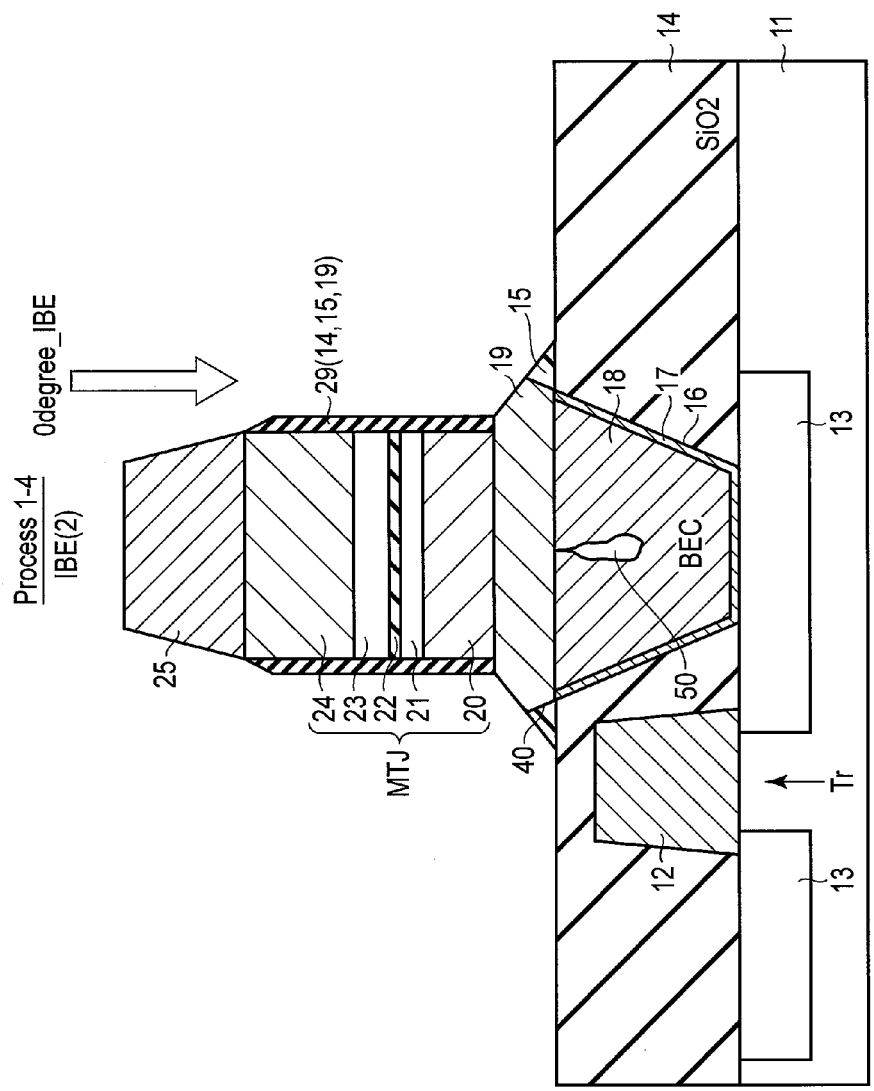

As shown in FIG. 17, second IBE is performed. In the second IBE, ions enter in the direction (0°) perpendicular to the MTJ film surface. The ILDs 14 and 15, the lower electrode 19, and a metal layer 20 are processed by the second IBE. As a result, a protective portion 29 made of the deposit of the ILDs 14 and 15 and the lower electrode 19 is formed on the side surfaces of the metal layer 20, a storage layer 21, a tunnel barrier layer 22, a reference layer 23, and a shift cancel layer 24. At this time, the protective portion 29 is separated from the ILD 14, and the lower electrode 19 is exposed.

After that, as shown in FIG. 4, a passivation film 31 made of, for example, SiN is formed, and a contact 33 connected to the upper electrode 25 is formed in an ILD 32, as in the manufacturing method 1-1.

[1-9] Effects

In the first embodiment, the protective portion 29 made of the ILD 14 (15) under the MTJ element MTJ processed during the IBE process covers the side wall of the MTJ element MTJ. This allows to deposit the protective film 31 without exposing the side wall of the MTJ element MTJ to air after the IBE process. It is therefore possible to suppress oxidation of the peripheral materials of the MTJ element MTJ in air and improve the MTJ characteristic. Especially, the MTJ resistance does not increase to cause degradation.

[2] Second Embodiment

In the second embodiment, to suppress diffusion of $H_2O$ or O from an ILD made of $SiO_2$ around a contact (BEC), an SiN film is provided on the ILD. Note that in the second embodiment, a description of the same points as in the first embodiment will be omitted or made briefly, and points different from the first embodiment will be explained in detail.

[2-1] Structure 2-1

A structure 2-1 of a magnetic random access memory according to the second embodiment will be described with reference to FIG. 18. In the structure 2-1, an MTJ element MTJ is larger than a contact 18, and ILDs 14 and 15 under the MTJ element MTJ are formed so as to have a stacked structure of $SiN/SiO_2$.

As shown in FIG. 18, the ILD 14 made of an $SiO_2$ film and the ILD 15 made of an SiN film are stacked, and the contact 18 is formed in the ILDs 14 and 15. The MTJ element MTJ is formed on the contact 18. The MTJ element MTJ includes an underlayer 60, a storage layer 21, a tunnel barrier layer 22, a reference layer 23, and a shift cancel layer 24. An upper electrode (hard mask) 25 is formed on the shift cancel layer 24. A passivation film 31 is formed on the upper surface of the ILD 15, the side surface of the MTJ element MTJ, and the side and upper surfaces of the upper electrode 25.

In the structure 2-1, the ILD 15 made of SiN is formed around the upper portion of the contact 18, and the ILD 14 made of $SiO_2$ is formed around the contact 18 other than the upper portion. That is, since the upper surface of the ILD 14 made of $SiO_2$ is covered with the ILD 15 made of SiN, the ILD 15 exists between the ILD 14 and the MTJ element MTJ. The ILD 15 blocks diffusion of $H_2O$ or O of the ILD 14 into the MTJ element MTJ or the passivation film 31.

The ILD 15 need only use a material that does not pass $H_2O$ or O. The material is not limited to SiN, and for example, SiON, AlN, BN, or the like may be used. The ILD 15 uses a material different from the ILD 14.

Examples of the material of the underlayer 60 are W, Hf, Al, and TiN. The underlayer 60 may correspond to, for example, the lower electrode 19 or the metal layer 20 of the first embodiment.

[2-2] Structure 2-2

A structure 2-2 of the magnetic random access memory according to the second embodiment will be described with reference to FIG. 19. In the structure 2-2, an MTJ element MTJ is larger than a contact 18, and ILDs 14 and 15 under the MTJ element MTJ are formed so as to have a stacked structure of $SiN/SiO_2$, as in the structure 2-1.

As shown in FIG. 19, the structure 2-2 is different from the structure 2-1 in that the ILD 15 is processed at the same time as the MTJ element MTJ, and the side surface of the ILD 15 opposite to the contact 18 matches the side surface of the MTJ element MTJ. A passivation film 31 covers the side surface of the MTJ element MTJ and that of the ILD 15 and is in direct contact with the ILD 14.

[2-3] Structure 2-3

A structure 2-3 of the magnetic random access memory according to the second embodiment will be described with reference to FIG. 20. In the structure 2-3, an MTJ element MTJ is smaller than a contact 18, and ILDs 14 and 15 under the MTJ element MTJ are formed so as to have a stacked structure of $SiN/SiO_2$.

As shown in FIG. 20, the structure 2-3 is different from the structure 2-1 in that the MTJ element MTJ does not exist above the ILD 14, and the entire upper surface of the ILD 15 is covered with a passivation film 31. In the structure 2-3, the ILD 15 suppresses diffusion of $H_2O$ or O of the ILD 14 into the MTJ element MTJ through the passivation film 31.

[2-4] Manufacturing Method 2-1

A manufacturing method 2-1 of the structure 2-1 of the magnetic random access memory according to the second embodiment will be described with reference to FIGS. 18, 21, and 22.

First, as shown in FIG. 21, two ILDs 14 and 15 are deposited on a semiconductor substrate (not shown) and a transistor (not shown). The ILD 14 is, for example, an $SiO_2$ film, and the ILD 15 is an SiN film. A contact hole 16 is formed in the ILDs 14 and 15. A contact 18 is formed in the contact hole 16 while making a barrier metal film (not shown) intervene between them. Next, an underlayer 60, a storage layer 21, a tunnel barrier layer 22, a reference layer 23, a shift cancel layer 24, and an upper electrode (hard mask) 25 are sequentially stacked on the contact 18 and the ILD 15, and the upper electrode 25 is patterned. At this time, the upper electrode 25 is processed so as to be larger than the contact 18.

Figure 22:
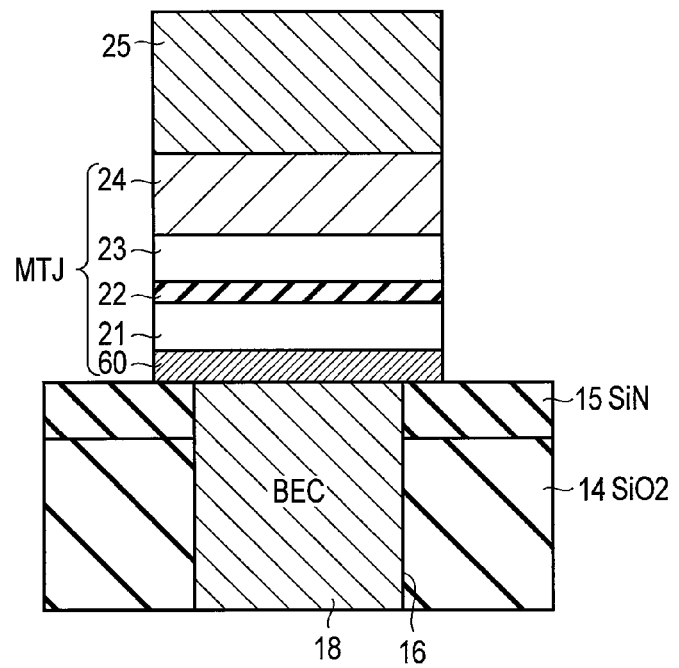

As shown in FIG. 22, the underlayer 60, the storage layer 21, the tunnel barrier layer 22, the reference layer 23, and the shift cancel layer 24 are processed using the patterned upper electrode 25 as a hard mask, thereby forming an MTJ element MTJ.

After that, as shown in FIG. 18, a passivation film 31 made of, for example, SiN is formed.

[2-5] Manufacturing Method 2-2

A manufacturing method 2-2 of the structure 2-2 of the magnetic random access memory according to the second embodiment will be described with reference to FIGS. 19 and 23.

Figure 23:
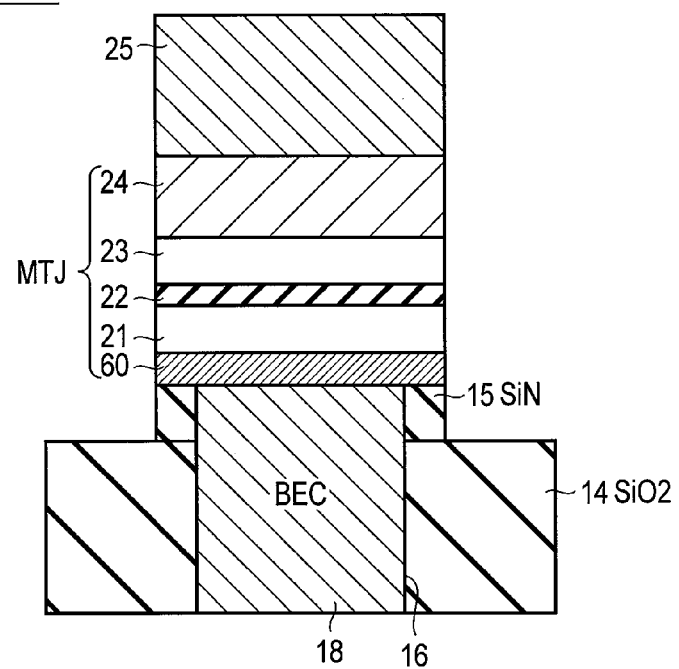
FIG. 23 is a sectional view showing a manufacturing method 2-2 of the structure 2-2 of the magnetic random access memory according to the second embodiment.

As shown in FIG. 23, in the manufacturing method 2-2, when forming an MTJ element MTJ, an ILD 15 is etched simultaneously to expose the surface of an ILD 14. The ILD 15 thus remains only under the MTJ element MTJ.

After that, as shown in FIG. 19, a passivation film 31 made of, for example, SiN is formed.

[2-6] Manufacturing Method 2-3

A manufacturing method 2-3 of the structure 2-3 of the magnetic random access memory according to the second embodiment will be described with reference to FIGS. 20 and 24.

As shown in FIG. 24, in the manufacturing method 2-3, when pattering an upper electrode 25, the upper electrode 25 is processed so as to be smaller than a contact 18.

After that, as shown in FIG. 20, an MTJ element MTJ is processed and formed using the patterned upper electrode 25. Next, a passivation film 31 made of, for example, SiN is formed.

[2-7] Effects

When a magnetic random access memory has a structure in which the MTJ element MTJ is directly arranged on the contact 18, the MTJ stacked film is directly deposited on the ILD 14 made of $SiO_2$ around the contact 18. In a high temperature process such as an annealing process or crystallization process of MTJ deposition, $H_2O$ or O in the ILD 14 may diffuse to the side of the MTJ above. Hence, the MTJ element MTJ and the underlayer 60 are oxidized.

On the other hand, in the second embodiment, a block layer (ILD 15) for preventing diffusion of $H_2O$ or O of the ILD 14 is formed around the contact 18 of the MTJ element MTJ. This allows to suppress degradation caused by oxidation of the MTJ element MTJ and the underlayer 60.

[3] Third Embodiment

In the third embodiment, the lower electrode under an MTJ element is processed by IBE to form a protective film made of an insulator containing the material of the lower electrode on the side wall of the MTJ element. Note that in the third embodiment, a description of the same points as in the first embodiment will be omitted or made briefly, and points different from the first embodiment will be explained in detail.

[3-1] Structure 3-1

A structure 3-1 of a magnetic random access memory according to the third embodiment will be described with reference to FIG. 25. In the structure 3-1, an MTJ element MTJ is larger than a contact 18, and an ILD 14 under the MTJ element MTJ is made of $SiO_2$.

Figure 25:
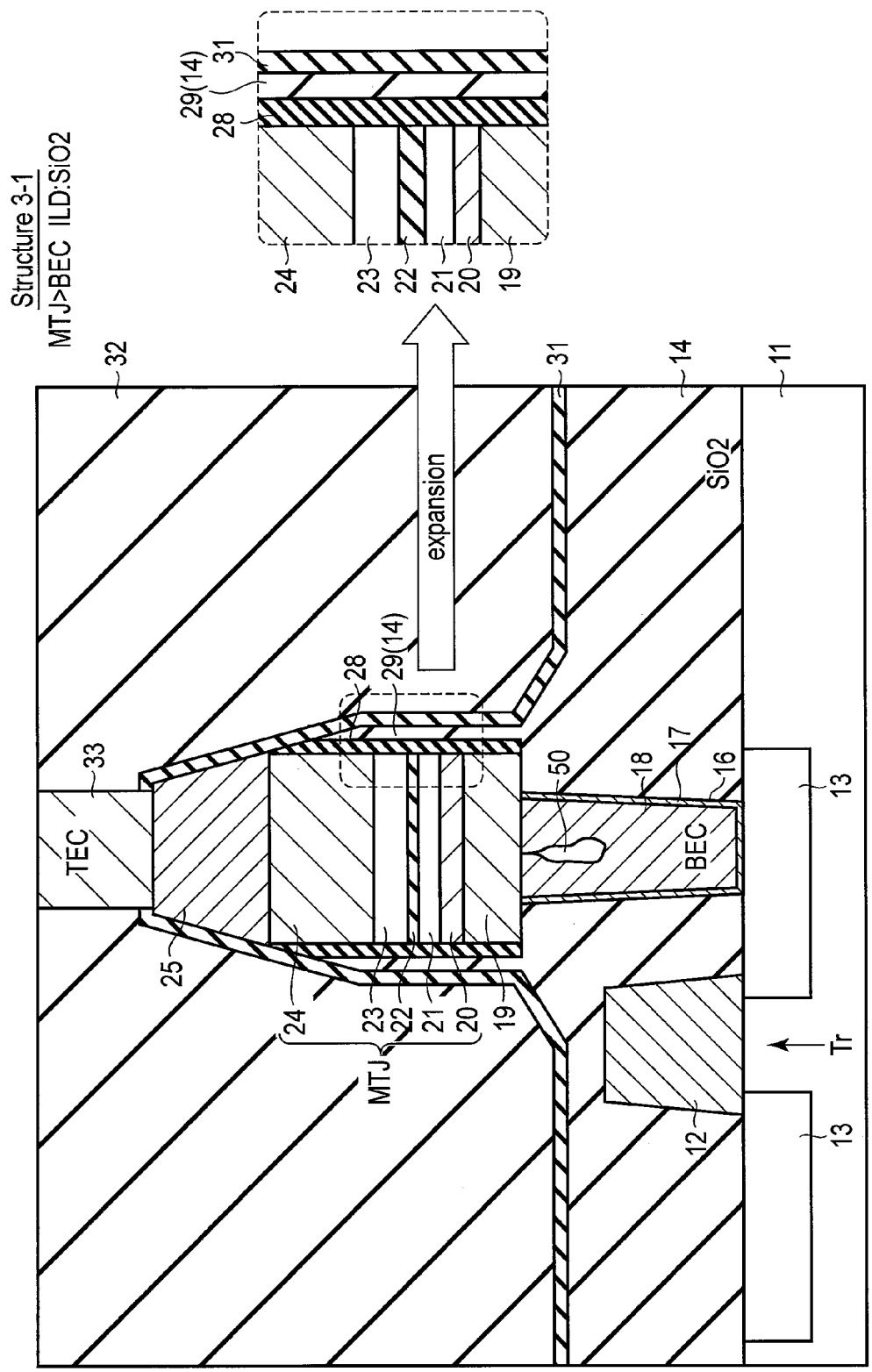
FIG. 25 is a sectional view showing a structure 3-1 of a magnetic random access memory according to the third embodiment.

As shown in FIG. 25, the structure 3-1 is different from the structure 1-1 in that a protective film 28 made of an insulator containing the material of a lower electrode 19 is further formed between a protective portion 29 of the ILD 14 and the side surfaces of the MTJ element MTJ and the lower electrode 19. Hence, in the structure 3-1, the side surface of the MTJ element MTJ is covered with three insulating films (the protective film 28, the protective portion 29 of the ILD 14, and a passivation film 31).

The lower electrode 19 is made of a material selected from Ta, Zr, Hf, Al, and B. The protective film 28 is made of an oxide generated by oxidizing the material contained in the lower electrode 19. Note that the protective film 28 may be made of a nitride obtained by nitriding the material of the lower electrode 19. The protective film 28 may contain the material of a metal layer 20. An insulating film containing the material of the metal layer 20 may be formed between the protective film 28 and the side surfaces of the MTJ element MTJ and the lower electrode 19.

The protective film 28 is not necessarily formed only on the side surfaces of the lower electrode 19, the metal layer 20, a storage layer 21, a tunnel barrier layer 22, a reference layer 23, and a shift cancel layer 24. The protective film 28 may further be formed on the side surface of an upper electrode 25. The protective film 28 preferably covers at least the side surfaces of the lower electrode 19, the metal layer 20, the storage layer 21, the tunnel barrier layer 22, and the reference layer 23, and particularly preferably covers the side surfaces of the tunnel barrier layer 22 and the reference layer 23.

In the structure 1-1, the lower electrode 19 is formed in the recess portion 40 in the contact hole 16 separately from the MTJ element MTJ. In the structure 3-1, however, the lower electrode 19 is not formed in a contact hole 16 but processed using the same mask as that used when processing the MTJ element MTJ. Hence, in the structure 3-1, the side surface of the MTJ element MTJ and that of the lower electrode 19 almost match.

[3-2] Structure 3-2

A structure 3-2 of the magnetic random access memory according to the third embodiment will be described with reference to FIG. 26. In the structure 3-2, the MTJ element MTJ is larger than the contact 18, and ILDs 14 and 15 under the MTJ element MTJ are formed so as to have a stacked structure of $SiN/SiO_2$.

As shown in FIG. 26, the structure 3-2 is different from the structure 3-1 in that the two ILDs 14 and 15 made of different materials are formed around the contact 18, and the protective portion 29 covering the side surface of the MTJ element MTJ is made of the same material as that of the ILD (for example, SiN film) 15.

In the structure 3-2, the ILD 14 around the contact 18 is made of $SiO_2$, and the ILD 15 around the lower electrode 19 is made of SiN. However, the ILD 15 may use SiON, AlN, or BN in place of SiN. The ILD 15 around the lower electrode 19 has its tail spreading out from the upper surface toward the bottom surface of the lower electrode 19.

[3-3] Structure 3-3

A structure 3-3 of the magnetic random access memory according to the third embodiment will be described with reference to FIG. 27. In the structure 3-3, the MTJ element MTJ is smaller than the contact 18, and the ILD 14 under the MTJ element MTJ is made of $SiO_2$.

Figure 27:
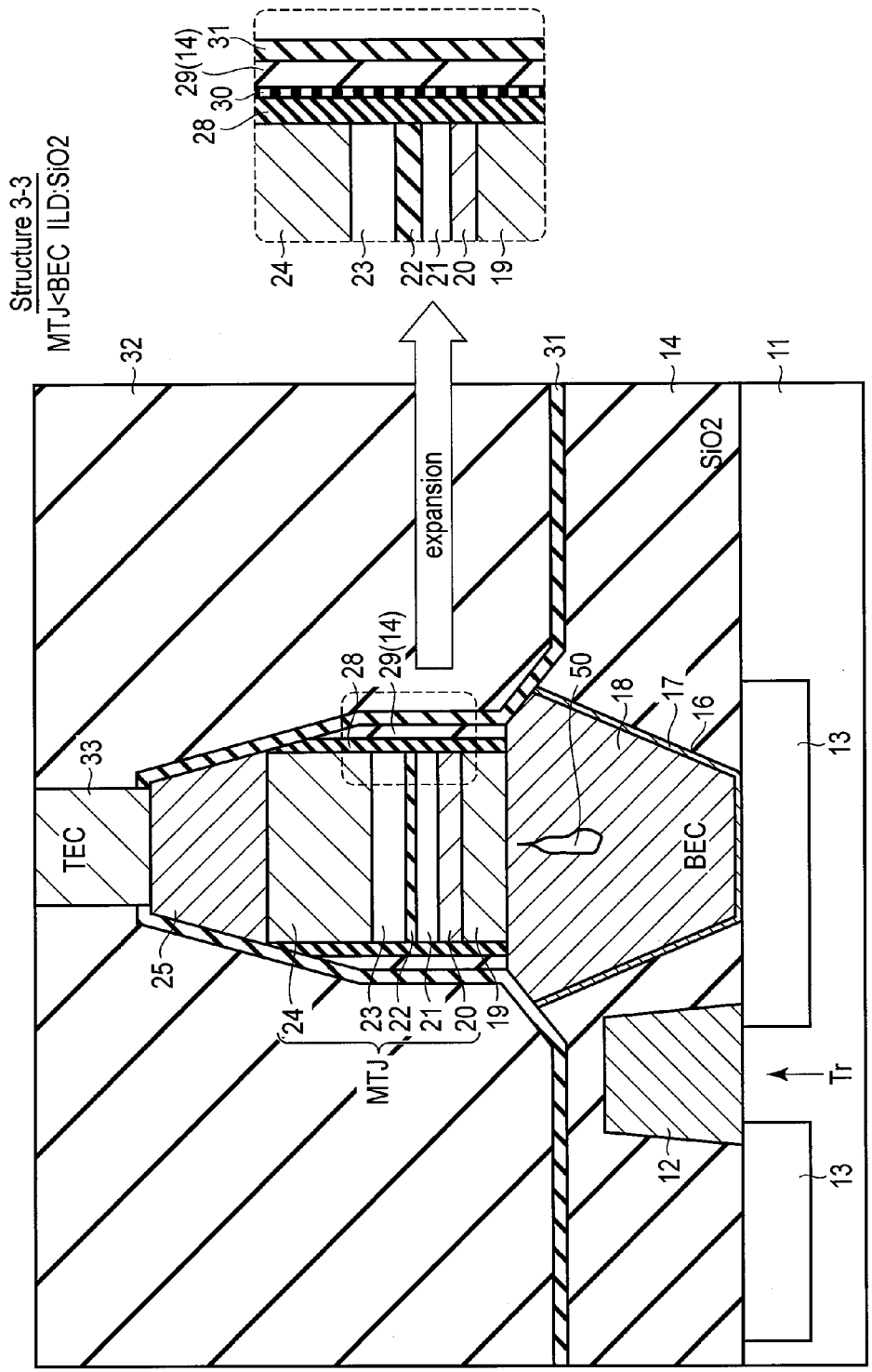
FIG. 27 is a sectional view showing a structure 3-3 of the magnetic random access memory according to the third embodiment.

As shown in FIG. 27, the structure 3-3 is different from the structure 3-1 in that the MTJ element MTJ is smaller than the contact 18.

More specifically, the upper side surface of the contact 18 projects outward from the side surfaces of the MTJ element MTJ and the lower electrode 19. The side surface of the contact 18 is in contact with the passivation film 31. For this reason, the ILD 14 around the contact 18 and the protective portion 29 of the ILD 14 are separated.

In the structure 3-3, a side wall layer 30 may slightly exist in the interface between the protective film 28 and the protective portion 29 of the ILD 14. The side wall layer 30 is made of the material of the contact 18 or the insulator (oxide or nitride) of the material of the contact 18. Note that the side wall layer 30 is very thin and does not affect the MTJ characteristic.

[3-4] Structure 3-4

A structure 3-4 of the magnetic random access memory according to the third embodiment will be described with reference to FIG. 28. In the structure 3-4, the MTJ element MTJ is smaller than the contact 18, and the ILDs 14 and 15 under the MTJ element MTJ are formed so as to have a stacked structure of SiN/SiO$_2$.

Figure 28:
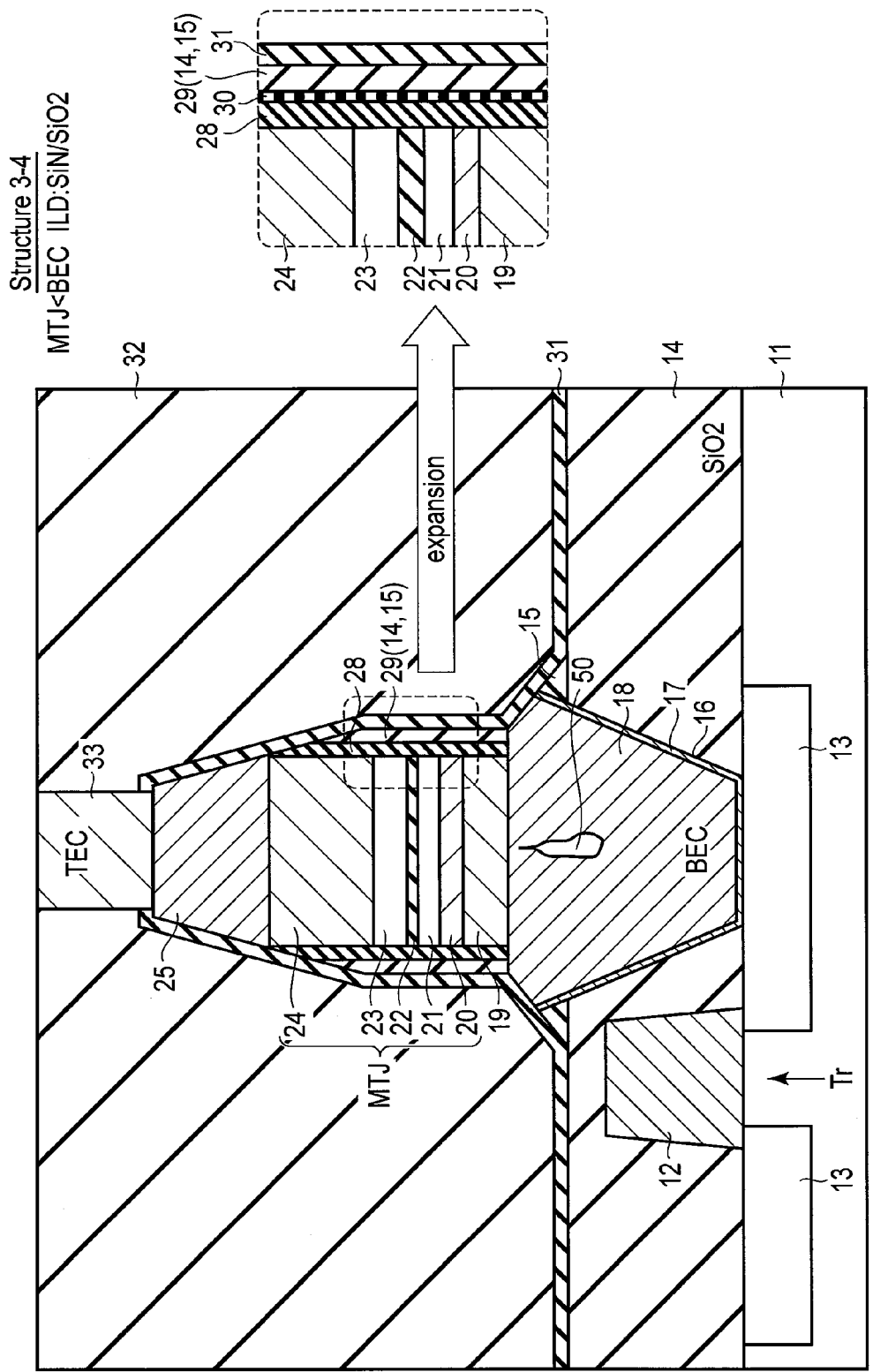
FIG. 28 is a sectional view showing a structure 3-4 of the magnetic random access memory according to the third embodiment.

As shown in FIG. 28, the structure 3-4 is different from the structure 3-3 in that the protective portion 29 is made of the materials (for example, Si, O, and N) of the ILDs 14 and 15.

Note that in FIG. 28, the ILD 15 made of an SiN film remains on the ILD 14. However, the ILD 15 may be removed by IBE in the process. The protective portion 29 may contain only the materials (for example, Si and N) of the ILD 15. The ILD 15 may use SiON, AlN, or BN in place of SiN.

In the above-described structures 3-1 to 3-4, the protective portion 29 may be eliminated, and the side surface of the MTJ element MTJ may be covered with two insulating films (the protective film 28 and the passivation film 31).

[3-5] Manufacturing Method 3-1

A manufacturing method 3-1 of the structure 3-1 of the magnetic random access memory according to the third embodiment will be described with reference to FIGS. 25, 29, 30, 31, and 32.

Figure 29:
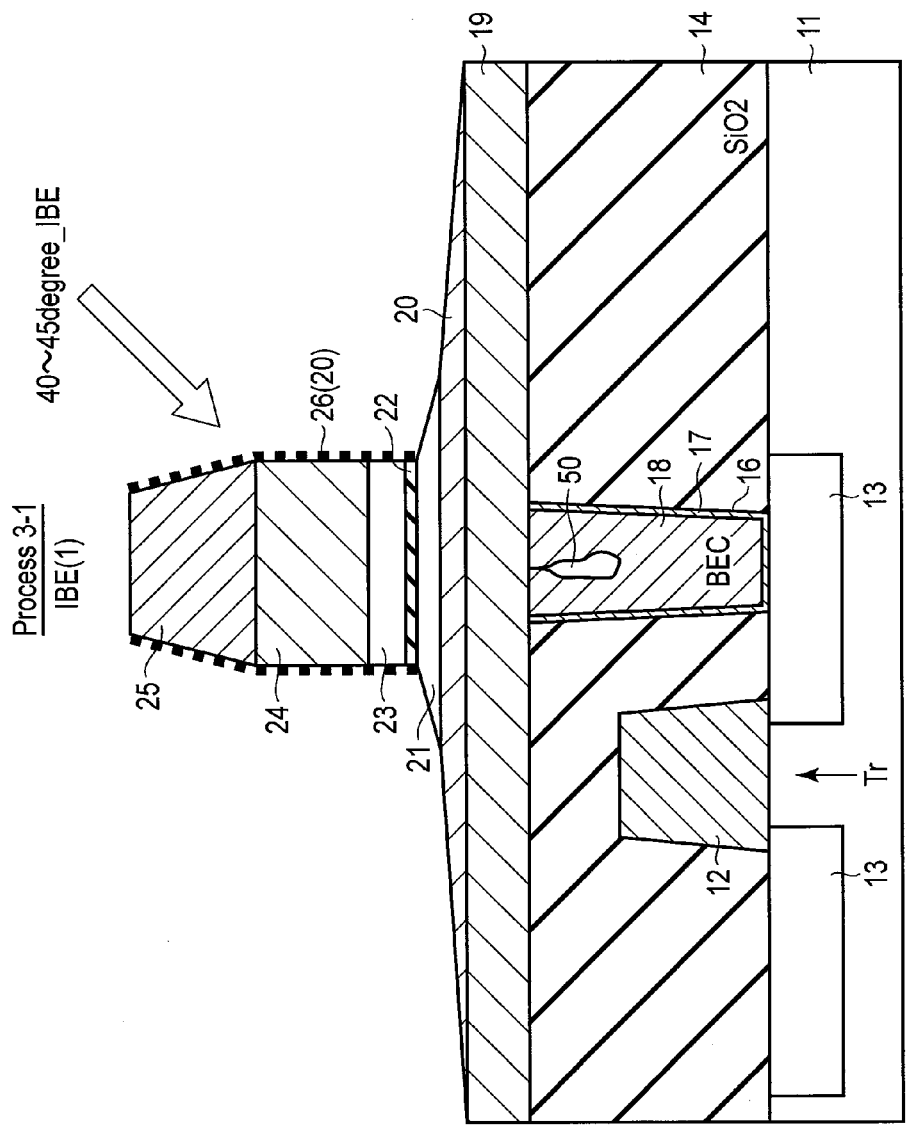
FIGS. 29, 30, 31, and 32 are sectional views showing a manufacturing method 3-1 of the structure 3-1 of the magnetic random access memory according to the third embodiment.

First, as shown in FIG. 29, an ILD 14 made of, for example, an SiO$_2$ film is deposited on a semiconductor substrate 11 and a transistor Tr. A contact hole 16 is formed in the ILD 14. A contact 18 is formed in the contact hole 16 while making a barrier metal film 17 intervene between them. Next, a lower electrode 19, a metal layer 20, a storage layer 21, a tunnel barrier layer 22, a reference layer 23, a shift cancel layer 24, and an upper electrode (hard mask) 25 are sequentially stacked on the contact 18 and the ILD 14. The upper electrode 25 is patterned. At this time, the upper electrode 25 is processed so as to be larger than the contact 18.

Next, first IBE is performed using the patterned upper electrode 25 as a hard mask. In the first IBE, ions enter obliquely. The oblique angle is about 40° to 45° with respect to a direction perpendicular to the MTJ film surface but may be about 0° to 30°. The storage layer 21, the tunnel barrier layer 22, the reference layer 23, and the shift cancel layer 24 are processed by the first IBE. At this time, a deposition layer 26 made of the material of the metal layer 20 may slightly be formed on the side surfaces of the tunnel barrier layer 22, the reference layer 23, the shift cancel layer 24, and the upper electrode 25. In the first IBE, the etching is preferably stopped before the surface of the lower electrode 19 is exposed.

Figure 30:
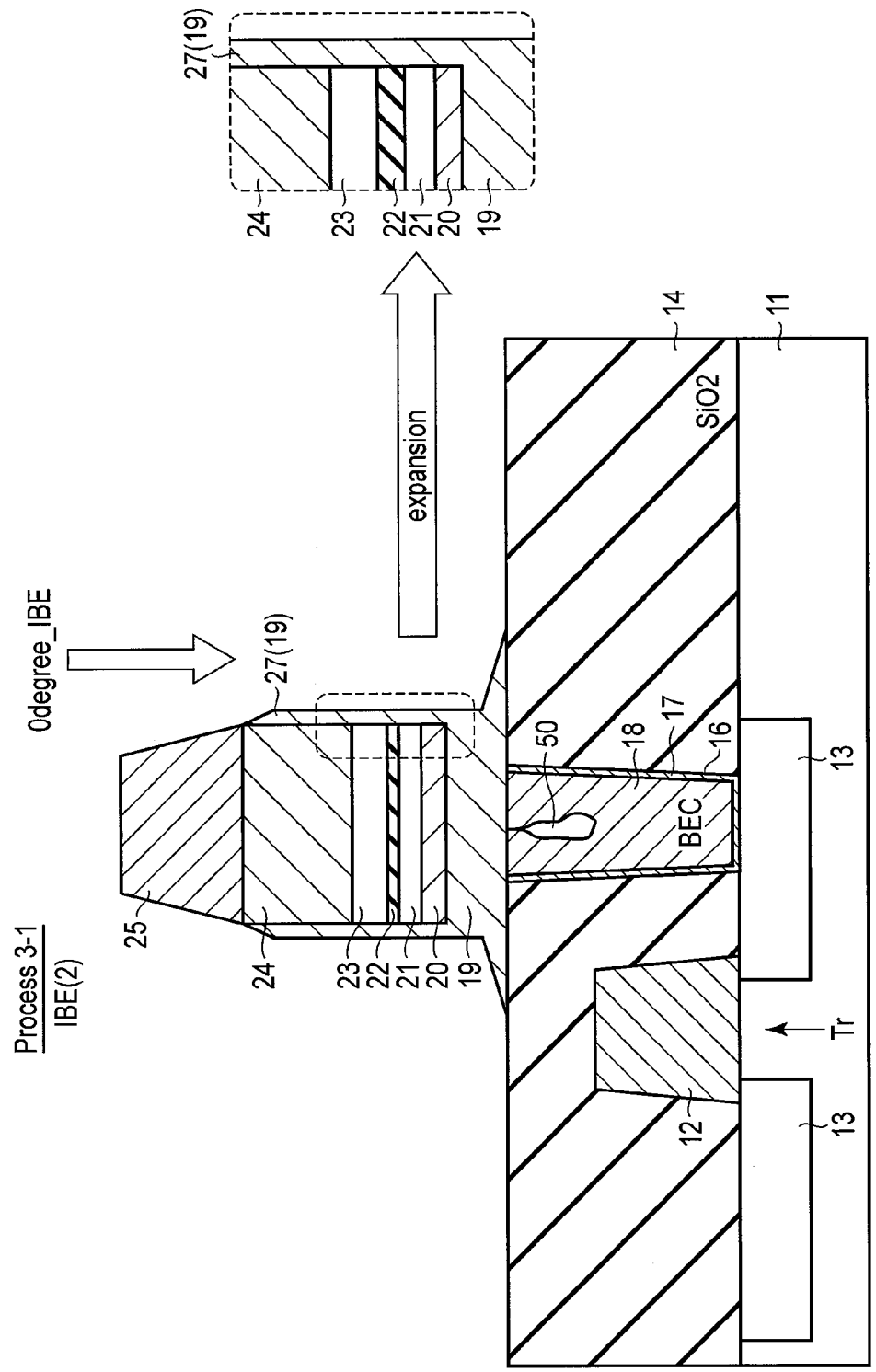

As shown in FIG. 30, second IBE is performed. In the second IBE, ions enter in the direction (0°) perpendicular to the MTJ film surface. The lower electrode 19, the metal layer 20, and the storage layer 21 are processed by the second IBE. As a result, a deposition layer 27 made of the material of the lower electrode 19 is formed on the side surfaces of the lower electrode 19, the metal layer 20, the storage layer 21, the tunnel barrier layer 22, the reference layer 23, and the shift cancel layer 24. Note that the oblique angle of ion incidence of the second IBE may be about 0° to 20° with respect to the direction perpendicular to the MTJ film surface.

Figure 31:
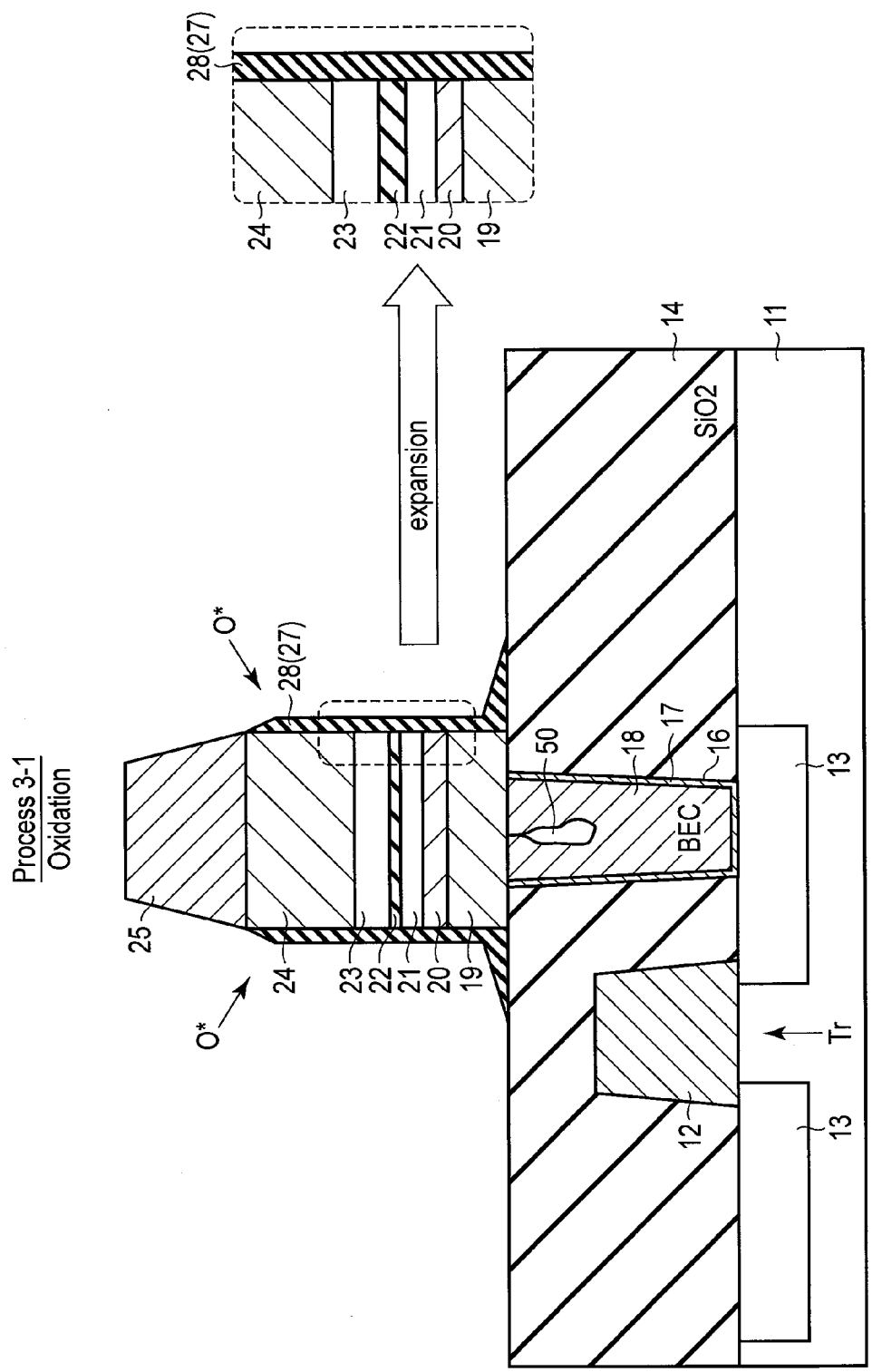

As shown in FIG. 31, the deposition layer 27 is oxidized and changed to an insulator. An insulating protective film 28 is thus formed on the side surfaces of the lower electrode 19, the metal layer 20, the storage layer 21, the tunnel barrier layer 22, the reference layer 23, and the shift cancel layer 24. Note that the deposition layer 27 may be changed to an insulator by nitriding. If the deposition layer 26 made of the material of the metal layer 20 is formed by the first IBE process shown in FIG. 29, the deposition layer 26 is changed to an insulator together with the deposition layer 27 made of the material of the lower electrode 19.

Figure 32:
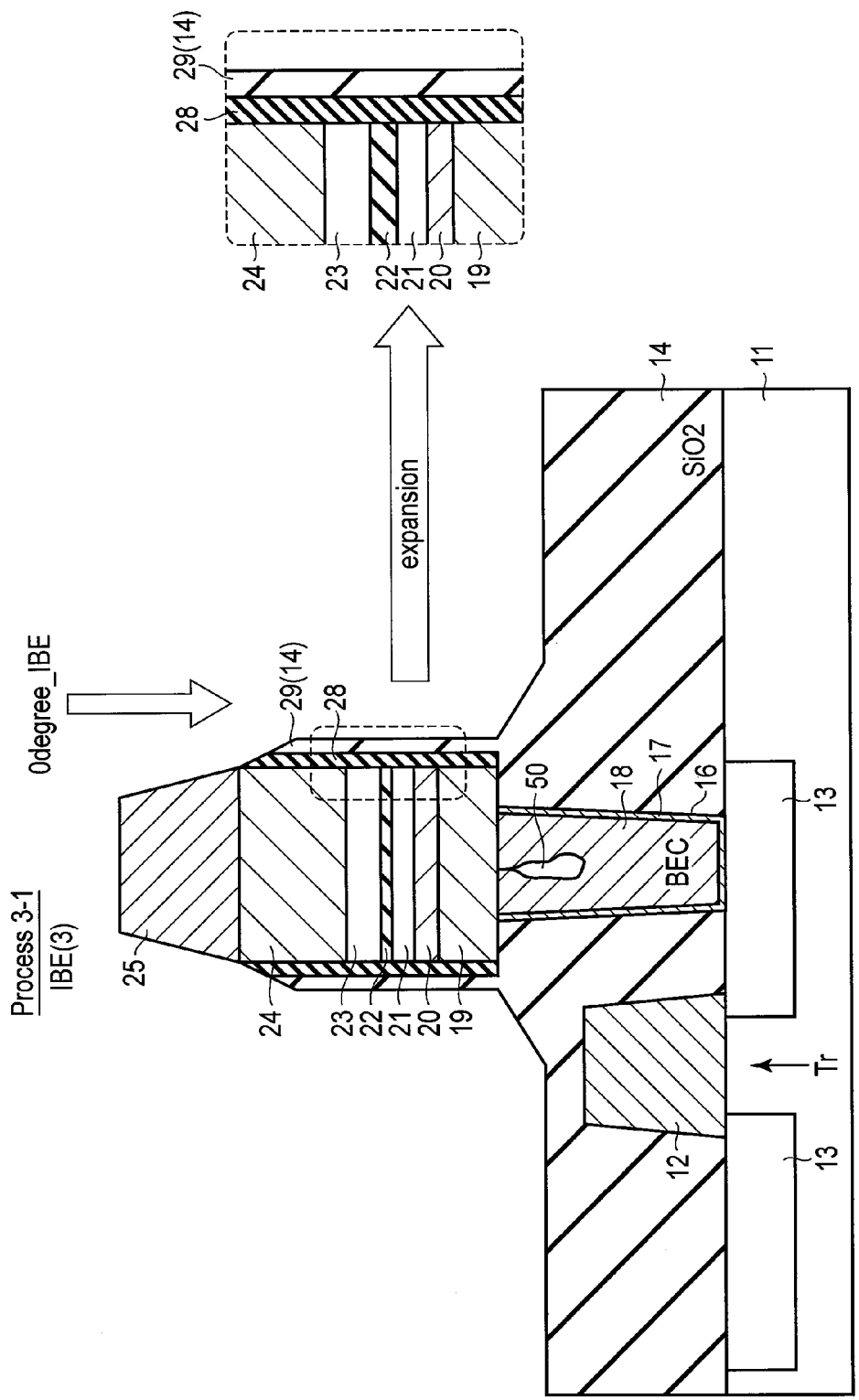

Next, as shown in FIG. 32, third IBE is performed. In the third IBE, ions enter in the direction (0°) perpendicular to the MTJ film surface. The protective film 28 and the ILD 14 are processed by the third IBE. As a result, a protective portion 29 made of the deposit of the ILD 14 is formed on the protective film 28 on the side surfaces of the lower electrode 19, the metal layer 20, the storage layer 21, the tunnel barrier layer 22, the reference layer 23, and the shift cancel layer 24. Note that the oblique angle of ion incidence of the third IBE may be about 0° to 20° with respect to the direction perpendicular to the MTJ film surface.

As shown in FIG. 25, a passivation film 31 made of, for example, SiN is formed on the ILD 14 and the upper electrode 25. Next, an ILD 32 is formed on the passivation film 31. A contact 33 connected to the upper electrode 25 is formed in the ILD 32.

[3-6] Manufacturing Method 3-2

A manufacturing method 3-2 of the structure 3-2 of the magnetic random access memory according to the third embodiment will be described with reference to FIGS. 26, 33, and 34.

Figure 33:
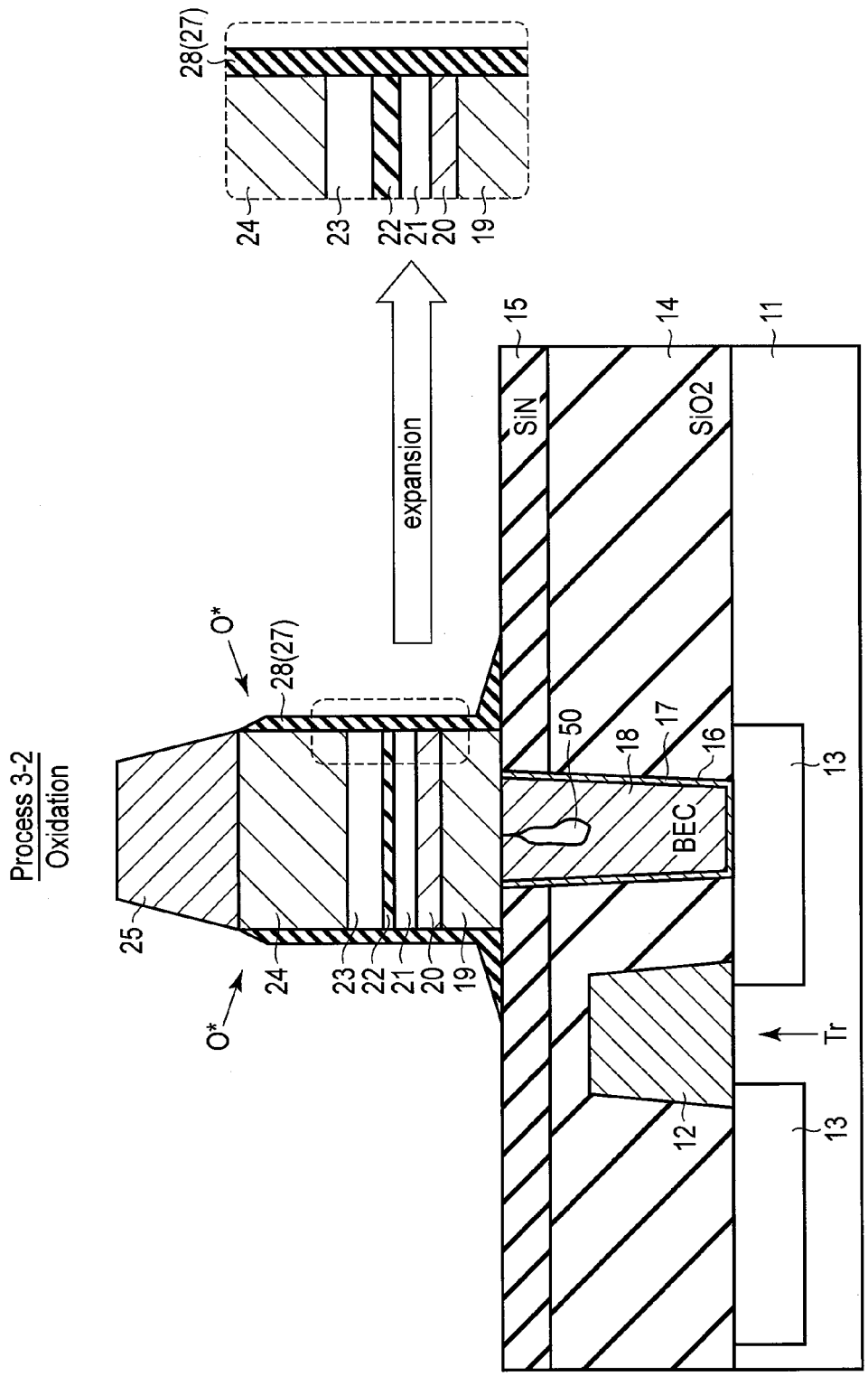
FIGS. 33 and 34 are sectional views showing a manufacturing method 3-2 of the structure 3-2 of the magnetic random access memory according to the third embodiment.

First, as shown in FIG. 33, in the manufacturing method 3-2, two ILDs 14 and 15 are deposited on a semiconductor substrate 11 and a transistor Tr. The ILD 14 is, for example, an SiO$_2$ film, and the ILD 15 is an SiN film. After that, a deposition layer 27 made of the material of a lower electrode 19 is oxidized and changed to an insulator by the same step as in the manufacturing method 3-1. An insulating protective film 28 is thus formed on the side surfaces of the lower electrode 19, a metal layer 20, a storage layer 21, a tunnel barrier layer 22, a reference layer 23, and a shift cancel layer 24. Note that the deposition layer 27 may be changed to an insulator by nitriding.

Figure 34:
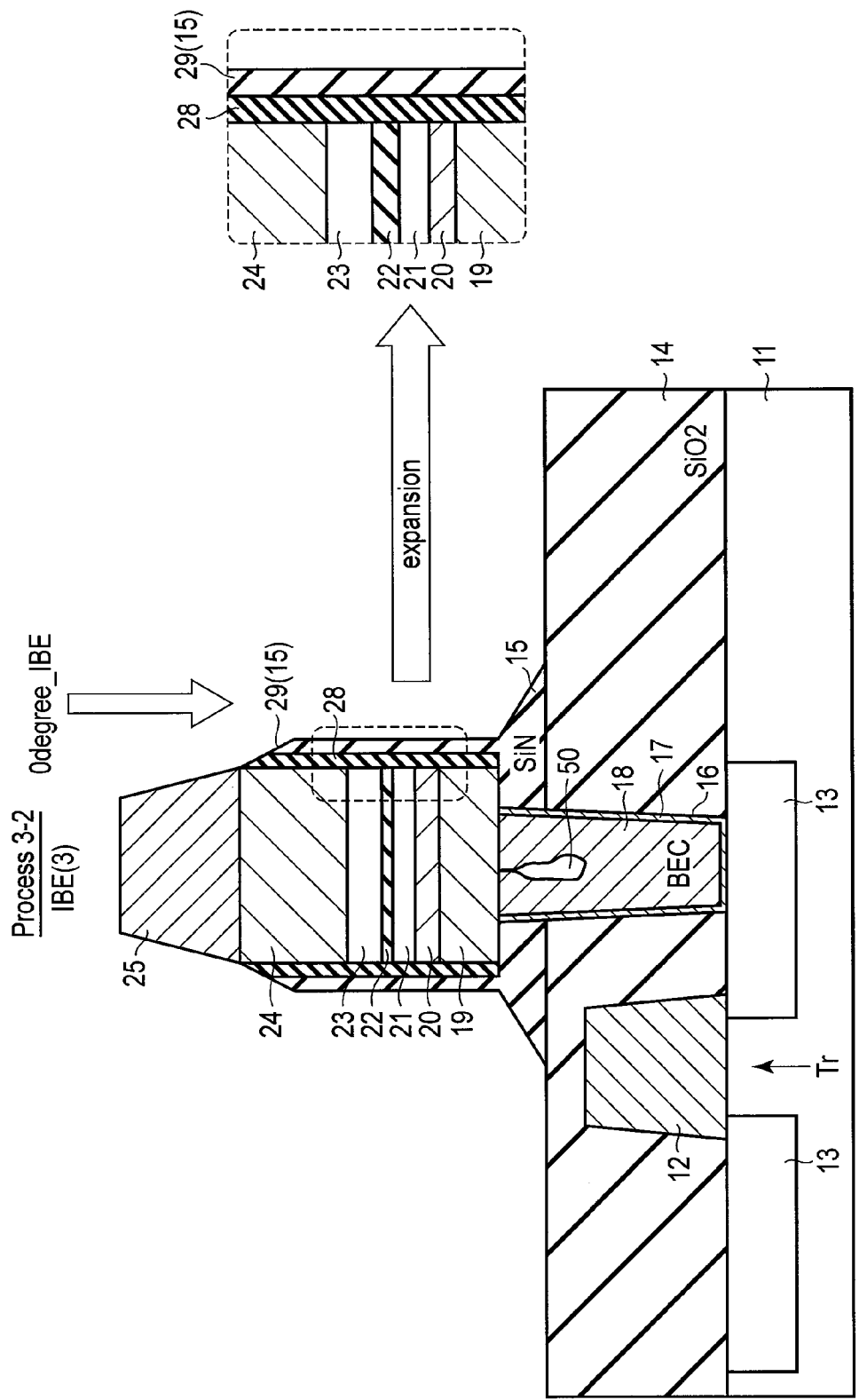

Next, as shown in FIG. 34, third IBE is performed. In the third IBE, ions enter in the direction (0°) perpendicular to the MTJ film surface. The protective film 28 and the ILD 15 are processed by the third IBE. As a result, a protective portion 29 made of the deposit of the ILD 15 is formed on the protective film 28 on the side surfaces of the lower electrode 19, the metal layer 20, the storage layer 21, the tunnel barrier layer 22, the reference layer 23, and the shift cancel layer 24.

After that, as shown in FIG. 26, a passivation film 31 made of, for example, SiN is formed, and a contact 33 connected to an upper electrode 25 is formed in an ILD 32, as in the manufacturing method 3-1.

[3-7] Manufacturing Method 3-3

A manufacturing method 3-3 of the structure 3-3 of the magnetic random access memory according to the third embodiment will be described with reference to FIGS. 27, 35, 36, 37, and 38.

Figure 35:
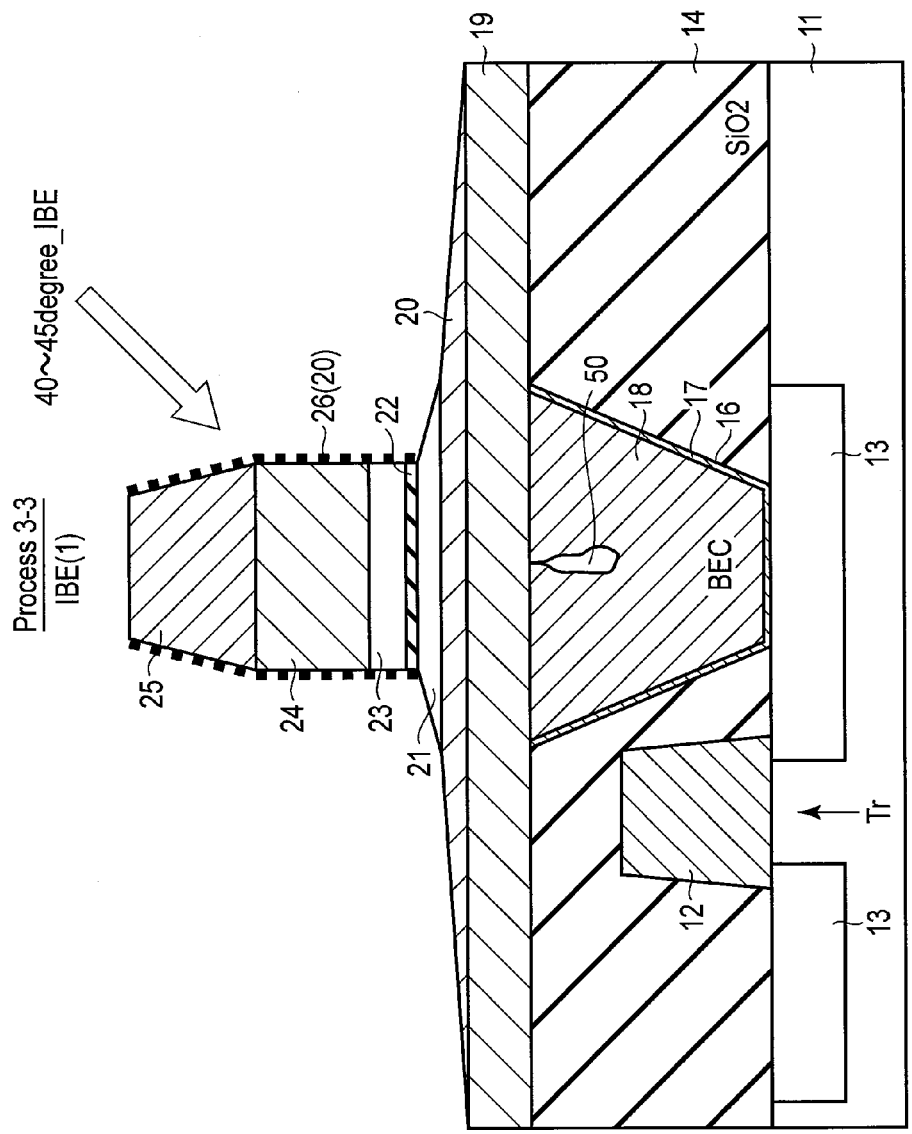
FIGS. 35, 36, 37, and 38 are sectional views showing a manufacturing method 3-3 of the structure 3-3 of the magnetic random access memory according to the third embodiment.

First, as shown in FIG. 35, in the manufacturing method 3-3, an MTJ element MTJ is processed by first IBE so as to be smaller than a contact 18. The first IBE is the same as in the above-described manufacturing method 3-1.

Figure 36:
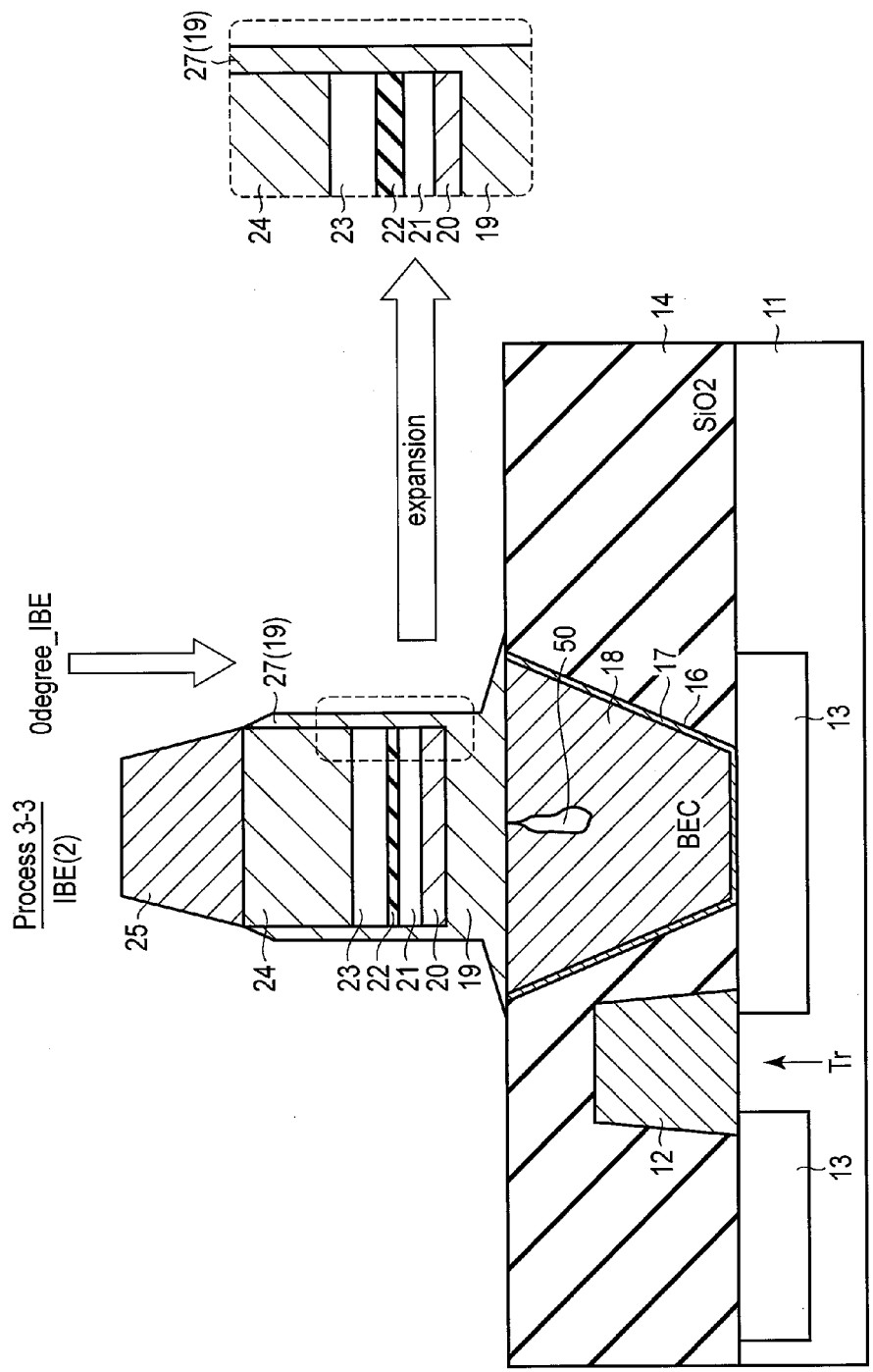

Next, as shown in FIG. 36, second IBE is performed. In the second IBE, ions enter in the direction (0°) perpendicular to the MTJ film surface. A lower electrode 19, a metal layer 20, and a storage layer 21 are processed by the second IBE. As a result, a deposition layer 27 made of the material of the lower electrode 19 is formed on the side surfaces of the lower electrode 19, the metal layer 20, the storage layer 21, a tunnel barrier layer 22, a reference layer 23, and a shift cancel layer 24.

Figure 37:
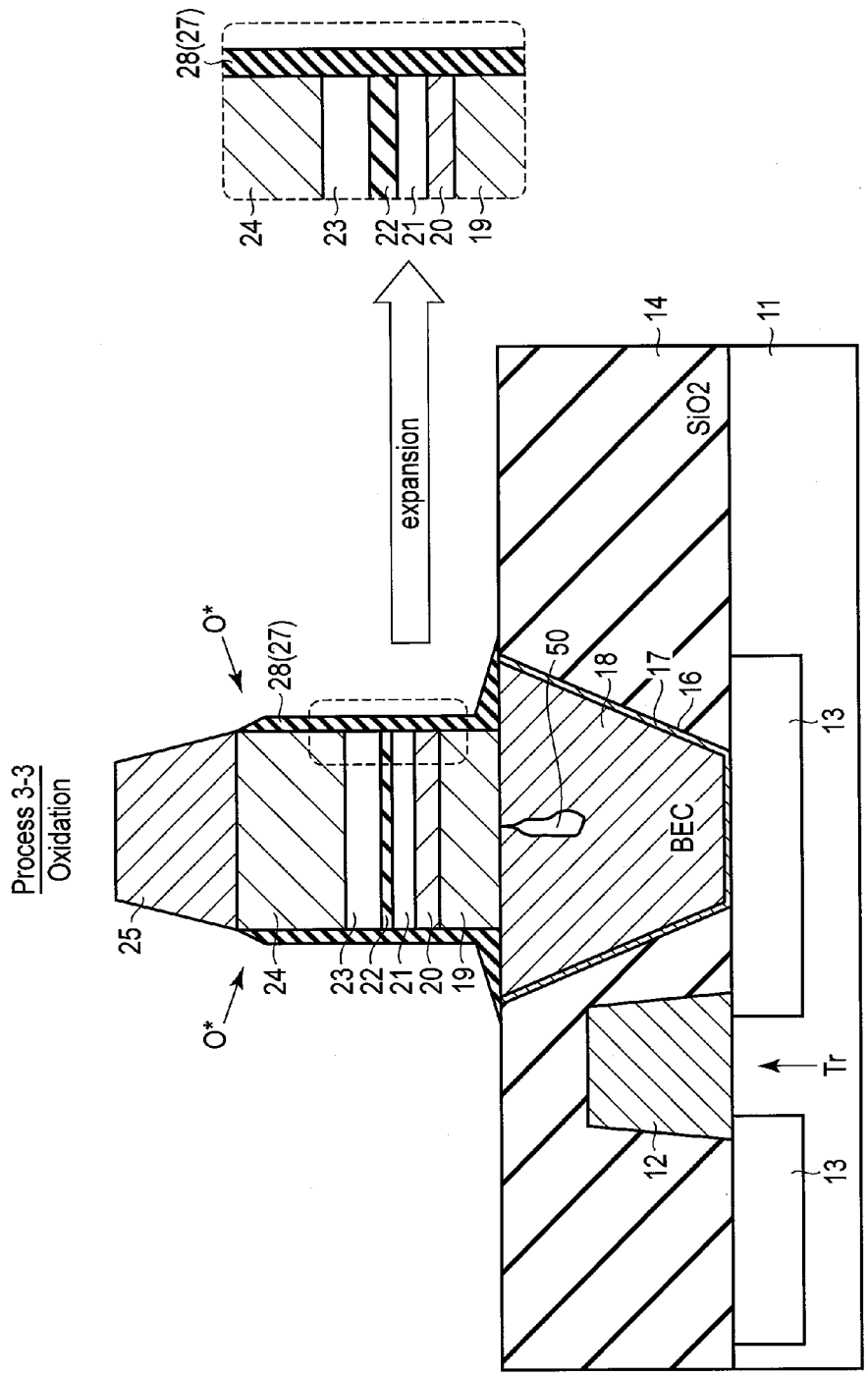

As shown in FIG. 37, the deposition layer 27 is oxidized and changed to an insulator. An insulating protective film 28 is thus formed on the side surfaces of the lower electrode 19, the metal layer 20, the storage layer 21, the tunnel barrier layer 22, the reference layer 23, and the shift cancel layer 24. Note that the deposition layer 27 may be changed to an insulator by nitriding.

Figure 38:
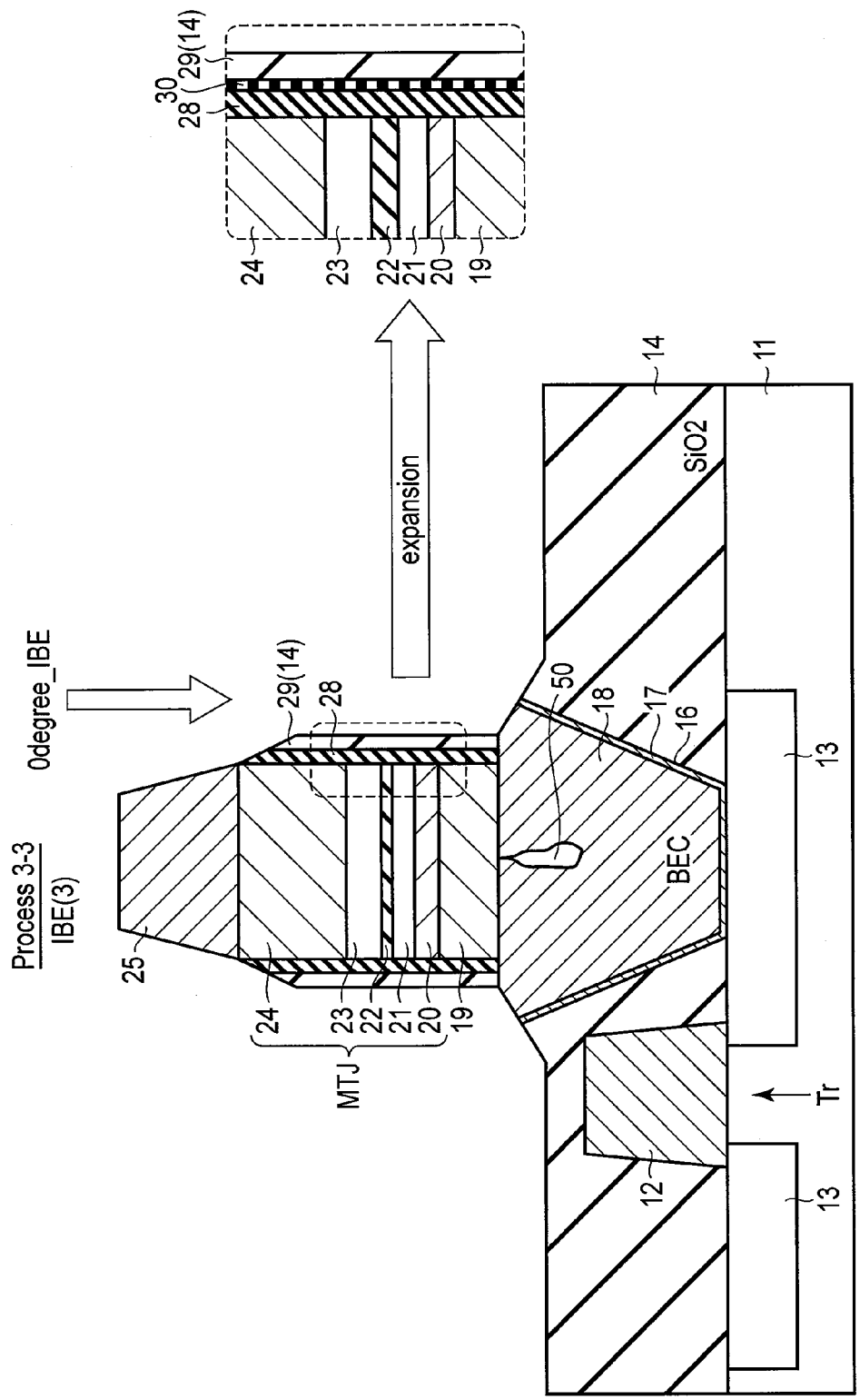

Next, as shown in FIG. 38, third IBE is performed. In the third IBE, ions enter in the direction (0°) perpendicular to the MTJ film surface. The protective film 28, the contact 18, and an ILD 14 are processed by the third IBE. As a result, a protective portion 29 made of the deposit of the ILD 14 is formed on the protective film 28 on the side surfaces of the lower electrode 19, the metal layer 20, the storage layer 21, the tunnel barrier layer 22, the reference layer 23, and the shift cancel layer 24. At this time, the contact 18 is partially exposed, and the ILD 14 around the contact 18 and the protective portion 29 of the ILD 14 are separated. In addition, a side wall layer 30 made of the material of the contact 18 or an insulator of the material of the contact 18 may slightly exist in the interface between the protective film 28 and the protective portion 29 of the ILD 14.

After that, as shown in FIG. 27, a passivation film 31 made of, for example, SiN is formed, and a contact 33 connected to an upper electrode 25 is formed in an ILD 32, as in the manufacturing method 3-1.

[3-8] Manufacturing Method 3-4

A manufacturing method 3-4 of the structure 3-4 of the magnetic random access memory according to the third embodiment will be described with reference to FIGS. 28, 39, and 40.

Figure 39:
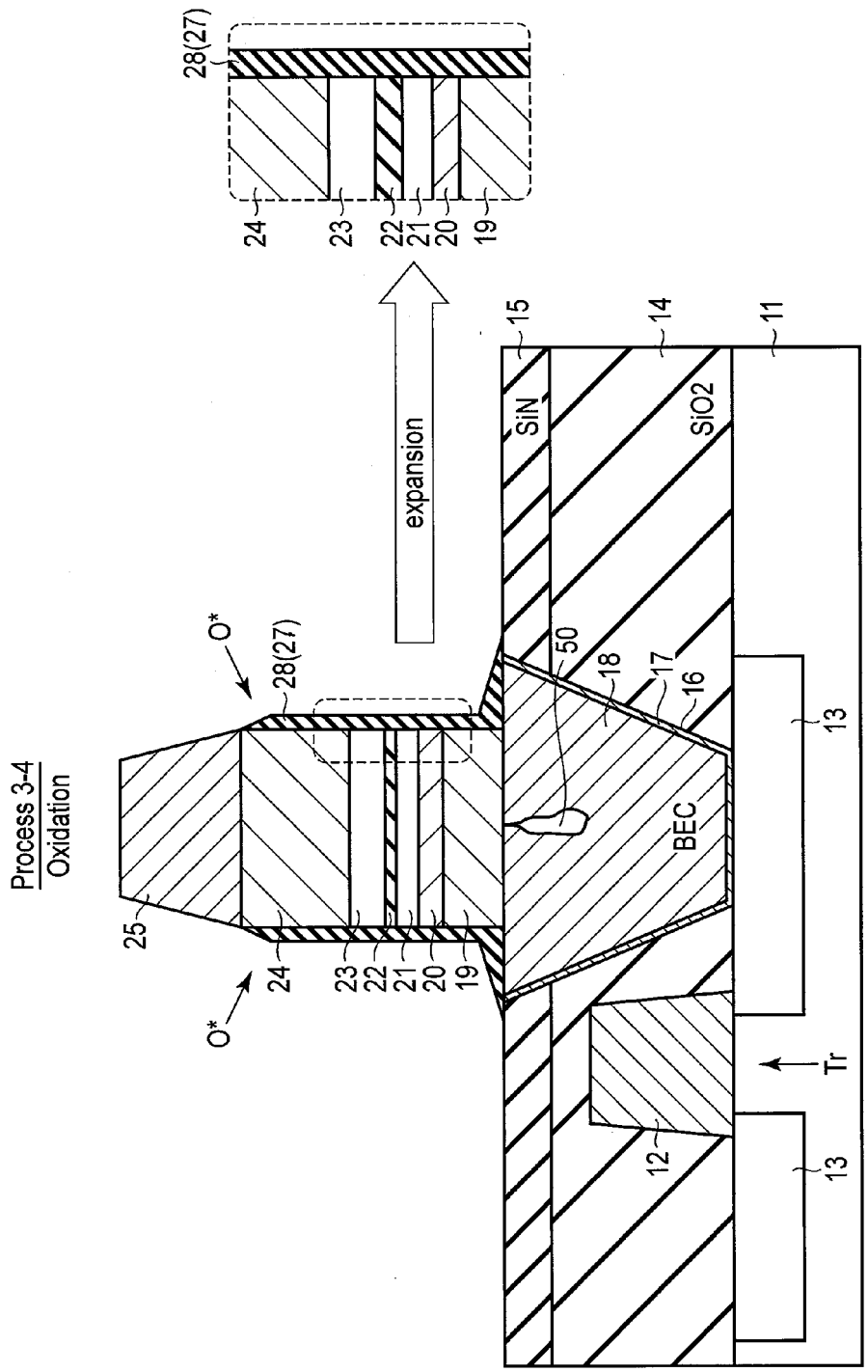

First, as shown in FIG. 39, in the manufacturing method 3-4, two ILDs 14 and 15 are deposited on a semiconductor substrate 11 and a transistor Tr. The ILD 14 is, for example, an $SiO_2$ film, and the ILD 15 is an SiN film. After that, a deposition layer 27 made of the material of a lower electrode 19 is oxidized and changed to an insulator by the same step as in the manufacturing method 3-1. An insulating protective film 28 is thus formed on the side surfaces of the lower electrode 19, a metal layer 20, a storage layer 21, a tunnel barrier layer 22, a reference layer 23, and a shift cancel layer 24. Note that the deposition layer 27 may be changed to an insulator by nitriding.

Next, as shown in FIG. 40, third IBE is performed. In the third IBE, ions enter in the direction (0°) perpendicular to the MTJ film surface. The protective film 28, a contact 18, and the ILDs 14 and 15 are processed by the third IBE. As a result, a protective portion 29 made of the deposit of the ILD 15 is formed on the protective film 28 on the side surfaces of the lower electrode 19, the metal layer 20, the storage layer 21, the tunnel barrier layer 22, the reference layer 23, and the shift cancel layer 24. At this time, the contact 18 is partially exposed, and the ILD 14 and the protective portion 29 of the ILD 15 are separated. In addition, a side wall layer 30 made of the material of the contact 18 or an insulator of the material of the contact 18 may slightly exist in the interface between the protective film 28 and the protective portion 29 of the ILD 15.

After that, as shown in FIG. 28, a passivation film 31 made of, for example, SiN is formed, and a contact 33 connected to an upper electrode 25 is formed in an ILD 32, as in the manufacturing method 3-1.

[3-9] Effects

In the third embodiment, not only the same effects as in the above-described first embodiment but also the following effects can be obtained.

In the third embodiment, when processing the lower electrode 19 under the MTJ element MTJ, the material of the lower electrode 19 is deposited on the side wall of the MTJ element MTJ. The deposition layer 27 is changed to an insulator, thereby forming the protective film 28 on the side wall of the MTJ element MTJ. For this reason, the shift cancel layer 24 is covered with the protective film 28 during the manufacturing process of the contact 33. This allows to suppress damage to the shift cancel layer 24 even when the upper electrode 25 and the contact 33 are misaligned.

In the third embodiment, the side surface of the MTJ element MTJ is covered with three layers including the protective film 28, the protective portion 29, and the passivation film 31. It is therefore possible to further enhance the barrier effect as compared to the first embodiment.

[4] Fourth Embodiment

In the fourth embodiment, an oxygen diffusion preventing film is formed between a contact and a lower electrode under an MTJ element, thereby preventing the lower electrode from being oxidized by an outgas $H_2O$ or $O_2$ obtained in the seam of the contact. Note that in the fourth embodiment, a description of the same points as in the first embodiment will be omitted or made briefly, and points different from the first embodiment will be explained in detail.

[4-1] Structure 4-1

A structure 4-1 of a magnetic random access memory according to the fourth embodiment will be described with reference to FIG. 41. In the structure 4-1, an MTJ element MTJ is larger than a contact 18, and an ILD 14 under the MTJ element MTJ is made of $SiO_2$.

Figure 41:
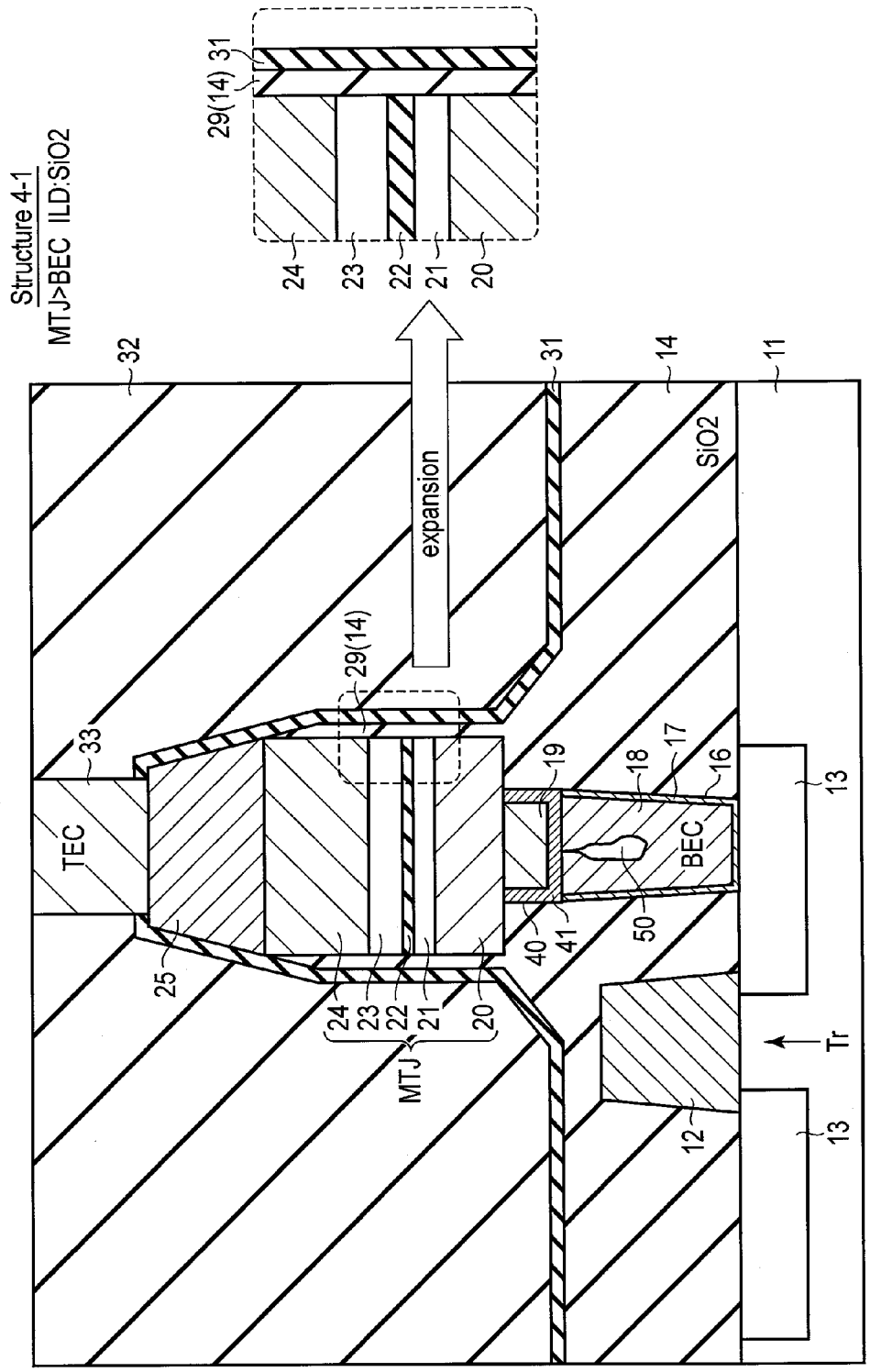
FIG. 41 is a sectional view showing a structure 4-1 of a magnetic random access memory according to the fourth embodiment.

As shown in FIG. 41, the structure 4-1 is different from the structure 1-1 in that an oxygen diffusion preventing film 41 is formed on the bottom and side surfaces of a recess portion 40.

The oxygen diffusion preventing film 41 is made of one of (a) a material that exhibits a conductivity even when oxidized, (b) a conductive oxide containing the material (a), (c) a barrier metal material, and (d) W. Note that the oxygen diffusion preventing film 41 can be either a single-layer film made of one of the materials (a) to (d) or a stacked film in which single-layer films are stacked.

(a) Examples of the material that exhibits a conductivity even when oxidized are Re, Ti, Sn, Nb, Nd, Ru, Ir, and Os.

(b) Examples of the conductive oxide containing the material (a) are $ReO_3$, $TiO_2$ ($TiO_x$), $SnO_2$, NbO, NdO, $RuO_2$, $IrO_2$ ($IrO_x$), and $OsO_2$ ($OsO_x$).

(c) Examples of the barrier metal material are Ti, compounds containing Ti (for example, TiAlN, TiN, TiW, TiSiN, $TiSi_x$, $TiB_2$, TiB, and TiC), Ta, compounds containing Ta (for example, $TaB_2$, TaB, TaC, TaN, $Ta_4N_5$, $Ta_5N_6$, and $Ta_2N$), compounds containing Zr (for example, $ZrB_2$, ZrB, ZrC, and ZrN), compounds containing Hf (for example, HfB, HfC, and HfN), compounds containing V (for example, $VB_2$, VB, VC, and VN), compounds containing Nb (for example, $NbB_2$, NbB, NbC, and NbN), compounds containing Cr (for example, $CrB_2$, CrB, $Cr_2B$, $Cr_3C_2$, $Cr_2N$, and CrN), compounds containing Mo (for example, $Mo_2B_3$, $MoB_2$, MoB, $Mo_2B$, $Mo_xC_y$, $Mo_2C$, and MoN), and compounds containing W (for example, $W_xB_y$, $W_2B_5$, $W_xC_y$, WC, $W_2C$, $W_xN_y$, and WN).

[4-2] Structure 4-2

A structure 4-2 of the magnetic random access memory according to the fourth embodiment will be described with reference to FIG. 42. In the structure 4-2, the MTJ element MTJ is larger than the contact 18, and ILDs 14 and 15 under the MTJ element MTJ are formed so as to have a stacked structure of $SiN/SiO_2$.

Figure 42:
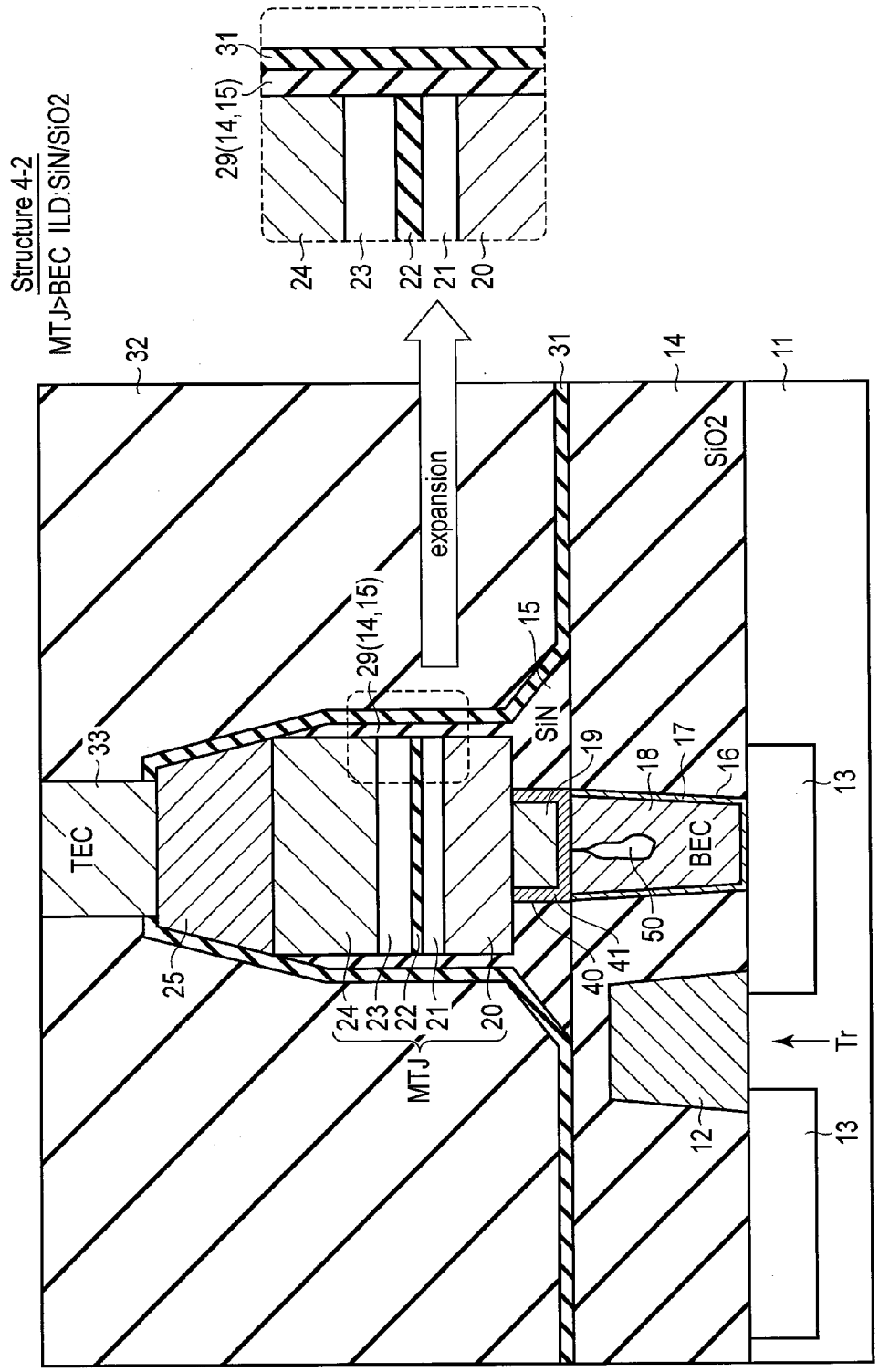
FIG. 42 is a sectional view showing a structure 4-2 of the magnetic random access memory according to the fourth embodiment.

As shown in FIG. 42, the structure 4-2 is different from the structure 4-1 in that the two ILDs 14 and 15 made of different materials are formed around the contact 18, and a protective portion 29 covering the side surface of the MTJ element MTJ is made of the same material as that of the ILD (for example, SiN film) 15.

In the structure 4-2, the ILD 14 around the contact 18 is made of $SiO_2$, and the ILD 15 around a lower electrode 19 is made of SiN. However, the ILD 15 may use SiON, AlN, or BN in place of SiN. The ILD 15 around the lower electrode 19 has its tail spreading out from the upper surface toward the bottom surface of the lower electrode 19.

[4-3] Structure 4-3

A structure 4-3 of the magnetic random access memory according to the fourth embodiment will be described with reference to FIG. 43. In the structure 4-3, the MTJ element MTJ is smaller than the contact 18, and the ILD 14 under the MTJ element MTJ is made of $SiO_2$.

Figure 43:
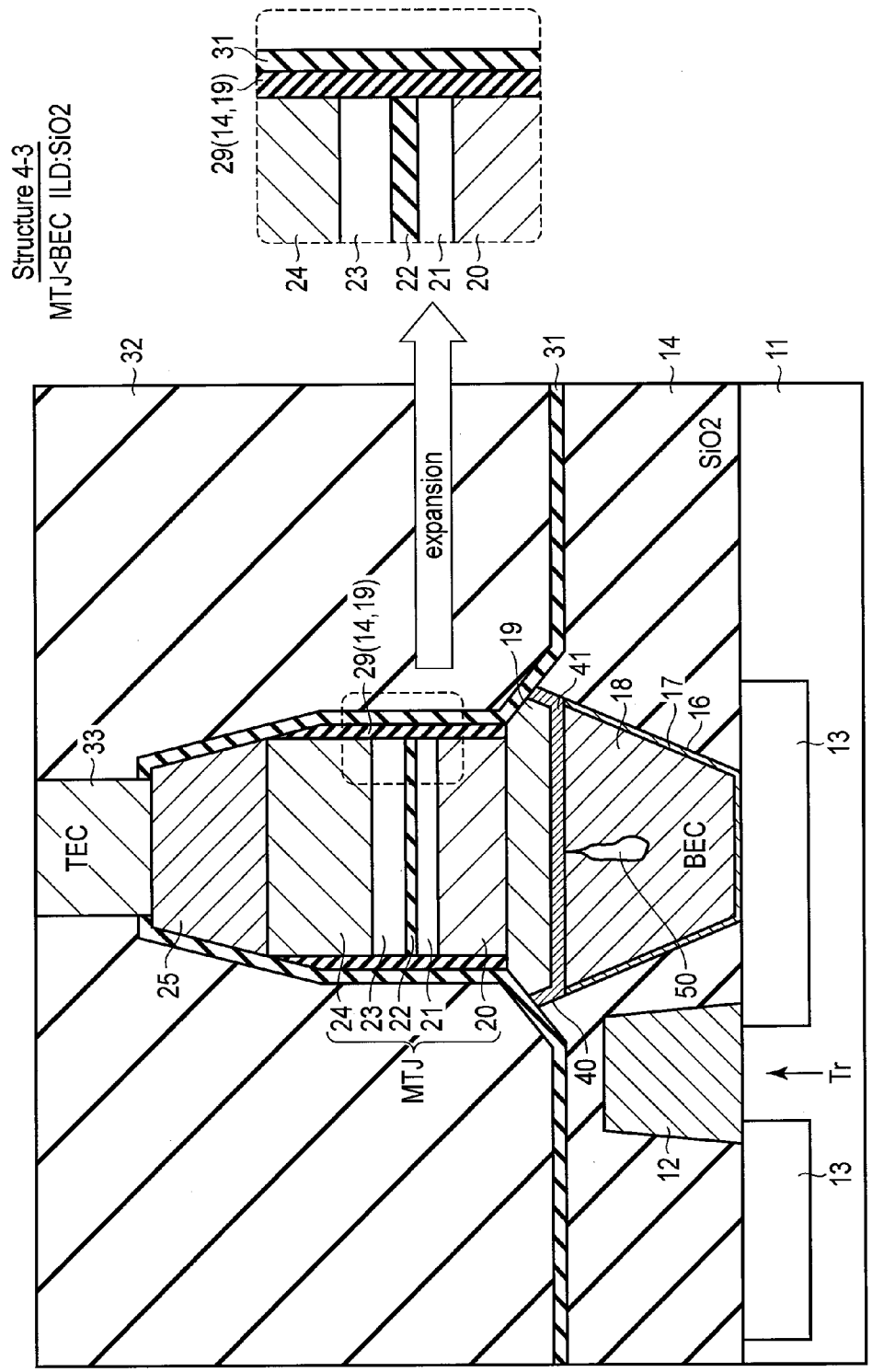
FIG. 43 is a sectional view showing a structure 4-3 of the magnetic random access memory according to the fourth embodiment.

As shown in FIG. 43, the structure 4-3 is different from the structure 4-1 in that the MTJ element MTJ is smaller than the contact 18.

More specifically, the upper side surface of the contact 18 and the side surface of the lower electrode 19 project outward from the side surface of the MTJ element MTJ. The side surfaces of the lower electrode 19 and the oxygen diffusion preventing film 41 are in contact with a passivation film 31. For this reason, the ILD 14 around the contact 18 and the protective portion 29 are separated. The protective portion 29 may contain not only the material of the ILD 14 but also the material of the lower electrode 19 or the oxygen diffusion preventing film 41.

[4-4] Structure 4-4

A structure 4-4 of the magnetic random access memory according to the fourth embodiment will be described with reference to FIG. 44. In the structure 4-4, the MTJ element MTJ is smaller than the contact 18, and the ILDs 14 and 15 under the MTJ element MTJ are formed so as to have a stacked structure of $SiN/SiO_2$.

Figure 44:
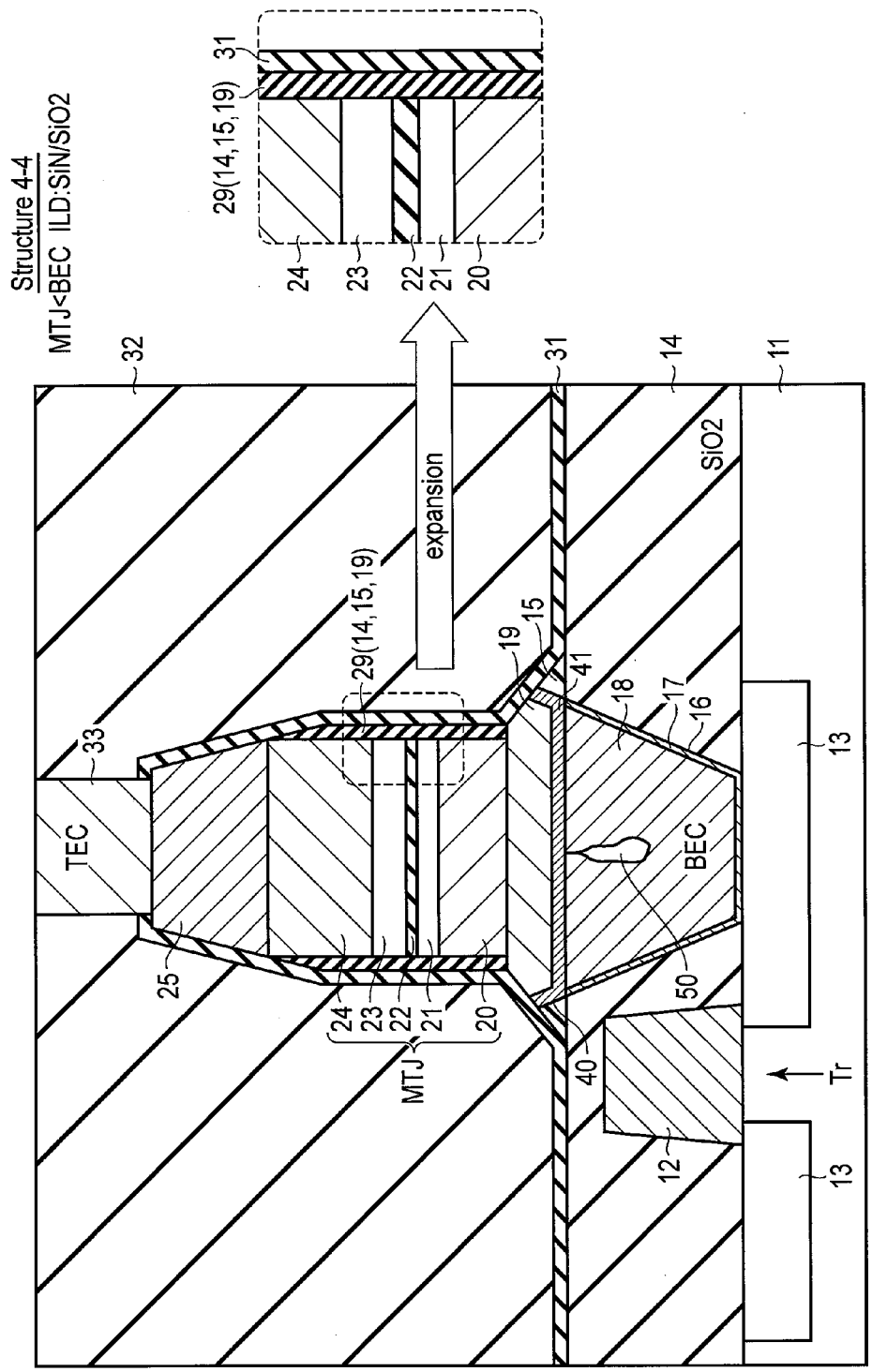
FIG. 44 is a sectional view showing a structure 4-4 of the magnetic random access memory according to the fourth embodiment.

As shown in FIG. 44, the structure 4-4 is different from the structure 4-3 in that the protective portion 29 is made of the materials (for example, Si, O, and N) of the ILDs 14 and 15. The protective portion 29 may contain not only the materials of the ILDs 14 and 15 but also the material of the lower electrode 19 or the oxygen diffusion preventing film 41 or only the materials (for example, Si and N) of the ILD 15.

Note that in FIG. 44, the ILD 15 made of an SiN film remains on the ILD 14. However, the ILD 15 may be removed by IBE in the process. The ILD 15 may use SiON, AlN, or BN in place of SiN.

Figure 45:
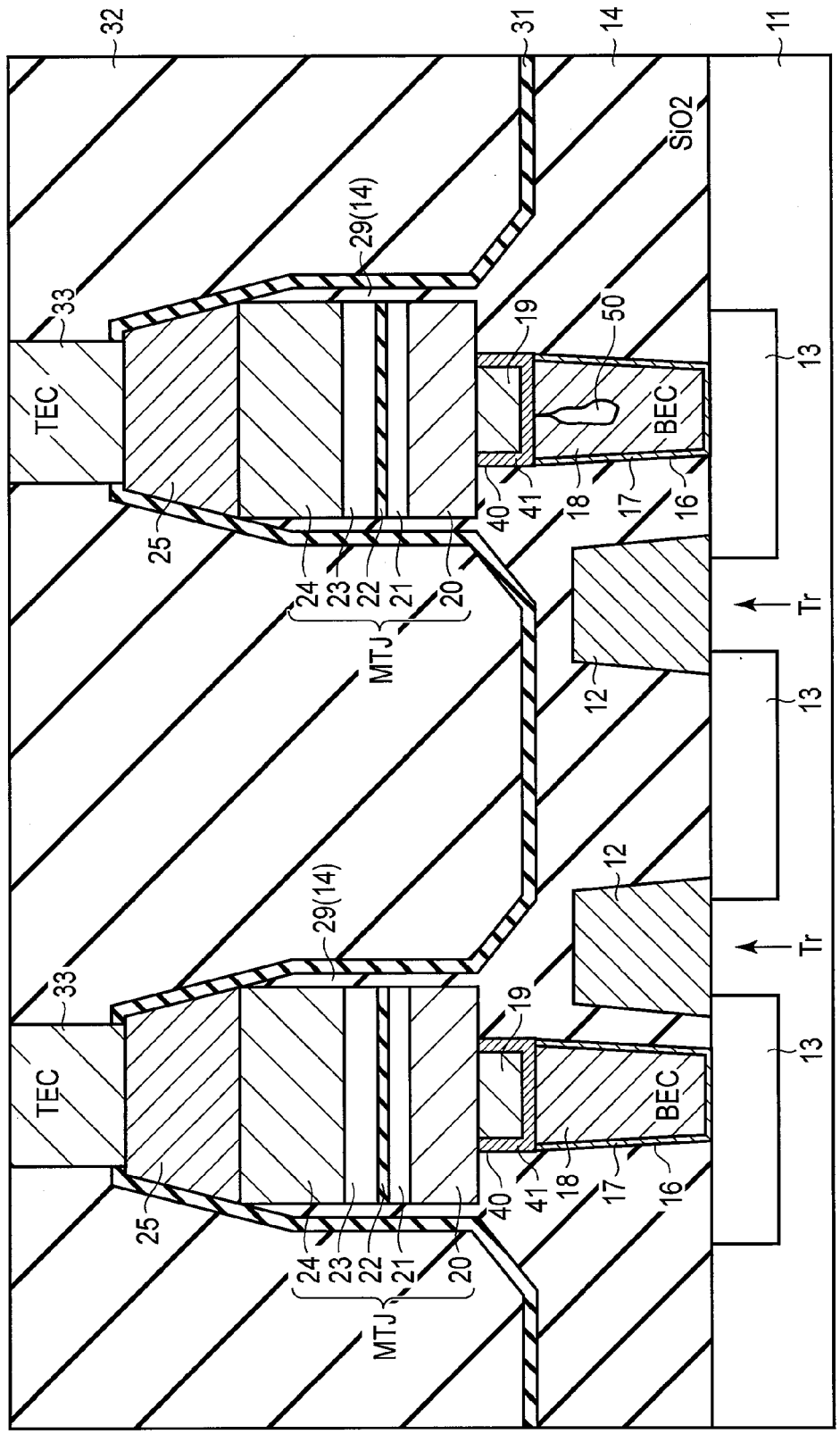
FIG. 45 is a sectional view showing still another structure of the magnetic random access memory according to the fourth embodiment.

In the structures 4-1 to 4-4 of the above-described fourth embodiment, a cell in which a seam 50 is formed in the contact 18 and a cell in which no seam 50 is formed in the contact 18 may mix, as shown in FIG. 45.

Additionally, in the structures 4-1 to 4-4 of the above-described fourth embodiment, the protective portion 29 formed on the side surface of the MTJ element MTJ may be eliminated, and the side surface of the MTJ element MTJ may be covered with a single insulating film (passivation film 31).

[4-5] Manufacturing Method 4-1

A manufacturing method 4-1 of the structure 4-1 of the magnetic random access memory according to the fourth embodiment will be described with reference to FIGS. 41, 46, 47, 48, 49, and 50.

Figures 46, 47:
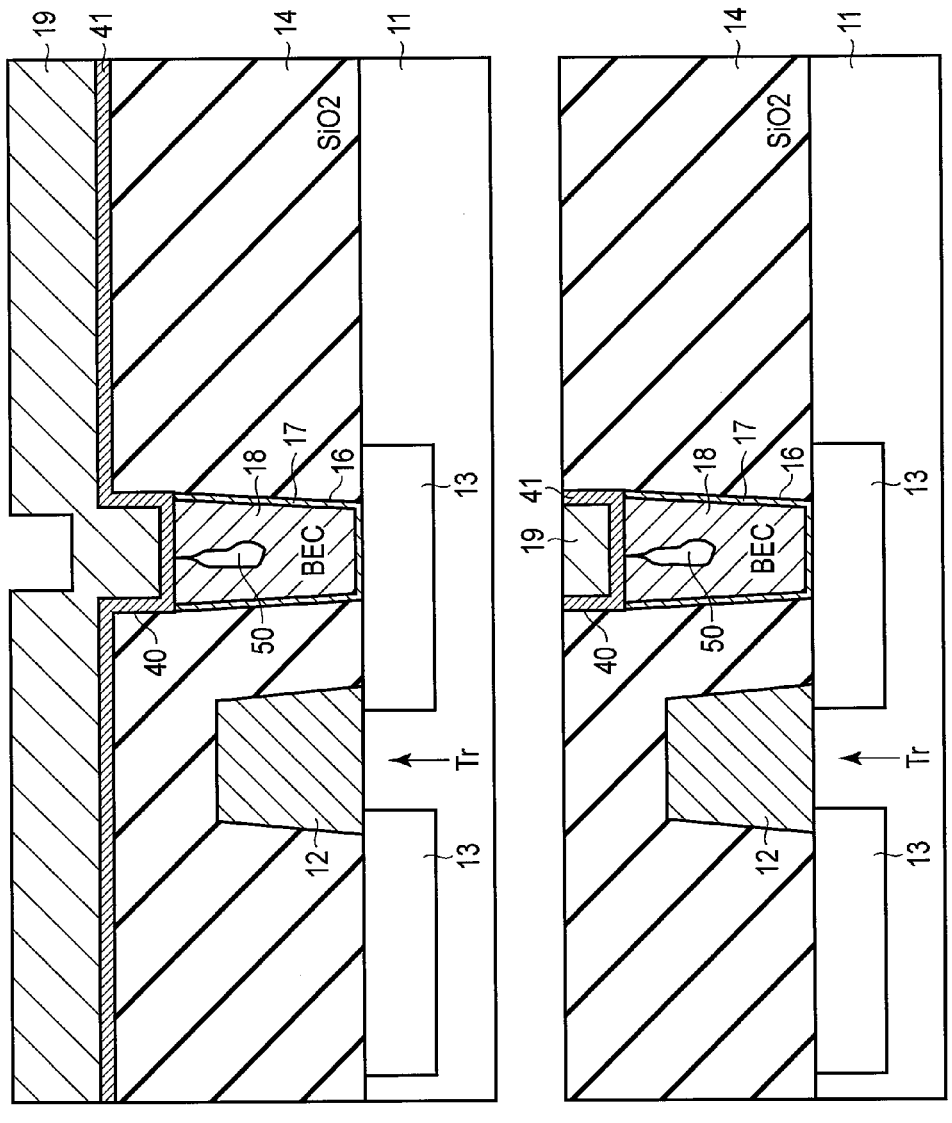

First, as shown in FIG. 46, the metal layer and a barrier metal film 17 at the upper portion of a contact hole 16 are removed by the same step as in the manufacturing method 1-1, thereby forming a recess portion 40. Next, an oxygen diffusion preventing film 41 made of, for example, a barrier metal material is formed in the recess portion 40 and on an ILD 14. A lower electrode 19 made of, for example, Ta is formed on the oxygen diffusion preventing film 41.

As shown in FIG. 47, the lower electrode 19 and the oxygen diffusion preventing film 41 on the ILD 14 are removed by CMP or the like to expose the surface of the ILD 14.

As shown in FIG. 48, a metal layer 20, a storage layer 21, a tunnel barrier layer 22, a reference layer 23, a shift cancel layer 24, and an upper electrode (hard mask) 25 are sequentially stacked on the lower electrode 19, the oxygen diffusion preventing film 41, and the ILD 14. After that, the upper electrode 25 is patterned. At this time, the upper electrode 25 is processed so as to be larger than a contact 18.

Figure 49:
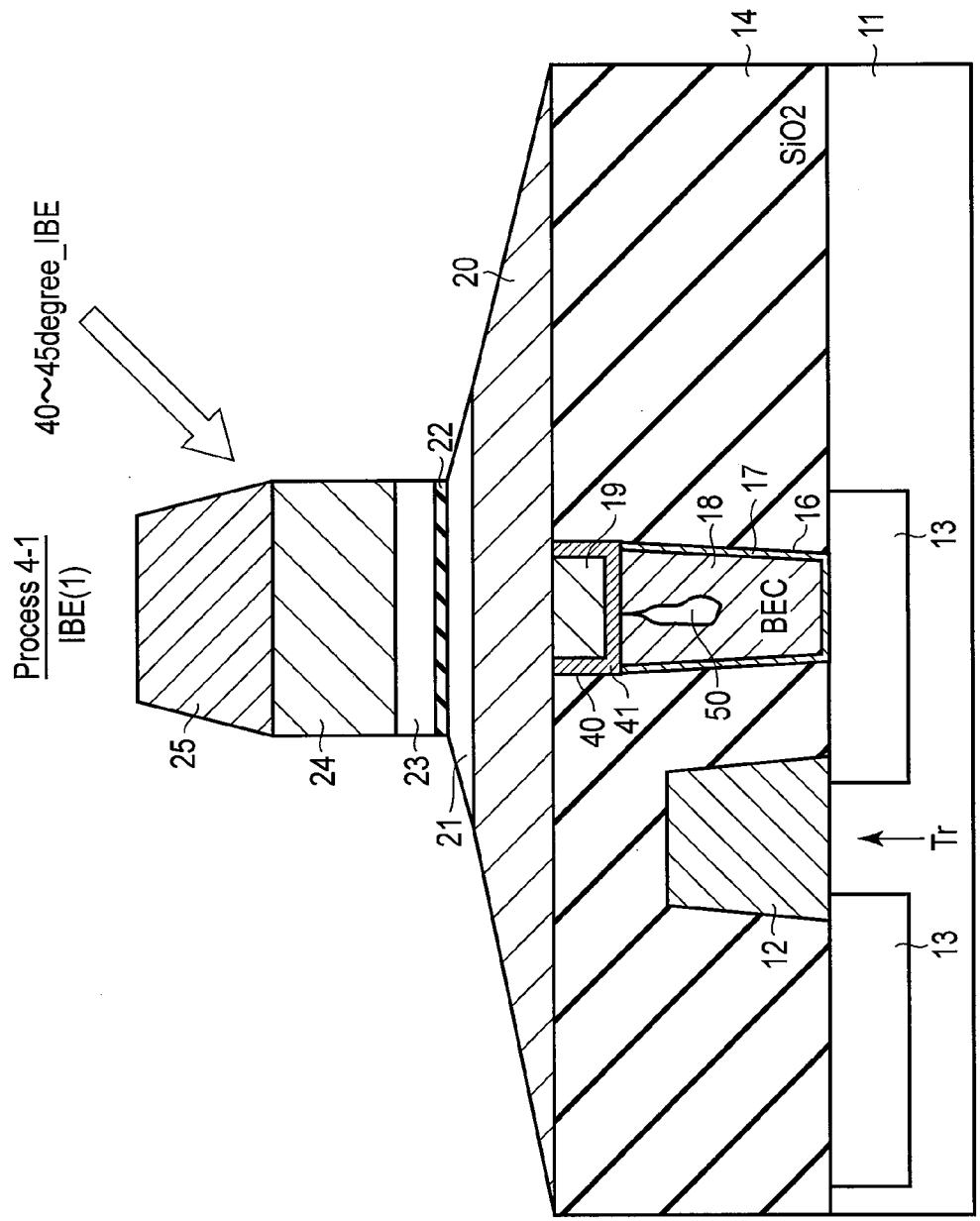

As shown in FIG. 49, first IBE is performed using the patterned upper electrode 25 as a hard mask. In the first IBE, ions enter obliquely. The oblique angle is about 40° to 45° with respect to a direction perpendicular to the MTJ film surface. The metal layer 20, the storage layer 21, the tunnel barrier layer 22, the reference layer 23, and the shift cancel layer 24 are processed by the first IBE. In the first IBE, the etching is preferably stopped before the surface of the ILD 14 is exposed.

Figure 50:
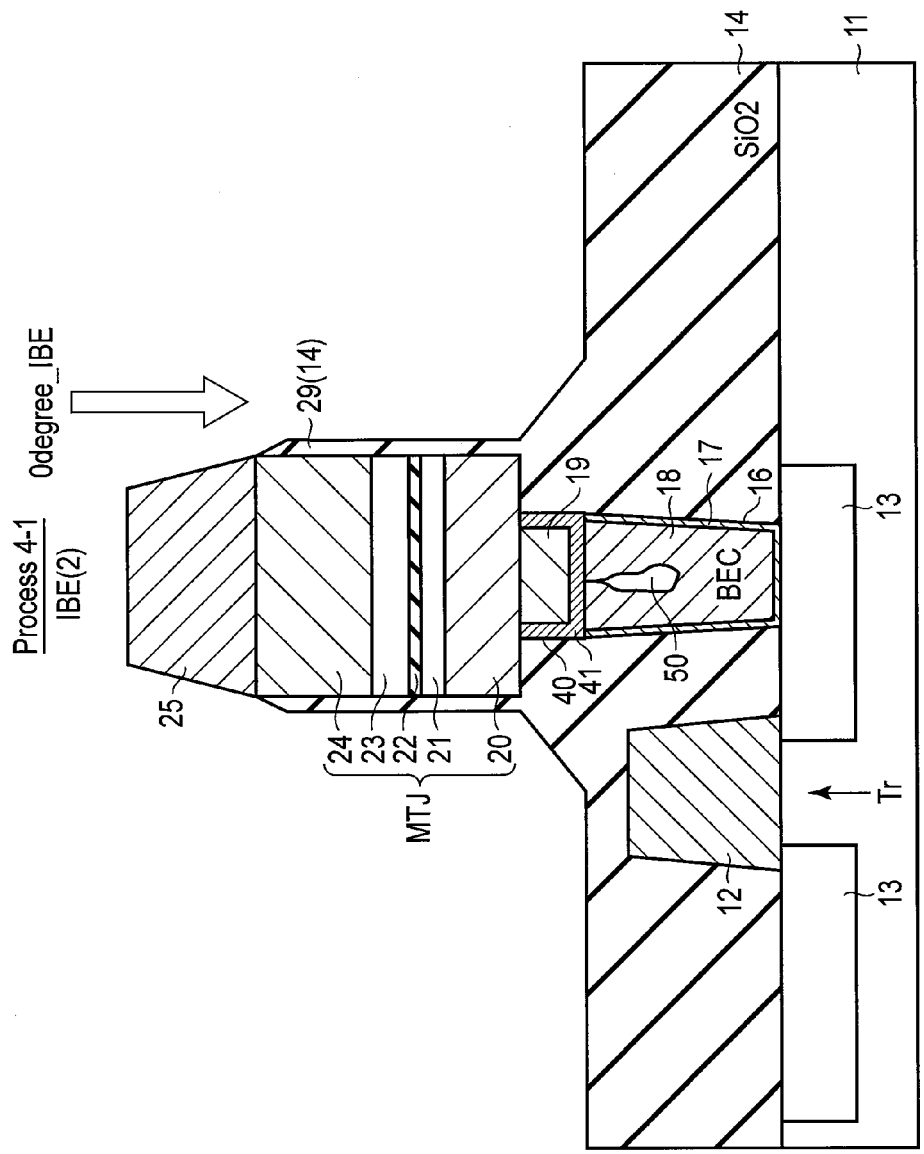

As shown in FIG. 50, second IBE is performed. In the second IBE, ions enter in the direction (0°) perpendicular to the MTJ film surface. The ILD 14, the metal layer 20, and the storage layer 21 are processed by the second IBE. As a result, a protective portion 29 made of the deposit of the ILD 14 is formed on the side surfaces of the metal layer 20, the storage layer 21, the tunnel barrier layer 22, the reference layer 23, and the shift cancel layer 24. Note that the oblique angle of ion incidence of the second IBE may be about 0° to 20° with respect to the direction perpendicular to the MTJ film surface.

After that, as shown in FIG. 41, a passivation film 31 made of, for example, SiN is formed, and a contact 33 connected to the upper electrode 25 is formed in an ILD 32, as in the manufacturing method 1-1.

[4-6] Manufacturing Method 4-2

A manufacturing method 4-2 of the structure 4-2 of the magnetic random access memory according to the fourth embodiment will be described with reference to FIGS. 42, 51, and 52.

First, as shown in FIG. 51, in the manufacturing method 4-2, two ILDs 14 and 15 are deposited on a semiconductor substrate 11 and a transistor Tr. The ILD 14 is, for example, an $SiO_2$ film, and the ILD 15 is an SiN film. After that, as in the manufacturing method 1-1, a contact 18 is formed in a contact hole 16 while making a barrier metal film 17 intervene between them, and an oxygen diffusion preventing film 41 and a lower electrode 19 are formed in a recess portion 40. The stacked film of an MTJ element MTJ is formed on the lower electrode 19, the oxygen diffusion preventing film 41, and the ILD 15.

Next, first IBE is performed using a patterned upper electrode 25 as a hard mask. In the first IBE, ions enter obliquely. The oblique angle is about 40° to 45° with respect to a direction perpendicular to the MTJ film surface. A metal layer 20, a storage layer 21, a tunnel barrier layer 22, a reference layer 23, and a shift cancel layer 24 are processed by the first IBE. In the first IBE, the etching is preferably stopped before the surface of the ILD 15 is exposed.

Figure 52:
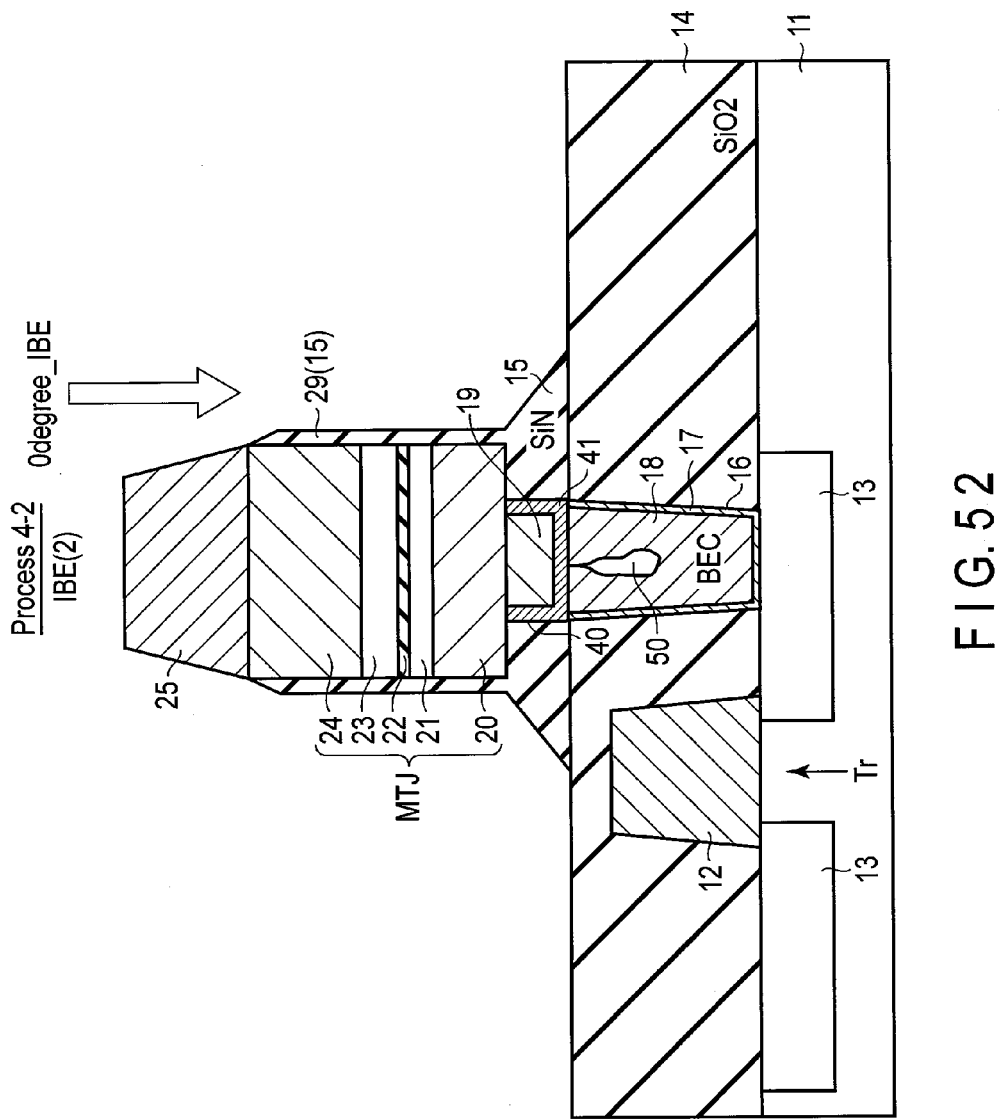

As shown in FIG. 52, second IBE is performed. In the second IBE, ions enter in the direction (0°) perpendicular to the MTJ film surface. The ILD 15 and the metal layer 20 are processed by the second IBE. As a result, a protective portion 29 made of the deposit of the ILD 15 is formed on the side surfaces of the metal layer 20, the storage layer 21, the tunnel barrier layer 22, the reference layer 23, and the shift cancel layer 24.

After that, as shown in FIG. 42, a passivation film 31 made of, for example, SiN is formed, and a contact 33 connected to the upper electrode 25 is formed in an ILD 32, as in the manufacturing method 1-1.

[4-7] Manufacturing Method 4-3

A manufacturing method 4-3 of the structure 4-3 of the magnetic random access memory according to the fourth embodiment will be described with reference to FIGS. 43, 53, and 54.

Figure 53:
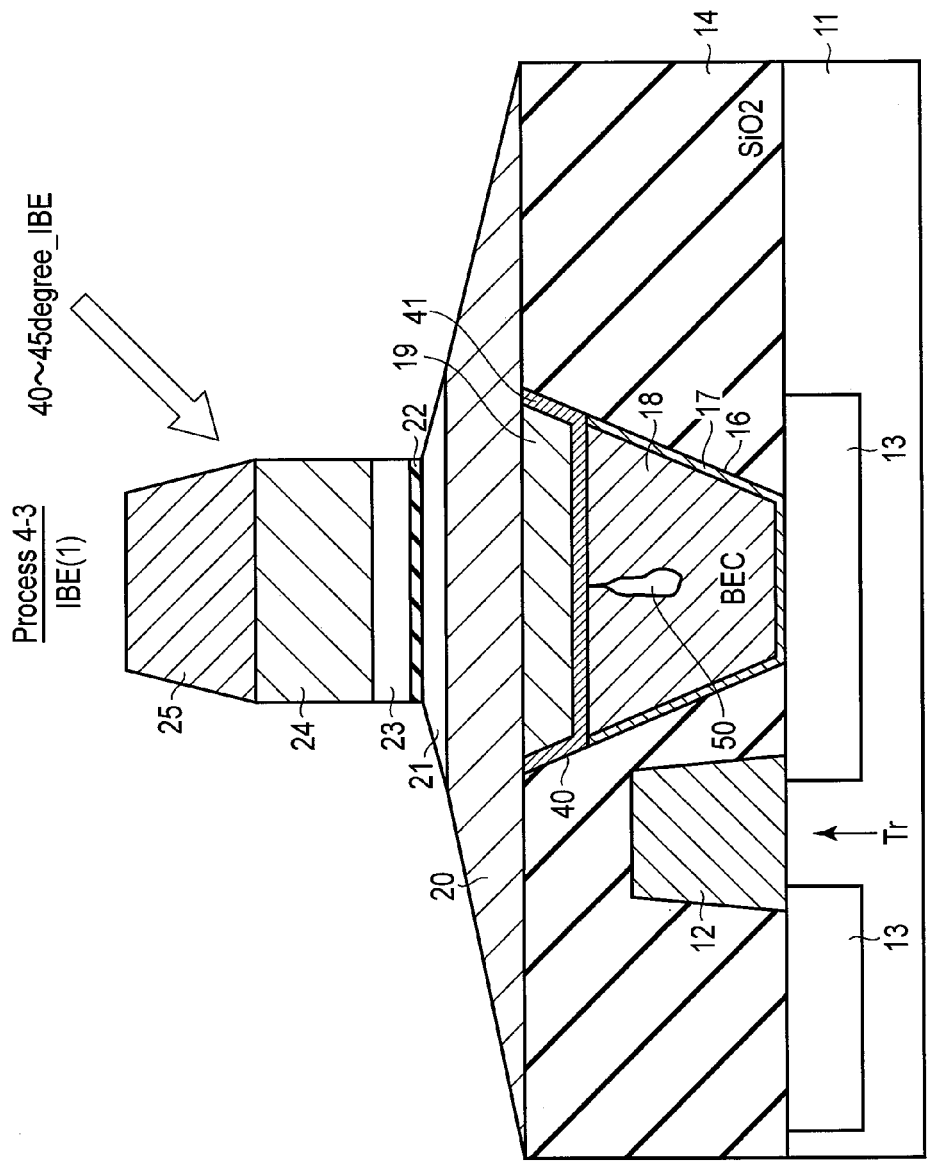

First, as shown in FIG. 53, in the manufacturing method 4-3, an MTJ element MTJ is processed by first IBE so as to be smaller than a contact 18. The first IBE is the same as in the above-described manufacturing method 1-1.

Next, as shown in FIG. 54, second IBE is performed. In the second IBE, ions enter in the direction (0°) perpendicular to the MTJ film surface. An ILD 14, an oxygen diffusion preventing film 41, a lower electrode 19, and a metal layer 20 are processed by the second IBE. As a result, a protective portion 29 made of the deposit of the ILD 14 and the lower electrode 19 is formed on the side surfaces of the metal layer 20, a storage layer 21, a tunnel barrier layer 22, a reference layer 23, and a shift cancel layer 24. At this time, the lower electrode 19 and the oxygen diffusion preventing film 41 are exposed, and the protective portion 29 is separated from the ILD 14 around the contact 18. Note that the protective portion 29 may contain the material of the oxygen diffusion preventing film 41.

After that, as shown in FIG. 43, a passivation film 31 made of, for example, SiN is formed, and a contact 33 connected to an upper electrode 25 is formed in an ILD 32, as in the manufacturing method 1-1.

[4-8] Manufacturing Method 4-4

A manufacturing method 4-4 of the structure 4-4 of the magnetic random access memory according to the fourth embodiment will be described with reference to FIGS. 44, 55, and 56.

Figure 55:
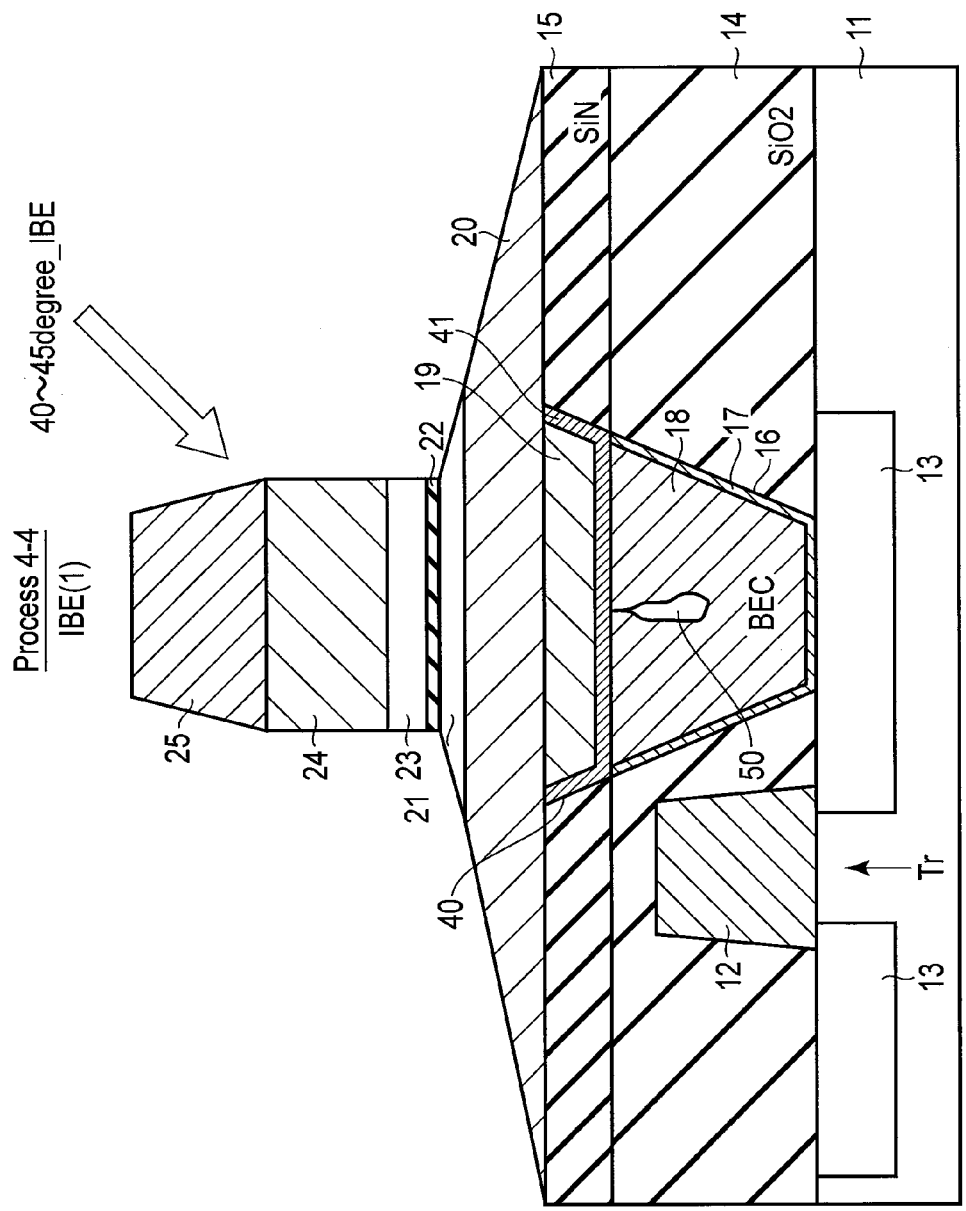
FIGS. 55 and 56 are sectional views showing a manufacturing method 4-4 of the structure 4-4 of the magnetic random access memory according to the fourth embodiment.

First, as shown in FIG. 55, in the manufacturing method 4-4, two ILDs 14 and 15 are deposited on a semiconductor substrate 11 and a transistor Tr. The ILD 14 is, for example, an $SiO_2$ film, and the ILD 15 is an SiN film. After that, as in the manufacturing method 1-1, a contact 18 is formed in a contact hole 16 while making a barrier metal film 17 intervene between them, and an oxygen diffusion preventing film 41 and a lower electrode 19 are formed in a recess portion 40. The stacked film of an MTJ element MTJ is formed on the lower electrode 19, the oxygen diffusion preventing film 41, and the ILD 15. First IBE is performed using a patterned upper electrode 25 as a hard mask. The first IBE is the same as in the above-described manufacturing method 1-1.

Figure 56:
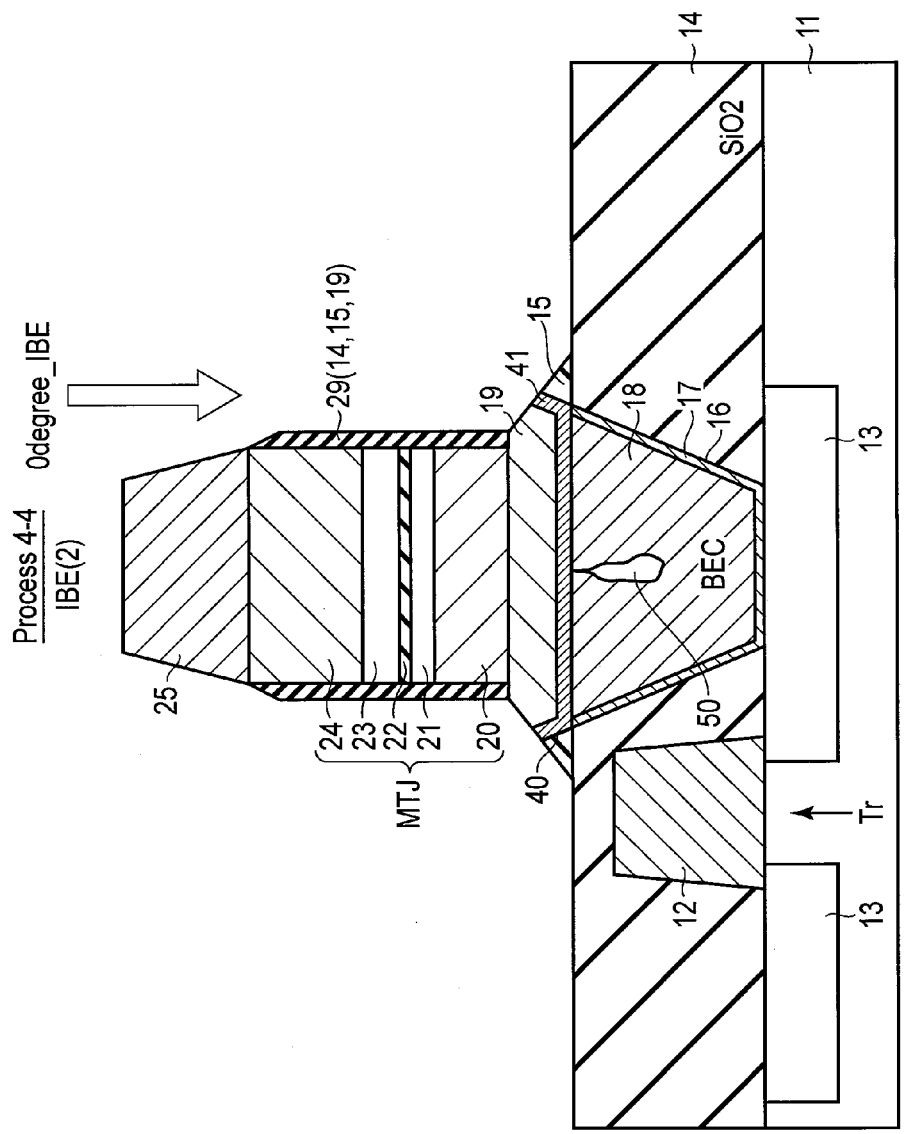

As shown in FIG. 56, second IBE is performed. In the second IBE, ions enter in the direction (0°) perpendicular to the MTJ film surface. The ILDs 14 and 15, the oxygen diffusion preventing film 41, the lower electrode 19, and a metal layer 20 are processed by the second IBE. As a result, a protective portion 29 made of the deposit of the ILDs 14 and 15 and the lower electrode 19 is formed on the side surfaces of the metal layer 20, a storage layer 21, a tunnel barrier layer 22, a reference layer 23, and a shift cancel layer 24. At this time, the protective portion 29 is separated from the ILD 14, and the lower electrode 19 and the oxygen diffusion preventing film 41 are exposed. Note that the protective portion 29 may contain the material of the oxygen diffusion preventing film 41.

After that, as shown in FIG. 44, a passivation film 31 made of, for example, SiN is formed, and a contact 33 connected to the upper electrode 25 is formed in an ILD 32, as in the manufacturing method 1-1.

[4-9] Effects

In the structure in which the lower electrode 19 of the MTJ element MTJ is formed in the recess portion 40, the interface between the lower electrode 19 in the recess portion 40 and the contact 18 may be oxidized by an outgas such as $H_2O$ or $O_2$ contained in the seam 50 of the contact 18.

To prevent this, in the fourth embodiment, the oxygen diffusion preventing film 41 is formed on the bottom and side surfaces of the recess portion 40. The oxygen diffusion preventing film 41 exists between the contact 18 and the lower electrode 19. The oxygen diffusion preventing film 41 can prevent an outgas such as $H_2O$ or $O_2$ contained in the seam 50 of the contact 18 from entering the lower electrode 19. Since oxidation of the lower electrode 19 can be prevented, the resistance value of the MTJ element MTJ can be prevented from varying due to oxidation of the lower electrode 19.

Each of above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic random access memory comprising:
    a magnetoresistive element;
    a contact portion arranged under the magnetoresistive element and connected to the magnetoresistive element;
    a first insulating film formed at a periphery of the contact portion;
    a second insulating film including a protective portion covering a side surface of the magnetoresistive element and including a material that is included in the first insulating film;
    a third insulating film which contacts the first and second insulating films; and
    a fourth insulating film which surrounds the side surface of the magnetoresistive element via the protective portion and the third insulating film.

2. The memory according to claim 1, wherein the contact portion includes a contact and a lower electrode formed between the contact and the magnetoresistive element, and
    wherein the lower electrode includes one of Ta, Zr, Hf, Al, and B.

3. The memory according to claim 1, wherein the first insulating film includes one of an oxide and a nitride.

4. The memory according to claim 1, wherein the first insulating film includes one of SiO2, SiN, SiON, AlN, and BN.

5. The memory according to claim 1, wherein the third insulating film includes silicon nitride.

6. The memory according to claim 1, the first and fourth insulating films include a same material.

7. The memory according to claim 6, wherein the same material is silicon oxide.

* * * * *